United States Patent
Yamazaki et al.

(10) Patent No.: US 8,395,938 B2
(45) Date of Patent: Mar. 12, 2013

(54) NON-VOLATILE SEMICONDUCTOR MEMORY DEVICE EQUIPPED WITH AN OXIDE SEMICONDUCTOR WRITING TRANSISTOR HAVING A SMALL OFF-STATE CURRENT

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 179 days.

(21) Appl. No.: 12/987,279

(22) Filed: Jan. 10, 2011

(65) Prior Publication Data

US 2011/0176348 A1 Jul. 21, 2011

(30) Foreign Application Priority Data

Jan. 15, 2010 (JP) .................. 2010-007482

(51) Int. Cl.
 *G11C 11/40* (2006.01)
(52) U.S. Cl. ......... 365/185.08; 365/185.21; 365/185.23; 365/185.05
(58) Field of Classification Search ............ 365/185.08, 365/185.21, 185.23, 185.18, 185.05
 See application file for complete search history.

(56) References Cited

U.S. PATENT DOCUMENTS

| | | | |
|---|---|---|---|
| 4,466,081 A | 8/1984 | Masuoka | |
| 4,935,896 A | 6/1990 | Matsumura et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Andrew Q Tran
(74) *Attorney, Agent, or Firm* — Fish & Richardson P.C.

(57) ABSTRACT

An object is to provide a semiconductor device in which stored data can be retained even when power is not supplied, and there is no limitation on the number of write cycles. The semiconductor device includes a source line, a bit line, a first signal line, a second signal line, a word line, a memory cell connected between the source line and the bit line, a first driver circuit electrically connected to the bit line, a second driver circuit electrically connected to the first signal line, a third driver circuit electrically connected to the second signal line, and a fourth driver circuit electrically connected to the word line and the source line. The first transistor is formed using a semiconductor material other than an oxide semiconductor. The second transistor is formed using an oxide semiconductor material.

24 Claims, 28 Drawing Sheets

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276689 A1 | 11/2010 | Iwasaki |
| 2010/0279462 A1 | 11/2010 | Iwasaki |
| 2011/0101351 A1 | 5/2011 | Yamazaki |
| 2011/0156028 A1 | 6/2011 | Yamazaki et al. |
| 2011/0157961 A1 | 6/2011 | Yamazaki et al. |
| 2011/0175087 A1 | 7/2011 | Yamazaki et al. |
| 2011/0176348 A1* | 7/2011 | Yamazaki et al. ............ 365/72 |

FOREIGN PATENT DOCUMENTS

| | | |
|---|---|---|
| JP | 57-105889 A | 7/1982 |
| JP | 60-198861 A | 10/1985 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-093924 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2001 |
| WO | 2007/029844 A1 | 3/2007 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT1JP2010/073642); dated Apr. 5, 2011, in English.

Written Opinion (Application No. PCT/JP2010/073642); dated Apr. 5, 2011, in English.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZNO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layer," SID Digest '09 : SID International Symposium Digest of Technical Papers, May 31, 2009, pp. 284-287.

* cited by examiner

FIG. 1A1
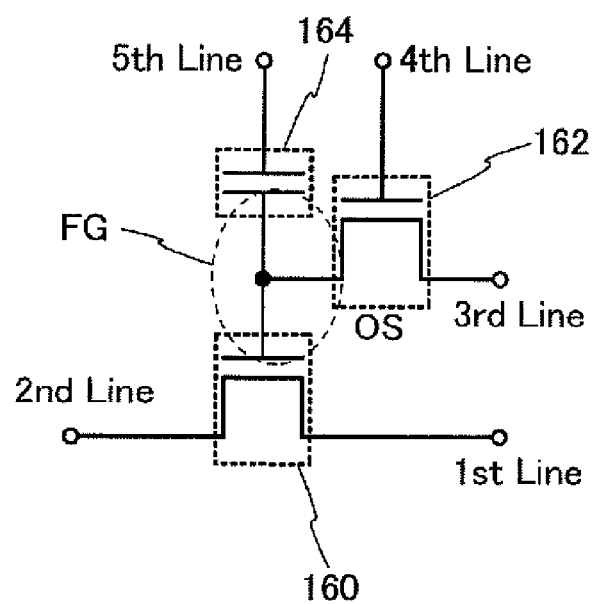
FIG. 1A2
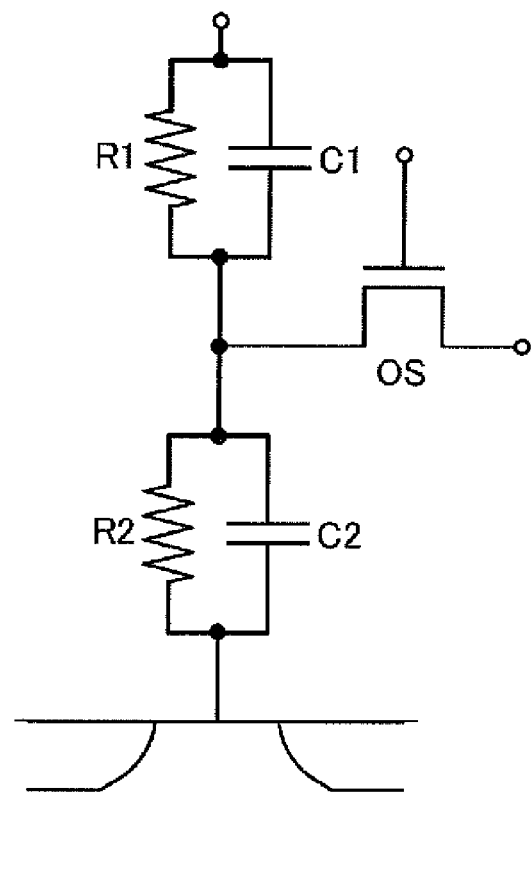

— first writing of high-state data (Vds=1V)
— first writing of low-state data (Vds=1V)
--- after high-state data writing of $1 \times 10^9$ times (Vds=1V)
----- after low-state data writing of $1 \times 10^9$ times (Vds=1V)

NON-VOLATILE SEMICONDUCTOR MEMORY DEVICE EQUIPPED WITH AN OXIDE SEMICONDUCTOR WRITING TRANSISTOR HAVING A SMALL OFF-STATE CURRENT

TECHNICAL FIELD

The invention disclosed herein relates to a semiconductor device including a semiconductor element and a method for manufacturing the semiconductor device.

BACKGROUND ART

Storage devices including semiconductor elements are broadly classified into two categories: a volatile storage device that loses stored data when power supply stops, and a non-volatile storage device that retains stored data even when power is not supplied.

A typical example of a volatile storage device is a DRAM (dynamic random access memory). A DRAM stores data in such a manner that a transistor included in a storage element is selected and electric charge is stored in a capacitor.

Owing to the above-described principle, electric charge in a capacitor is lost when data in a DRAM is read out; thus, it is necessary to perform writing operation every time data is read. Moreover, even when a transistor included in a storage element is not selected, electric charge flows into or out of the transistor because of a leakage current between a source and a drain of the transistor in an off state (an off-state current) or the like; therefore, the data retention time of a DRAM is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data retention time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding electric charge in the floating gate or removing the electric charge, and a circuit for holding or removing electric charge is required. Further, it takes a relatively long time to hold or remove electric charge, and it is not easy to perform writing and erasing at higher speed.

[Reference]
patent Document 1: Japanese Published Patent Application No. S57-105889

DISCLOSURE OF INVENTION

In view of the foregoing problems, an object of one embodiment of the invention disclosed herein is to provide a semiconductor device with a novel structure in which stored data can be retained even when power is not supplied, and there is no limitation on the number of write cycles.

In the invention disclosed herein, a semiconductor device is formed using a purified oxide semiconductor. A transistor including a purified oxide semiconductor has an extremely small leakage current, so that data can be retained for a long time.

One embodiment of the invention disclosed herein is a semiconductor device described as follows. The semiconductor device includes a source line, a bit line, a first signal line, a second signal line, a word line, a memory cell connected between the source line and the bit line, a first driver circuit electrically connected to the bit line, a second driver circuit electrically connected to the first signal line, a third driver circuit electrically connected to the second signal line, and a fourth driver circuit electrically connected to the word line and the source line. The memory cell includes a first transistor having a first gate electrode, a first source electrode, and a first drain electrode; a second transistor having a second gate electrode, a second source electrode, and a second drain electrode; and a capacitor. The first transistor includes a semiconductor material other than an oxide semiconductor. The second transistor includes an oxide semiconductor material. The first gate electrode, one of the second source electrode and the second drain electrode, and one of electrodes of the capacitor are electrically connected to each other. The source line and the first source electrode are electrically connected to each other. The bit line and the first drain electrode are electrically connected to each other. The first signal line and the other of the second source electrode and the second drain electrode are electrically connected to each other. The second signal line and the second gate electrode are electrically connected to each other. The word line and the other of the electrodes of the capacitor are electrically connected to each other.

One embodiment of the invention disclosed herein is a semiconductor device described as follows. The semiconductor device includes a source line, a bit line, a first signal line, a second signal line, a word line, a memory cell connected between the source line and the bit line, a first driver circuit electrically connected to the source line, a second driver circuit electrically connected to the first signal line, a third driver circuit electrically connected to the second signal line, and a fourth driver circuit electrically connected to the word line and the bit line. The memory cell includes a first transistor having a first gate electrode, a first source electrode, and a first drain electrode; a second transistor having a second gate electrode, a second source electrode, and a second drain electrode; and a capacitor. The first transistor includes a semiconductor material other than an oxide semiconductor. The second transistor includes an oxide semiconductor material. The first gate electrode, one of the second source electrode and the second drain electrode, and one of electrodes of the capacitor are electrically connected to each other. The source line and the first source electrode are electrically connected to each other. The bit line and the first drain electrode are electrically connected to each other. The first signal line and the other of the second source electrode and the second drain electrode are electrically connected to each other. The second signal line and the second gate electrode are electrically connected to each other. The word line and the other of the electrodes of the capacitor are electrically connected to each other.

In any of the above structures, the first transistor may include a first channel formation region including the semiconductor material other than the oxide semiconductor, impurity regions provided so as to sandwich the first channel formation region, a first gate insulating layer over the first channel formation region, the first gate electrode over the first gate insulating layer, and the first source electrode and the first drain electrode electrically connected to the impurity regions.

In any of the above structures, the second transistor may include second transistor includes the second source electrode and the second drain electrode above the first transistor, a second channel formation region including the oxide semiconductor material and electrically connected to the second source electrode and the second drain electrode, a second gate insulating layer over the second channel formation region, and the second gate electrode over the second gate insulating layer.

In the above structure, the capacitor may include the second source electrode or the second drain electrode, the second gate insulating layer, and a capacitor electrode over the second gate insulating layer.

In the above-described structures, the transistor is formed using an oxide semiconductor material; however, the invention disclosed herein is not limited thereto. It is possible to use a material with which off-state current characteristics equivalent to those with an oxide semiconductor material can be realized, for example, a wide band gap material such as silicon carbide (specifically, for example, a semiconductor material whose energy gap Eg is larger than 3 eV).

Note that in this specification and the like, the terms "over" and "below" do not necessarily mean the positions "directly on" and "directly under", respectively. For example, the expression "a gate electrode over a gate insulating layer" does not exclude the case where a component is placed between the gate insulating layer and the gate electrode. Moreover, the terms "over" and "below" are only used for convenience of description and can be switched to each other in the case where the relation of components is reversed, unless otherwise specified.

In addition, in this specification and the like, the terms "electrode" and "wiring" do not have functional limitations. For example, an "electrode" is sometimes used as part of a "wiring", and vice versa. Furthermore, the term "electrode" or "wiring" can also mean a plurality of "electrodes" or "wirings" formed in an integrated manner.

Further, functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" can mean connection with an object having any electric function provided between components. There is no particular limitation on an object having any electric function as long as electric signals can be transmitted and received through it.

Examples of an object having any electric function are a switching element such as a transistor, a resistor, an inductor, a capacitor, and an element with a variety of functions in addition to an electrode and a wiring.

Since the off-state current of a transistor including an oxide semiconductor is extremely small, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

A semiconductor device according to the invention disclosed herein does not need high voltage for writing data and has no problem of deterioration of elements. For example, a problem such as deterioration of a gate insulating layer does not occur because it is not necessary to perform injection and extraction of electrons into and from a floating gate, which is needed in a conventional non-volatile memory. That is, the semiconductor device according to the invention disclosed herein has no limitation on the number of write cycles, which is a problem in a conventional non-volatile memory, and thus has a significantly increased reliability. Furthermore, since data is written depending on the on/off state of the transistor, high-speed operation can be easily realized. In addition, there is no need of operation for erasing data.

Since a transistor including a material other than an oxide semiconductor can operate at sufficiently high speed, the semiconductor device can perform operation (e.g., data reading operation) at sufficiently high speed by using a combination of the transistor including a material other than an oxide semiconductor and the transistor including an oxide semiconductor. Moreover, favorable circuits for which high-speed operation is required (e.g., a logic circuit and a driver circuit) can be realized with the transistor including a material other than an oxide semiconductor.

A semiconductor device with a novel feature can be realized by including both the transistor including a material other than an oxide semiconductor and the transistor including an oxide semiconductor.

BRIEF DESCRIPTION OF DRAWINGS

In the accompanying drawings:

FIGS. 1A1 and 1A2 are circuit diagrams of a semiconductor device;

FIG. 2 is a circuit diagram of a semiconductor device;

BEST MODE FOR CARRYING OUT THE INVENTION

Figure 2:
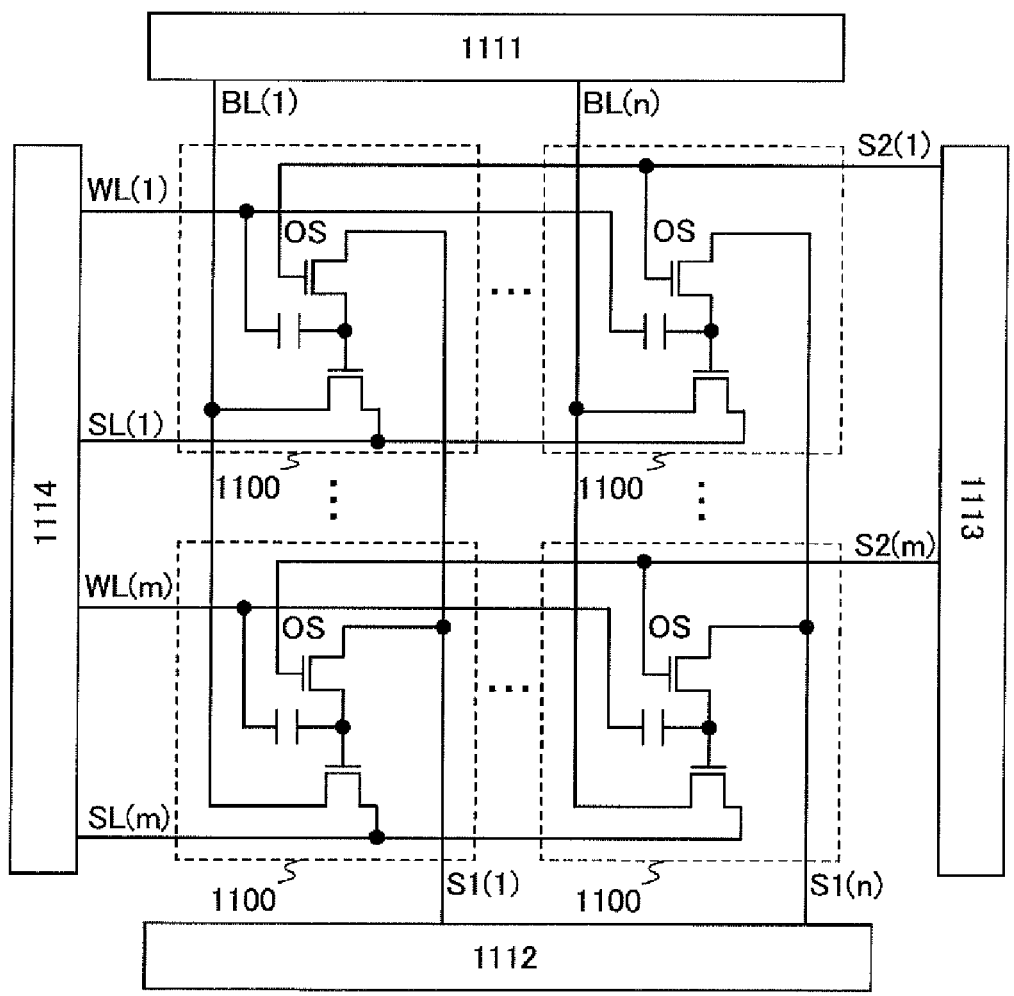

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, size, range, or the like of each component illustrated in drawings and the like is not accurately represented in some cases for easy understanding. Therefore, the invention disclosed herein is not necessarily limited to the position, size, range, or the like disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, a circuit configuration and operation of a semiconductor device according to one embodiment of the invention disclosed herein will be described with reference to FIGS. 1A1 and 1A2. Note that in circuit diagrams, "OS" is sometimes written beside a transistor to indicate that the transistor includes an oxide semiconductor.

In the semiconductor device illustrated in FIG. 1A1, a first wiring (a 1st line, also referred to as a source line) and a source electrode of a transistor 160 are electrically connected to each other. A second wiring (a 2nd line, also referred to as a bit line) and a drain electrode of the transistor 160 are electrically connected to each other. A third wiring (a 3rd line, also referred to as a first signal line) and one of a source electrode and a drain electrode of a transistor 162 are electrically connected to each other. A fourth wiring (a 4th line, also referred to as a second signal line) and a gate electrode of the transistor 162 are electrically connected to each other. A gate electrode of the transistor 160 and the other of the source electrode and the drain electrode of the transistor 162 are electrically connected to one of electrodes of a capacitor 164.

A fifth wiring (a 5th line, also referred to as a word line) and the other electrode of the capacitor 164 are electrically connected to each other.

Here, a transistor including an oxide semiconductor is used as the transistor 162. A transistor including an oxide semiconductor has extremely small off-state current. For that reason, the potential of the gate electrode of the transistor 160 can be held for an extremely long time by turning off the transistor 162. The capacitor 164 facilitates retention of electric charge applied to the gate electrode of the transistor 160 and reading of stored data. The transistor 162 including an oxide semiconductor has a channel length (L) of 10 nm to 1000 nm, and thus features low power consumption and extremely high operating speed.

In the semiconductor device in FIG. 1A1, writing, holding, and reading of data can be performed as described below, using the advantage that the potential of the gate electrode of the transistor 160 can be held.

Firstly, writing and holding of data will be described. First, the potential of the fourth wiring is set to a potential with which the transistor 162 is turned on, and the transistor 162 is turned on. Thus, the potential of the third wiring is supplied to the gate electrode of the transistor 160 and the capacitor 164. That is, predetermined electric charge is applied to the gate electrode of the transistor 160 (writing). Here, either of two types of electric charges having different potential levels (hereinafter referred to as a low-level electric charge and a high-level electric charge) is applied to the gate electrode of the transistor 160 and the capacitor 164. After that, the potential of the fourth wiring is set to a potential with which the transistor 162 is turned off, so that the transistor 162 is turned off. Thus, the electric charge applied to the gate electrode of the transistor 160 is held (storing).

Since the off-state current of the transistor 162 is extremely small, the electric charge of the gate electrode of the transistor 160 is held for a long time.

Secondly, reading of data will be described. By supplying an appropriate potential (a reading potential) to the fifth wiring when a predetermined potential (a constant potential) is supplied to the first wiring, the potential of the second wiring varies depending on the amount of electric charge held in the gate electrode of the transistor 160. This is because in the case where the transistor 160 is an n-channel transistor, an apparent threshold voltage $V_{th\_H}$ when a high-level electric charge is applied to the gate electrode of the transistor 160 is usually lower than an apparent threshold voltage $V_{th\_L}$ when a low-level electric charge is applied to the gate electrode of the transistor 160. Here, an apparent threshold voltage refers to the potential of the fifth wiring needed to turn on the transistor 160. Thus, when the potential of the fifth wiring is set to a potential $V_0$ intermediate between $V_{th\_H}$ and $V_{th\_L}$, the electric charge applied to the gate electrode of the transistor 160 can be determined. For example, in the case where a high-level electric charge is applied in writing, the transistor 160 is turned on when the potential of the fifth wiring becomes $V_0$ ($>V_{th\_H}$). In the case where a low-level electric charge is applied in writing, the transistor 160 remains off even when the potential of the fifth wiring becomes $V_0$ ($<V_{th\_L}$). Therefore, the stored data can be read out by checking the potential of the second wiring.

Note that in the case where memory cells are arrayed to be used, only data of desired memory cells is needed to be read. In order to read data of predetermined memory cells and not to read data of the other memory cells, in the case where the transistors 160 are connected in parallel among the memory cells, fifth wirings in memory cells that are not a target of data reading are supplied with a potential with which the transistor 160 is turned off regardless of a state of the gate electrode, that is, a potential lower than $V_{th\_H}$. On the other hand, in the case where the transistors 160 are connected in series among the memory cells, fifth wirings in memory cells that are not a target of data reading are supplied with a potential with which the transistor 160 is turned on regardless of a state of the gate electrode, that is, a potential higher than $V_{th\_L}$.

Thirdly, rewriting of data will be described. Rewriting of data is performed in a manner similar to that of the writing and holding of data. That is, the potential of the fourth wiring is set to a potential with which the transistor 162 is turned on, so that the transistor 162 is turned on. Thus, the potential of the third wiring (a potential related to new data) is supplied to the gate electrode of the transistor 160 and the capacitor 164. After that, the potential of the fourth wiring is set to a potential with which the transistor 162 is turned off, and the transistor 162 is turned off; thus, electric charge related to new data is applied to the gate electrode of the transistor 160.

In the semiconductor device according to the invention disclosed herein, data can be directly rewritten by writing data again as described above. For that reason, extraction of electric charge from a floating gate with the use of high voltage needed in a flash memory or the like is not necessary, and a reduction in operating speed due to erasing operation can be suppressed. In other words, high-speed operation of the semiconductor device is realized.

Note that the source electrode or the drain electrode of the transistor 162 is electrically connected to the gate electrode of the transistor 160, thereby obtaining a function equivalent to that of a floating gate of a floating gate transistor used for a non-volatile memory element. Therefore, a portion in the drawing where the source electrode or the drain electrode of the transistor 162 is electrically connected to the gate electrode of the transistor 160 is sometimes called a floating gate portion FG. When the transistor 162 is off, the floating gate portion FG can be regarded as being embedded in an insulator and electric charge is stored in the floating gate portion FG. The off-state current of the transistor 162 including an oxide semiconductor is smaller than or equal to one hundred thousandth of that of a transistor including a silicon semiconductor or the like; thus, it is possible to ignore loss of the electric charge stored in the floating gate portion FG due to the leakage current of the transistor 162. That is, with the transistor 162 including an oxide semiconductor, a non-volatile storage device that can store data even when power is not supplied can be realized.

For example, when the off-state current of the transistor 162 at room temperature is 10 zA/μm (1 zA (zeptoampere) is $1 \times 10^{-21}$ A) or less and the capacitance value of the capacitor 164 is approximately 10 fF, data can be stored for at least $10^4$ seconds. It is needless to say that the data retention time depends on characteristics of the transistor and the capacitance value of the capacitor 164.

Further, in that case, the problem of deterioration of a gate insulating film (a tunnel insulating film), which has been a problem in a conventional floating gate transistor, does not arise. That is, the existing problem of deterioration of a gate insulating film due to injection of electrons into a floating gate can be solved. This means that there is no limitation on the number of write cycles in principle. Furthermore, high voltage needed for writing or erasing data in a conventional floating gate transistor is not necessary.

The components such as the transistors included in the semiconductor device in FIG. 1A1 can be regarded as being composed of a resistor and a capacitor as illustrated in FIG. 1A2. That is, in FIG. 1A2, the transistor 160 and the capacitor 164 are each regarded as including a resistor and a capacitor.

The resistance value and the capacitance value of the capacitor 164 are denoted by R1 and C1, respectively. The resistance value R1 corresponds to the resistance value depending on an insulating layer included in the capacitor 164. The resistance value and the capacitance value of the transistor 160 are denoted by R2 and C2, respectively. The resistance value R2 corresponds to the resistance value depending on a gate insulating layer at the time when the transistor 160 is on. The capacitance value C2 corresponds to the value of a so-called gate capacitance (a capacitance generated between a gate electrode and a source electrode or a drain electrode, and a capacitance generated between the gate electrode and a channel formation region).

The resistance value (also referred to as effective resistance) between the source electrode and the drain electrode when the transistor 162 is off is denoted by ROS. When R1 and R2 satisfy the following relations of R1≧ROS (R1 is higher than or equal to ROS) and R2≧ROS (R2 is higher than or equal to ROS) under the condition that gate leakage of the transistor 162 is sufficiently small, a period for holding electric charge (also referred to as a data retention period) is determined mainly by the off-state current of the transistor 162.

On the other hand, when the above relations are not satisfied, it is difficult to secure a sufficient retention period even if the off-state current of the transistor 162 is sufficiently small. This is because a leakage current other than the off-state current of the transistor 162 (e.g., a leakage current generated between the source electrode and the gate electrode) is large. Thus, it is preferable that the semiconductor device disclosed in this embodiment satisfy the above relations.

Moreover, C1 and C2 preferably satisfy the relation: C1≧C2 (C1 is larger than or equal to C2). This is because if C1 is large, variation in potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by the gate insulating layers of the transistors 160 and 162. The same can be said to C1 and C2. Therefore, it is preferable that the material, the thickness, and the like of the gate insulating layer be set as appropriate to satisfy the above relations.

In the semiconductor device in this embodiment, the floating gate portion FG has a function equivalent to that of a floating gate of a floating gate transistor in a flash memory or the like, but the floating gate portion FG of this embodiment has an essentially different feature from that of the floating gate of the flash memory or the like. In a flash memory, since a voltage applied to a control gate is high, it is necessary to keep a proper distance between cells in order to prevent the potential from adversely affecting a floating gate of the adjacent cell. This is one of inhibiting factors in high integration of semiconductor devices. The factor is attributed to the following basic principle of a flash memory: a tunneling current is generated by application of a high electric field.

Further, because of the above principle of a flash memory, deterioration of an insulating film proceeds and thus another problem of the limit on the number of write cycles (approximately $10^4$ to $10^5$ times) occurs.

The semiconductor device according to the invention disclosed herein is operated by switching of a transistor including an oxide semiconductor and does not use the above-described principle of charge injection by a tunneling current. That is, unlike a flash memory, a high electric field for charge injection is not necessary. Accordingly, it is not necessary to consider an influence of a high electric field from a control gate on an adjacent cell, which facilitates high integration.

Further, charge injection by a tunneling current is not utilized, which means that there is no cause for deterioration of a memory cell. In other words, the semiconductor device according to the invention disclosed herein has higher durability and reliability than a flash memory.

In addition, the semiconductor device according to the invention has advantages over a flash memory in that a high electric field is unnecessary and a large peripheral circuit (such as a booster circuit) is unnecessary.

In the case where the dielectric constant $\in$r1 of the insulating layer in the capacitor 164 having C1 is different from the dielectric constant $\in$r2 of the insulating layer in the transistor 160 having C2, it is easy to satisfy C1≧C2 (C1 is larger than or equal to C2) while satisfying 2·S2≧S1 (2·S2 is larger than or equal to S1), preferably S2≧S1 (S2 is larger than or equal to S1), where S1 represents the area related to C1 and S2 represents the area related to C2. Specifically, for example, a film formed of a high-k material such as hafnium oxide or a stack of a film formed of a high-k material such as hafnium oxide and a film formed of an oxide semiconductor is used for the insulating layer related to C1 so that art can be 10 or more, preferably 15 or more; silicon oxide is used for the insulating layer related to C2 so that $\in$r2 can be 3 to 4.

A combination of such structures enables higher integration of the semiconductor devices according to the invention disclosed herein.

Note that an n-channel transistor in which electrons are majority carriers is used in the above description; it is needless to say that a p-channel transistor in which holes are majority carriers can be used instead of an n-channel transistor.

As described above, the semiconductor device according to one embodiment of the invention disclosed herein has a non-volatile memory cell that includes a writing transistor in which a leakage current between a source and a drain in an off state (an off-state current) is small, a reading transistor formed using a semiconductor material different from that of the writing transistor, and a capacitor.

The off-state current of the writing transistor is preferably 100 zA ($1\times10^{-19}$ A) or less, more preferably 10 zA ($1\times10^{-20}$ A) or less, further preferably 1 zA ($1\times10^{-21}$ A) or less at the operating temperature of the semiconductor device (e.g., 25° C.). It is difficult for a general silicon semiconductor to achieve a small off-state current as described above. In contrast, such a small off-state current can be achieved in a transistor obtained by processing an oxide semiconductor under an appropriate condition. Therefore, a transistor including an oxide semiconductor is preferably used as the writing transistor.

In addition, a transistor including an oxide semiconductor has a small subthreshold swing (S value), so that the switching rate can be sufficiently high even if the mobility is comparatively low. Therefore, by using the transistor as the writing transistor, rising of a writing pulse given to the floating gate portion FG can be very sharp. Moreover, since the off-state current is small, the amount of electric charge held in the floating gate portion FG can be reduced. That is, by using a transistor including an oxide semiconductor as the writing transistor, rewriting of data can be performed at high speed.

Although there is no limitation on the off-state current of the reading transistor, a transistor that operates at high speed is preferably used as the reading transistor in order to increase the readout speed. For example, a transistor with a switching rate of 1 nanosecond or lower is preferably used as the reading transistor.

Data is written into the memory cell in the following manner: the writing transistor is turned on so that a potential is supplied to the node where one of a source electrode and a drain electrode of the writing transistor, one electrode of the capacitor, and a gate electrode of the reading transistor are electrically connected, and then the writing transistor is turned off so that the predetermined amount of electric charge is held in the node. Since the off-state current of the writing transistor is very small, the electric charge supplied to the node is held for a long time. When the off-state current is, for example, substantially 0, refresh operation needed for a conventional DRAM can be unnecessary or the frequency of refresh operation can be significantly low (e.g., about once a month or once a year). Accordingly, power consumption of the semiconductor device can be sufficiently reduced.

Further, data can be rewritten directly by another writing of data into the memory cell. For that reason, erasing operation which is necessary for a flash memory or the like is not needed, so that a reduction in operating speed due to erasing operation can be prevented. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the maximum difference between the highest potential and the lowest potential applied to terminals of the memory cell at the same time) is 5 V or lower, preferably 3 V or lower in one memory cell, in the case where two-level (one bit) data is written.

The memory cell in the semiconductor device according to the invention disclosed herein at least includes the writing transistor, the reading transistor, and the capacitor and can operate even when the area of the capacitor is small For that reason, the area per memory cell can be sufficiently reduced as compared to, for example, an SRAM that needs six transistors per memory cell; thus, memory cells can be arranged in the semiconductor device at high density.

In a conventional floating gate transistor, electric charge travels in a gate insulating film (a tunnel insulating film) during writing operation, so that deterioration of the gate insulating film (the tunnel insulating film) cannot be avoided. In contrast, in the memory cell according to one embodiment of the present invention, data is written by switching operation of a writing transistor; therefore, deterioration of a gate insulating film, which has been recognized as a problem, can be neglected. This means that there is no limitation on the number of write cycles in principle and writing durability is very high. For example, in the memory cell according to one embodiment of the present invention, the current-voltage characteristics are not degraded even after data is written $1\times10^9$ times (one billion times) or more.

Further, in the case where a transistor including an oxide semiconductor is used as the writing transistor of the memory cell, the current-voltage characteristics of the memory cell are not degraded even at, for example, a high temperature of 150° C. because the oxide semiconductor has a wide energy gap of 3.0 eV to 3.5 eV and extremely few thermally excited carriers.

As a result of concentration on researches, the present inventors have found for the first time that a transistor including an oxide semiconductor has excellent properties such that characteristics of the transistor do not deteriorate even at a high temperature of 150° C. and the transistor has an extremely small off-state current of 100 zA or less. According to one embodiment of the invention disclosed herein, a semiconductor device having a novel feature is provided by using such a transistor having excellent properties as the writing transistor of the memory cell.

The structures, methods, and the like described in this embodiment can be combined as appropriate with any of the structures, methods, and the like described in the other embodiments.

(Embodiment 2)

In this embodiment, one application example of the semiconductor device described in Embodiment 1 will be described. Specifically, an example of a semiconductor device in which the semiconductor devices described in Embodiment 1 are arranged in matrix will be described.

FIG. 2 illustrates an example of a circuit diagram of a semiconductor device having a storage capacity of m×n bits.

A semiconductor device according to one embodiment of the present invention includes a memory cell array in which m word lines WL, m source lines SL, m second signal lines S2, n bit lines BL, n first signal lines S1, and a plurality of memory cells 1100 are arranged in matrix of m (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

Each of the memory cells 1100 includes a first transistor, a second transistor, and a capacitor. A gate electrode of the first transistor, one of a source electrode and a drain electrode of the second transistor, and one electrode of the capacitor are connected to each other. The source line SL and a source electrode of the first transistor are connected to each other. The bit line BL and a drain electrode of the first transistor are connected to each other. The first signal line S1 and the other of the source electrode and the drain electrode of the second transistor are connected to each other. The second signal line S2 and a gate electrode of the second transistor are connected to each other. The word line WL and the other electrode of the capacitor are connected to each other.

In FIG. 2, the memory cell 1100(i,j) of the ith row and the jth column (i is an integer of 1 to in, and j is an integer of 1 to n) is connected to the word line WL(i), the source line SL(i), the bit line BL(j), the first signal line S1(j), and the second signal line S2(i).

The n bit lines BL are connected to the first driver circuit 1111. The n first signal lines 51 are connected to the second driver circuit 1112. The m second signal lines S2 are connected to the third driver circuit 1113. The m word lines WL and the m source lines SL are connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this structure. A driver circuit having any one or some of the functions may be used.

Next, writing operation and reading operation will be described with reference to a timing chart in FIG. 3.

Note that although operation of semiconductor devices of two rows and two columns will be described for simplification, the invention disclosed herein is not limited to this.

Figure 3:
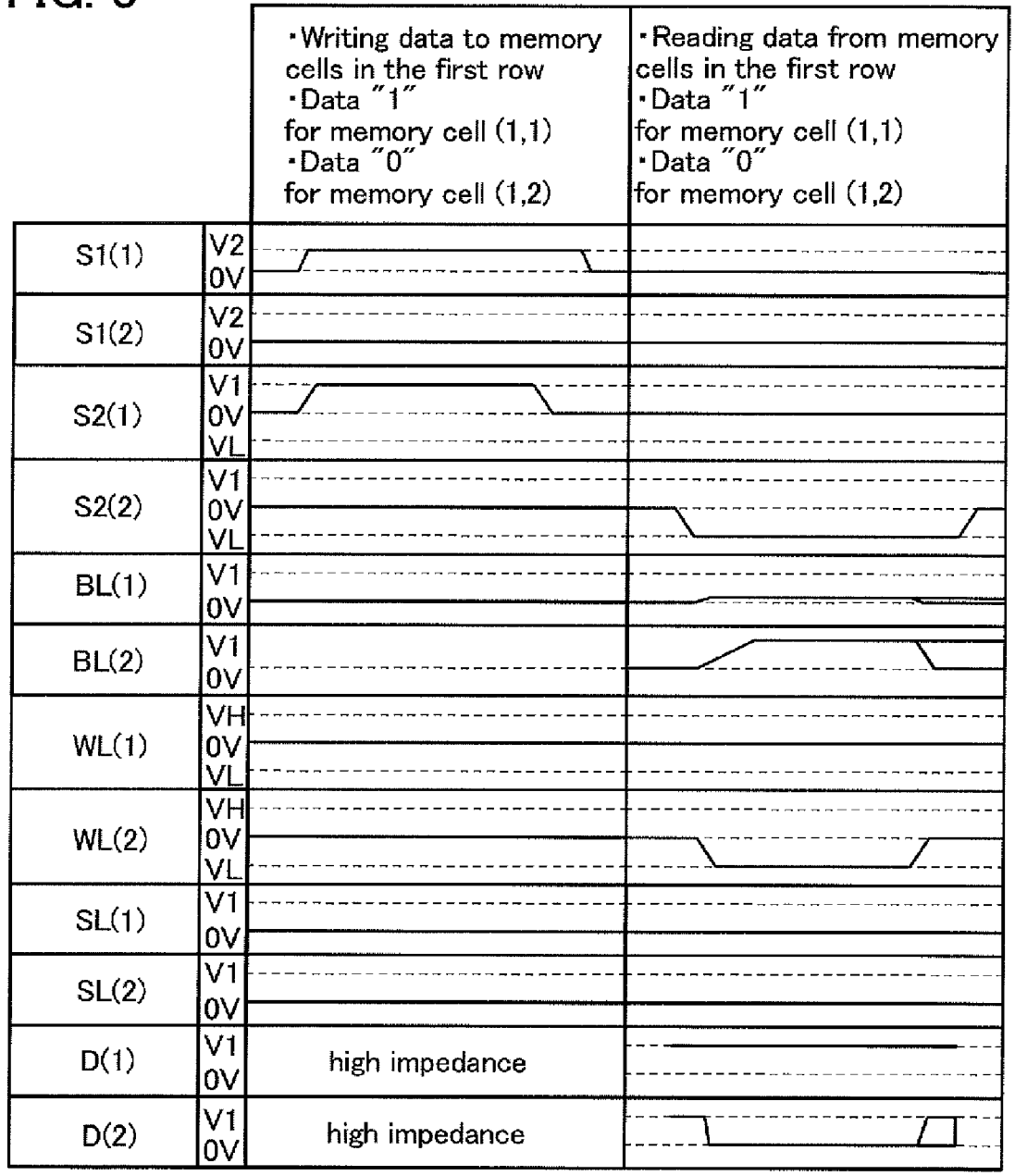
FIG. 3 is a timing chart.

FIG. 3 illustrates operation of the semiconductor device in FIG. 2. In FIG. 3, S1(1) and S1(2) are potentials of the first signal lines S1; S2(1) and S2(2) are potentials of the second signal lines S2; BL(1) and BL(2) are potentials of the bit lines BL; WL(1) and WL(2) are potentials of the word lines WL; and SL(1) and SL(2) are potentials of the source lines SL.

Writing data to the memory cell 1100(1,1) and the memory cell 1100(1,2) in the first row and reading data from the memory cell 1100(1,1) and the memory cell 1100(1,2) in the first row will be described. Note that in the following description, it is assumed that data to be written to the memory cell 1100(1,1) is "1" and data to be written to the memory cell 1100(1,2) is "0".

The writing operation will be described. First, a potential V1 is applied to the second signal line S2(1) of the first row so that the second transistors in the memory cells of the first row are turned on. Moreover, a potential of 0 V is applied to the second signal line S2(2) of the second row so that the second transistors of the second row are turned off.

Furthermore, a potential V2 is applied to the first signal line S1(1) of the first column, and a potential of 0 V is applied to the first signal line S1(2) of the second column.

As a result, the potential V2 is applied to a floating gate portion FG of the memory cell 1100(1,1), and a potential of 0 V is applied to a floating gate portion FG of the memory cell 1100(1,2). Here, the potential V2 is higher than the threshold voltage of the first transistor. Then, the potential of the second signal line S2(1) of the first row is set to 0 V so that the second transistors of the first row are turned off; thus, the writing is completed.

Note that the word lines WL(1) and WL(2) are set to 0 V. Further, at the end of the writing, before the potential of the first signal line S1 is changed, the potential of the second signal line S2(1) of the first row is set to 0 V. After the writing, the threshold voltage of a memory cell is Vw0 in the case where data "0" has been written and Vw1 in the case where data "1" has been written, assuming that a terminal connected to the word line WL is a control gate electrode, the source electrode of the first transistor is a source electrode, and the drain electrode of the first transistor is a drain electrode. Here, the threshold voltage of the memory cell means a voltage of the terminal connected to the word line WL, which changes a resistance state between the source electrode and the drain electrode of the first transistor. Note that here, Vw0>0>Vw1 is satisfied.

Next, the reading operation will be described. Note that a reading circuit illustrated in FIG. 4 is electrically connected to the bit lines BL.

First, a potential of 0 V is applied to the word line WL(1) of the first row, and a potential VL is applied to the word line WL(2) of the second row. The potential VL is lower than the threshold voltage Vw1. When the word line WL(1) is set to 0 V, in the first row, the first transistor of the memory cell in which data "0" is stored is turned off, and the first transistor of the memory cell in which data "1" is stored is turned on. When the word line WL(2) is set to the potential VL, in the second row, the first transistors are turned off in both the memory cell in which data "0" is stored and the memory cell in which data "1" is stored.

As a result, the resistance between the bit line BL(1) and the source line SL(1) is low because the first transistor in the memory cell 1100(1,1) is on, and the resistance between the bit line BL(2) and the source line SL(2) is high because the first transistor in the memory cell 1100(1,2) is off. Using a reading circuit connected to the bit line BL(1) and the bit line BL(2), data can be read out in accordance with a difference in resistance state of the bit lines BL.

Figure 4:
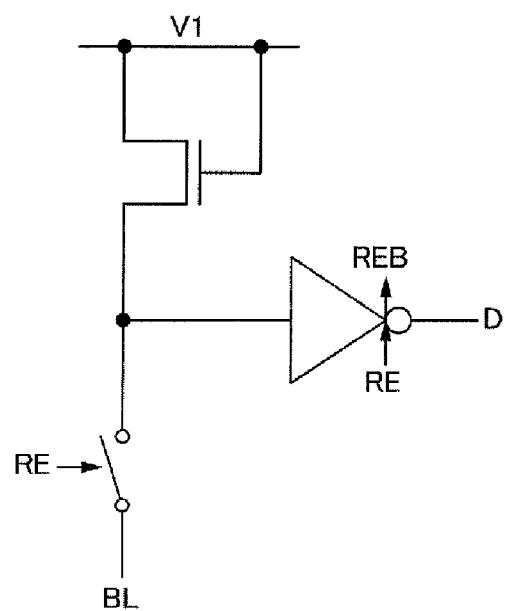
FIG. 4 is a circuit diagram of a semiconductor device.

FIG. 4 illustrates an example of a reading circuit. The reading circuit is connected to the bit line BL(1) and the bit line BL(2). An output potential in the case where the circuit illustrated in FIG. 4 is used as a reading circuit will be described. In the reading circuit in FIG. 4, the bit line BL is connected to a clocked inverter and a transistor that is diodeconnected to a wiring to which the potential V1 is applied, via a switch controlled by a read enable signal (an RE signal).

Here, a potential of 0 V is applied to the source line SL(1) and the source line SL(2). Since the resistance between the bit line BL(1) and the source line SL(1) is low, a low potential is applied to the clocked inverter and an output D(1) is a high-level signal. Since the resistance between the bit line BL(2) and the source line SL(2) is high, a high potential is applied to the clocked inverter and an output D(2) is a low-level signal.

During the reading operation, a potential of 0 V is applied to the second signal line S2(1) and the potential VL is applied to the second signal line S2(2) so that all the second transistors are turned off. The potentials of the floating gate portions FG of the first row are 0 V or V2; thus, all the second transistors can be turned off by setting the potential of the second signal line S2(1) to 0 V. On the other hand, when the potential VL is applied to the word line WL(2), the potential of the floating gate portions FG of the second row is lower than the potential at the time right after data writing. In order to prevent the second transistors from being turned on, the potential of the second signal line S2(2) is set to a low potential (the potential VL) same as that of the word line WL(2). Thus, all the second transistors can be turned off.

Examples of the operating voltages are V1=2 V, V2=1.5 V, VH=2 V, and VL=−2 V.

Since an oxide semiconductor with extremely small off-state current is used in the semiconductor device in FIG. 2, stored data can be retained for an extremely long time. In other words, power consumption can be adequately reduced because refresh operation becomes unnecessary or the frequency of refresh operation can be extremely low. Moreover, stored data can be retained for a long time even when power is not supplied.

The semiconductor device in FIG. 2 does not need high voltage for writing data and has no problem of deterioration of elements. Therefore, the semiconductor device in FIG. 2 has no limitation on the number of write cycles, which is a problem in a conventional non-volatile memory, and thus has a significantly increased reliability. Furthermore, since data is written depending on the on/off state of the transistor, high-speed operation can be easily realized. In addition, there is no need of operation for erasing data.

Since a transistor including a material other than an oxide semiconductor can operate at sufficiently high speed, the semiconductor device can perform operation (e.g., data reading operation) at sufficiently high speed by using a combination of the transistor including a material other than an oxide semiconductor and the transistor including an oxide semiconductor. Moreover, favorable circuits for which high-speed operation is required (e.g., a logic circuit and a driver circuit) can be realized with the transistor including a material other than an oxide semiconductor.

A semiconductor device with a novel feature can be realized by including both the transistor including a material other than an oxide semiconductor and the transistor including an oxide semiconductor.

The structures, methods, and the like described in this embodiment can be combined as appropriate with any of the structures, methods, and the like described in the other embodiments.

(Embodiment 3)

In this embodiment, other examples of a semiconductor device in which the semiconductor devices described in Embodiment 1 are arranged in matrix will be described.

Figure 5:
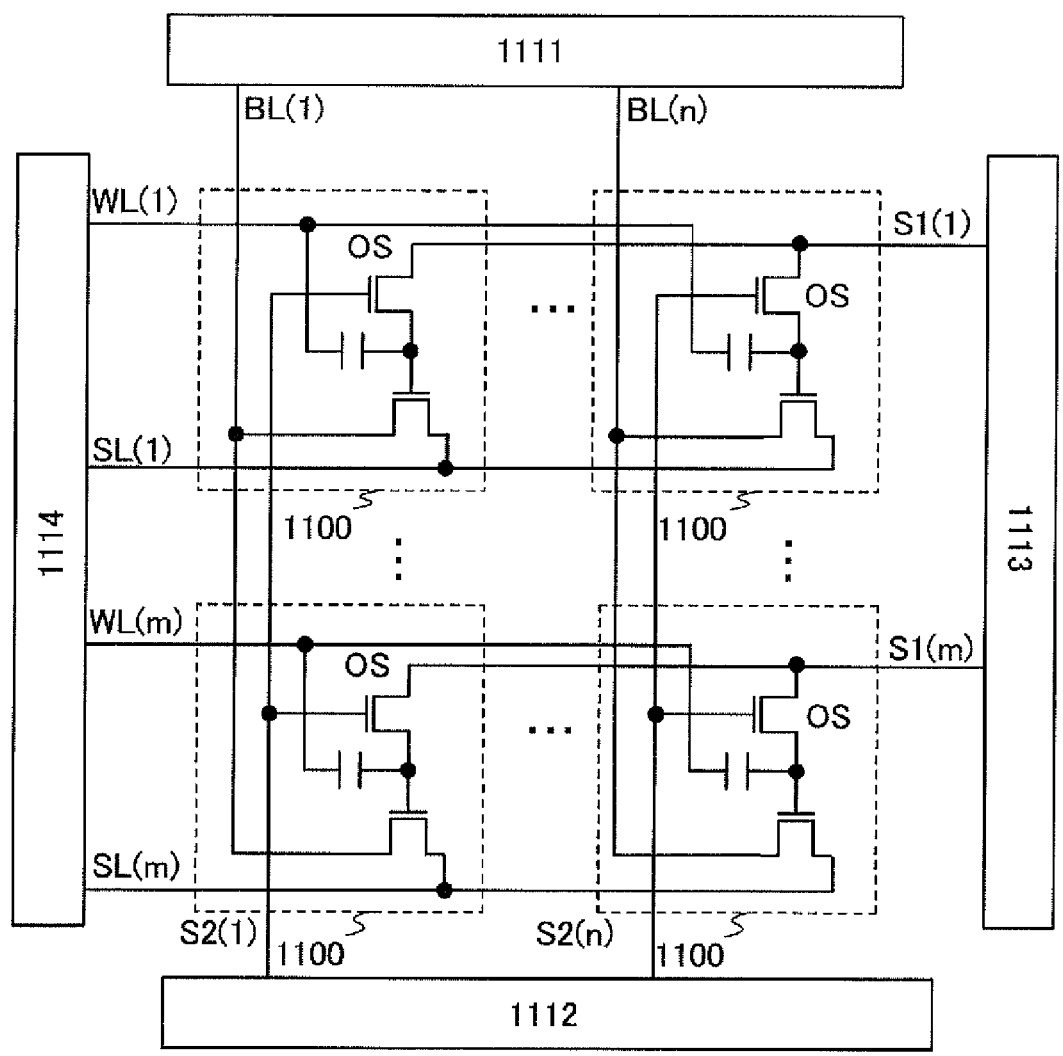
FIG. 5 is a circuit diagram of a semiconductor device.

FIG. 5 illustrates an example of a circuit diagram of a semiconductor device having a storage capacity of m×n bits; the structure of the semiconductor device is partly different from that in FIG. 2.

The semiconductor device in FIG. 5 includes a memory cell array in which m word lines WL, m source lines SL, m first signal lines S1, n bit lines BL, n second signal lines S2, and a plurality of memory cells 1100 are arranged in matrix of in (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

Each of the memory cells 1100 includes a first transistor, a second transistor, and a capacitor. A gate electrode of the first transistor, one of a source electrode and a drain electrode of the second transistor, and one electrode of the capacitor are connected to each other. The source line SL and a source electrode of the first transistor are connected to each other. The bit line BL and a drain electrode of the first transistor are connected to each other. The first signal line S1 and the other of the source electrode and the drain electrode of the second transistor are connected to each other. The second signal line S2 and a gate electrode of the second transistor are connected to each other. The word line WL and the other electrode of the capacitor are connected to each other.

In FIG. 5, the memory cell 1100(i,j) of the ith row and the jth column (i is an integer of 1 to m, and j is an integer of 1 to n) is connected to the word line WL(i), the source line SL(i), the first signal line S1(j), the bit line BL(j), and the second signal line S2(j).

In FIG. 5, the n bit lines BL are connected to the first driver circuit 1111. The n second signal lines S2 are connected to the second driver circuit 1112. The m first signal lines S1 are connected to the third driver circuit 1113. The m source lines SL and the m word lines WL are connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this structure. A driver circuit having any one or some of the functions may be used.

The operation of the semiconductor device in FIG. 5 is similar to that of the semiconductor device in FIG. 2 (see FIG. 3). Embodiment 2 can be referred to for the details of the operation.

Figure 6:
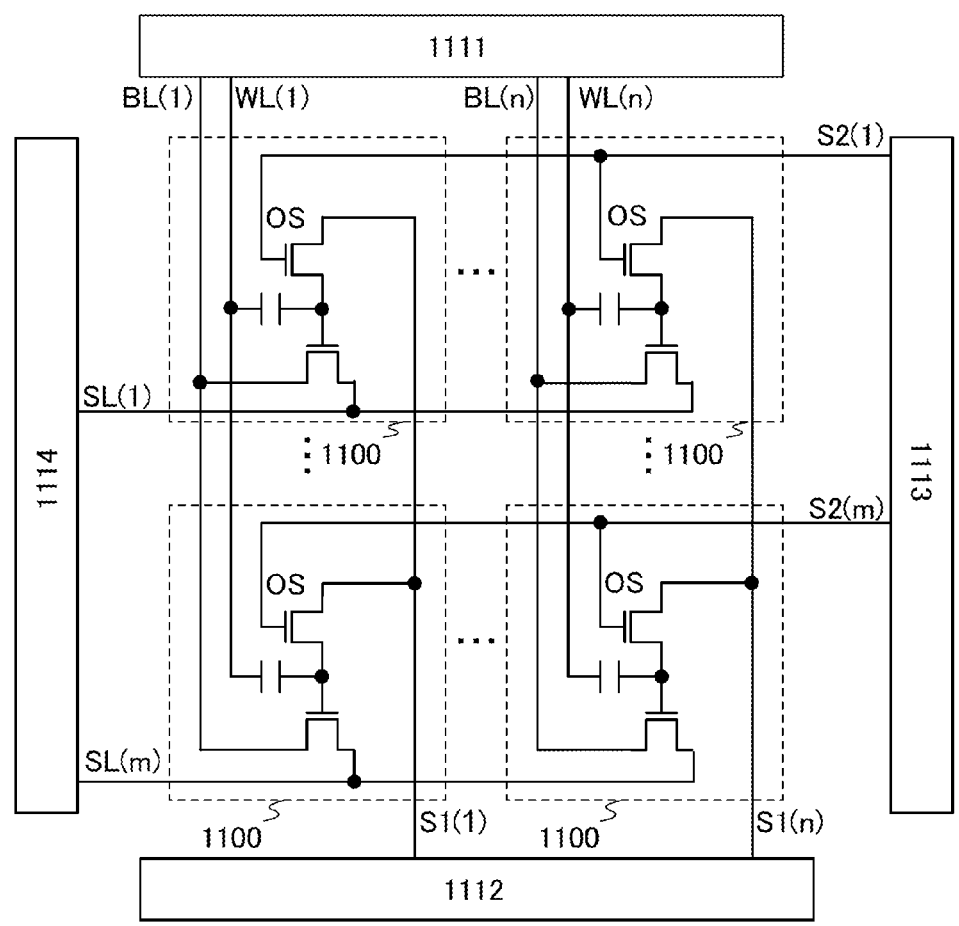
FIG. 6 is a circuit diagram of a semiconductor device.

Next, FIG. 6 illustrates an example of a circuit diagram of a semiconductor device having a storage capacity of m×n bits; the structure of the semiconductor device is partly different from the structures in FIGS. 2 and 5.

The semiconductor device in FIG. 6 includes a memory cell array in which m source lines SL, m second signal lines S2, n bit lines BL, n word lines WL, n first signal lines S1, and a plurality of memory cells 1100 are arranged in matrix of in (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 6, the memory cell 1100(i,j) of the ith row and the jth column (i is an integer of 1 to m, and j is an integer of 1 to n) is connected to the source line SL(i), the bit line BL(j), the word line WL(j), the first signal line S1(j), and the second signal line S2(i).

In FIG. 6, the n bit lines BL and the n word lines WL are connected to the first driver circuit 1111. The n first signal lines S1 are connected to the second driver circuit 1112. The m second signal lines S2 are connected to the third driver circuit 1113. The m source lines SL are connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this structure. A driver circuit having any one or some of the functions may be used.

Next, writing operation and reading operation will be described with reference to a timing chart in FIG. 7.

Note that although operation of semiconductor devices of two rows and two columns will be described for simplification, the invention disclosed herein is not limited to this.

Figure 7:
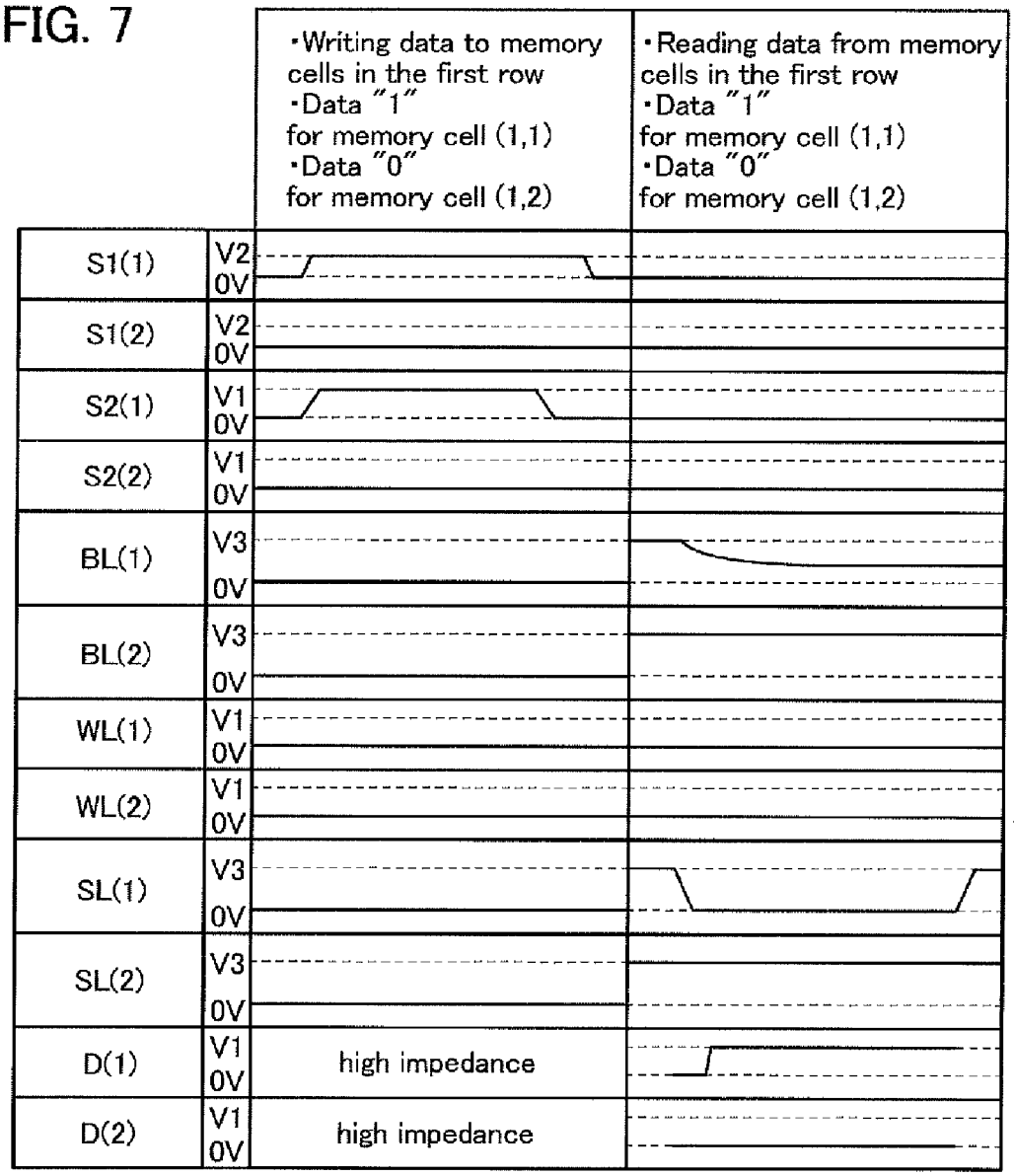
FIG. 7 is a timing chart.

FIG. 7 illustrates operation of the semiconductor device in FIG. 6. In FIG. 7, S1(1) and S1(2) are potentials of the first signal lines S1; S2(1) and S2(2) are potentials of the second signal lines S2; BL(1) and BL(2) are potentials of the bit lines BL; WL(1) and WL(2) are potentials of the word lines WL; and SL(1) and SL(2) are potentials of the source lines SL.

Writing data to the memory cells 1100(1,1) and 1100(1,2) in the first row and reading data from the memory cells 1100(1,1) and 1100(1,2) in the first row will be described. Note that in the following description, it is assumed that data to be written to the memory cell 1100(1,1) is "1" and data to be written to the memory cell 1100(1,2) is "0".

First, the writing operation will be described. In a period for writing data in the first row, the potential V1 is applied to the second signal line S2(1) of the first row so that the second transistors of the first row are turned on. Moreover, a potential of 0 V is applied to the second signal line S2(2) of the second row so that the second transistors of the second row are turned off.

Furthermore, the potential V2 is applied to the first signal line S1(1) of the first column, and a potential of 0 V is applied to the first signal line S1(2) of the second column.

As a result, the potential V2 is applied to a floating gate portion FG of the memory cell 1100(1,1), and a potential of 0 V is applied to a floating gate portion FG of the memory cell 1100(1,2). Here, the potential V2 is higher than the threshold voltage of the first transistor. Then, the potential of the second signal line S2(1) of the first row is set to 0 V so that the second transistors of the first row are turned off; thus, the writing is completed.

Note that the word lines WL(1) and WL(2) are set to 0 V. At the end of the writing, before the potential of the first signal line S1 is changed, the potential of the second signal line S2(1) of the first row is set to 0 V. After the writing, the threshold voltage of a memory cell is Vw0 in the case where data "0" has been written and Vw1 in the case where data "1" has been written. Here, the threshold voltage of the memory cell means a voltage of the terminal connected to the word line WL, which changes a resistance state between the source electrode and the drain electrode of the first transistor. Note that here, Vw0>0>Vw1 is satisfied.

Next, the reading operation will be described. Before the reading operation starts, the bit line BL(1), the bit line BL(2), the source line SL(1), and the source line SL(2) are precharged to a potential V3 in advance. Moreover, a potential of 0 V is applied to the word line WL(1) of the first row and the word line WL(2) of the second row.

In this state, the potentials of the floating gate portions FG are 0 V or the potential V2, and the source electrodes and the drain electrodes of the first transistors have the potential V3. The potential V3 is higher than the potential V2 and 0 V, so that all the first transistors are turned off. The reading operation is performed in this state.

In a period for reading data in the first row, the potential of the source line SL(1) of the first row is lowered to 0 V. At this time, in the first row, the first transistor in the memory cell 1100(1,2) in which data "0" is stored is off because the gate electrode has 0 V, the source electrode has 0 V, and the drain electrode has the potential V3; whereas the first transistor in the memory cell 1100(1,1) in which data "1" is stored is on because the gate electrode has the potential V2, the source electrode has 0 V, and the drain electrode has the potential V3.

As a result, since the first transistor in the memory cell 1100(1,1) is on, electric charge that is precharged in the bit line BL(1) is discharged through the first transistor in the memory cell 1100(1,1), so that the potential of the bit line BL(1) is lowered from V3. On the other hand, since the first transistor in the memory cell 1100(1,2) is off, electric charge that is precharged between the bit line BL(2) and the source line SL(2) is held and the potential of the bit line BL(2) remains V3. Using a reading circuit connected to the bit line BL(1) and the bit line BL(2), data can be read out in accordance with a difference in potential of the bit lines BL.

Figure 8:
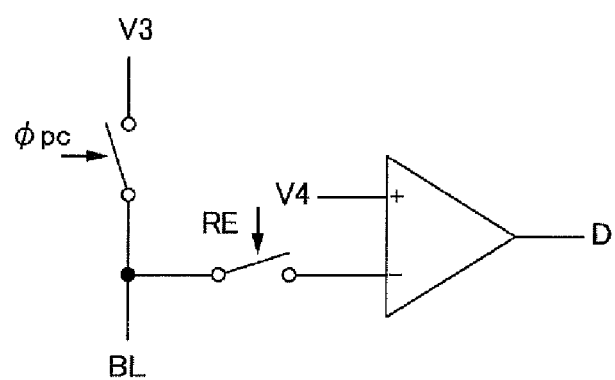
FIG. 8 is a circuit diagram of a semiconductor device.

FIG. 8 illustrates a reading circuit which is different from that in FIG. 4. The reading circuit is connected to the bit line BL(1) and the bit line BL(2). An output potential when the circuit illustrated in FIG. 8 is used as a reading circuit is described. In the reading circuit in FIG. 8, precharge of the potential V3 to the bit line BL is controlled using a switch that is controlled by a precharge signal φpc. Moreover, connection between the bit line BL and one input of a sense amplifier is controlled using a switch that is controlled by a read enable signal (an RE signal). A potential V4 is applied to the other input of the sense amplifier.

At the time of the reading operation, electric charge in the bit line BL(1) is discharged through the memory cell 1100(1, 1) so that the potential of the bit line BL(1) is lowered; thus, the potential of the bit line BL(1) is lower than the potential V4 and the output D(1) is a high-level signal. Since the potential V3 is maintained in the bit line BL(2), the potential of the bit line BL(1) is higher than the potential V4 and the output D(2) is a low-level signal. The potential V4 is lower than the potential V3. Furthermore, the potential V4 is preferably higher than the potential V2.

During the reading operation, a potential of 0 V is applied to the second signal line S2(1) and the second signal line S2(2) so that all the second transistors are turned off.

Examples of the operating voltages are V1=2 V, V2=1.5 V, V3=3 V, and V4=2 V.

Figure 9:
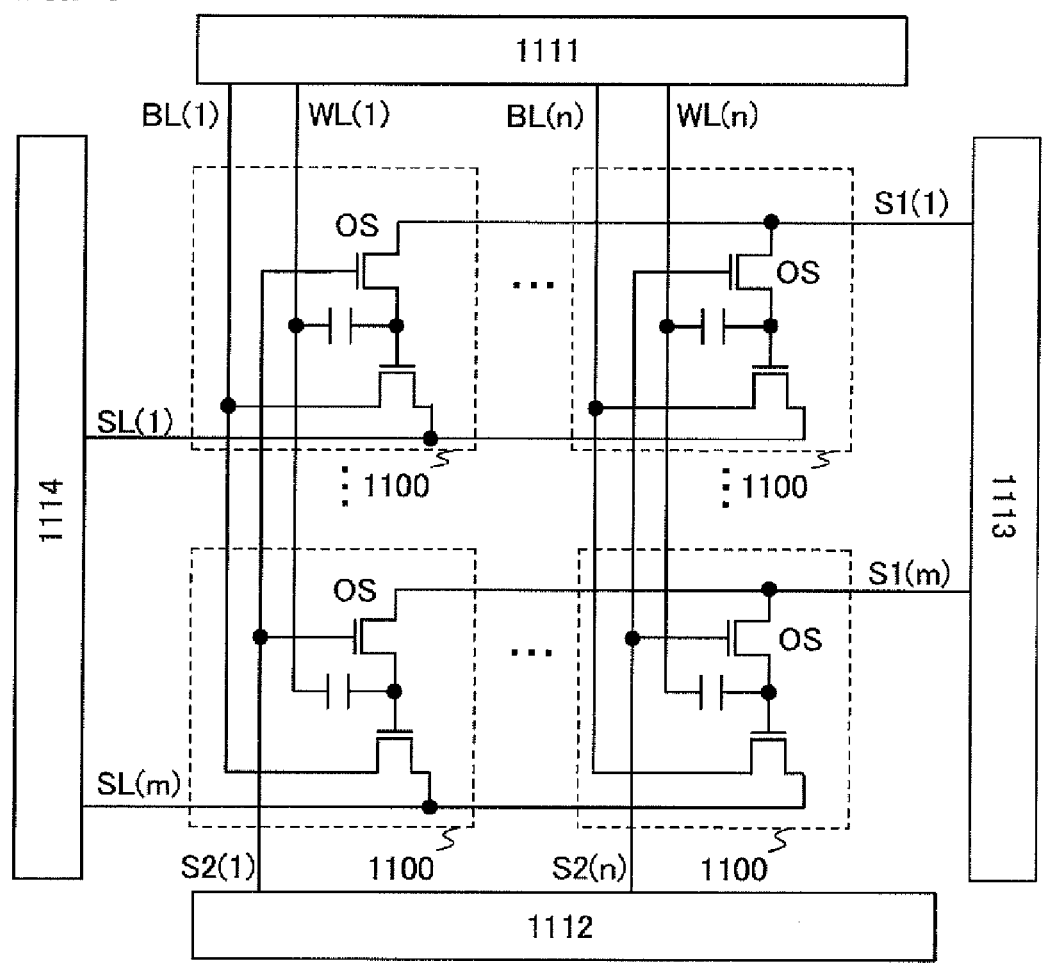
FIG. 9 is a circuit diagram of a semiconductor device.

Next, FIG. 9 illustrates an example of a circuit diagram of a semiconductor device having a storage capacity of m×n bits; the structure of the semiconductor device is partly different from the structures in FIGS. 2, 5, and 6.

The semiconductor device in FIG. 9 includes a memory cell array in which m source lines SL, m first signal lines S1, n bit lines BL, n word lines WL, n second signal lines S2, and a plurality of memory cells 1100 are arranged in matrix of m (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 9, the memory cell 1100(i,j) of the ith row and the jth column (i is an integer of 1 to m, and j is an integer of 1 to n) is connected to the source line SL(i), the bit line BL(j), the word line WL(j), the first signal line S1(i), and the second signal line S2(j).

In FIG. 9, the n bit lines BL and the n word lines WL are connected to the first driver circuit 1111. The n second signal lines S2 are connected to the second driver circuit 1112. The m first signal lines S1 are connected to the third driver circuit 1113. The m source lines SL are connected to the fourth driver circuit 1114.

Figure 10:
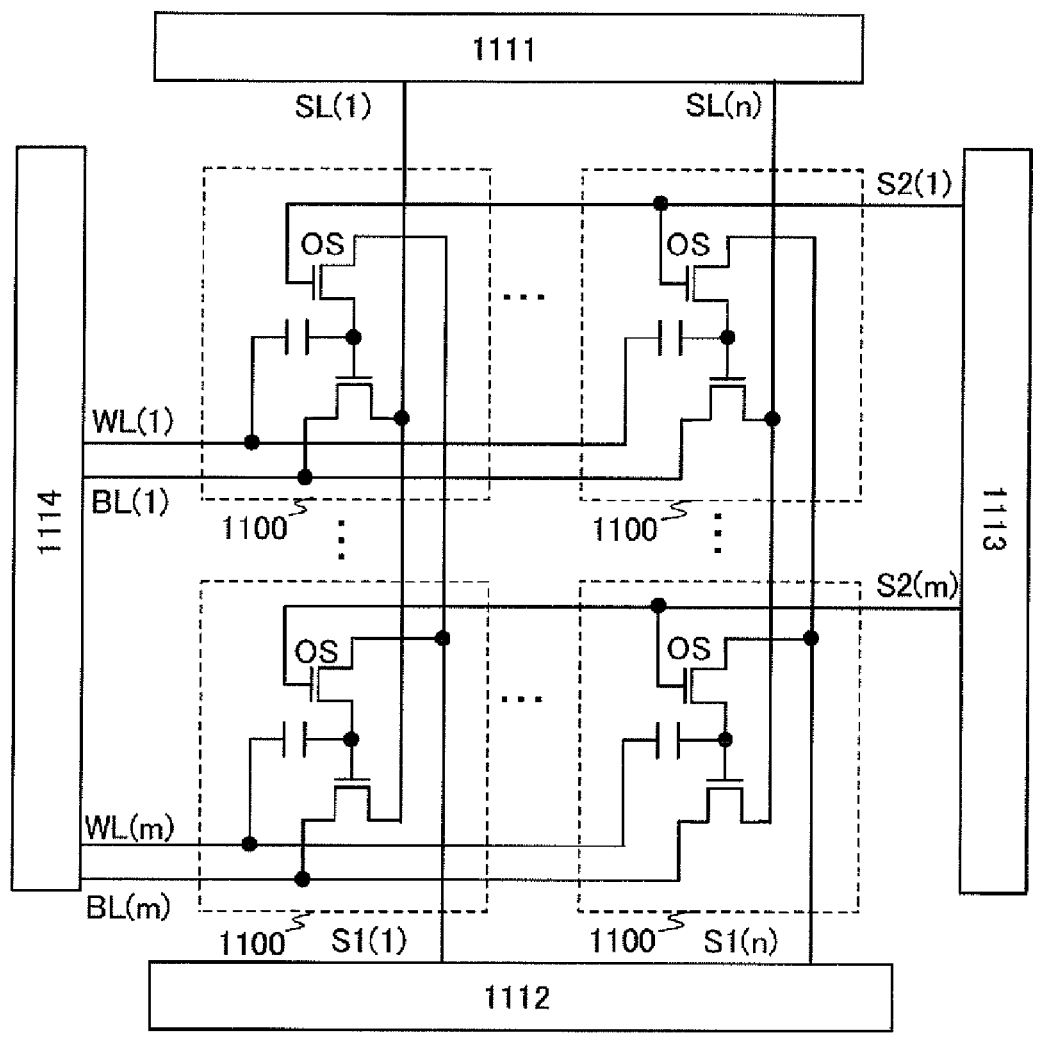
FIG. 10 is a circuit diagram of a semiconductor device.

Next, FIG. 10 illustrates an example of a circuit diagram of a semiconductor device having a storage capacity of m×n bits; the structure of the semiconductor device is partly different from the structures in FIG. 2, FIG. 5, FIG. 6, and FIG. 9. The semiconductor device in FIG. 10 differs from the semiconductor devices in FIG. 2, FIG. 5, FIG. 6, and FIG. 9 in the direction of the source lines SL and the bit lines BL.

The semiconductor device in FIG. 10 includes a memory cell array in which m word lines WL, m bit lines BL, m second signal lines S2, n source lines SL, n first signal lines S1, and a plurality of memory cells 1100 are arranged in matrix of m (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 10, the memory cell 1100(i,j) of the ith row and the jth column (i is an integer of 1 to m, and j is an integer of 1 to n) is connected to the source line SL(j), the word line WL(i), the bit line BL(i), the first signal line S1(j), and the second signal line S2(i).

In FIG. 10, the n source lines SL are connected to the first driver circuit 1111. The n first signal lines S1 are connected to the second driver circuit 1112. The m second signal lines S2 are connected to the third driver circuit 1113. The m word lines WL and the m bit lines BL are connected to the fourth driver circuit 1114.

Figure 11:
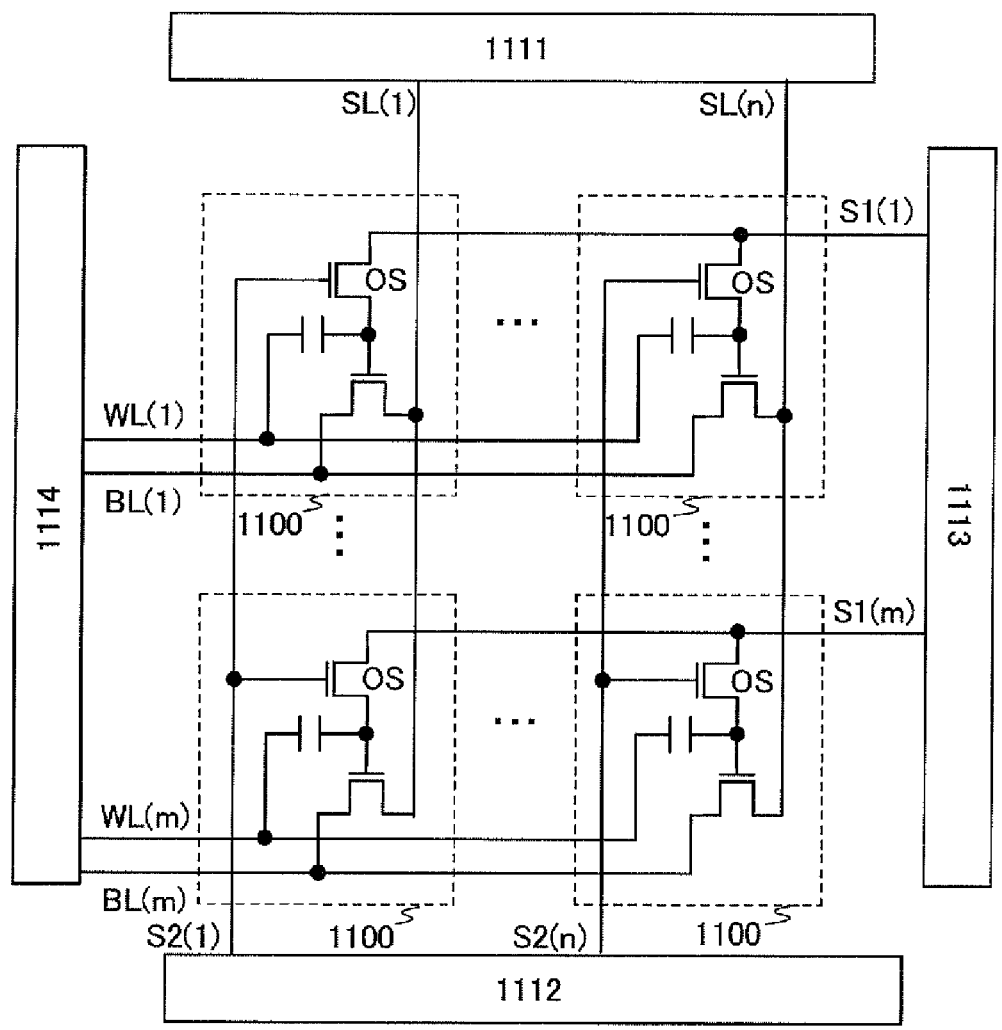
FIG. 11 is a circuit diagram of a semiconductor device.

Next, FIG. 11 illustrates an example of a circuit diagram of a semiconductor device having a storage capacity of m×n bits; the structure of the semiconductor device is partly different from the structures in FIG. 2, FIG. 5, FIG. 6, FIG. 9, and FIG. 10.

The semiconductor device in FIG. 11 includes a memory cell array in which m word lines WL, in bit lines BL, in first signal lines S1, n source lines SL, n second signal lines S2, and a plurality of memory cells 1100 are arranged in matrix of m (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 11, the memory cell 1100(i,j) of the ith row and the jth column (i is an integer of 1 to m, and j is an integer of 1 to is) is connected to the source line SL(j), the bit line BL(i), the word line WL(i), the first signal line S1(i), and the second signal line S2(j).

In FIG. 11, the n source lines SL are connected to the first driver circuit 1111. The is second signal lines S2 are connected to the second driver circuit 1112. The m first signal lines S1 are connected to the third driver circuit 1113. The m bit lines BL and m word lines WL are connected to the fourth driver circuit 1114.

Figure 12:
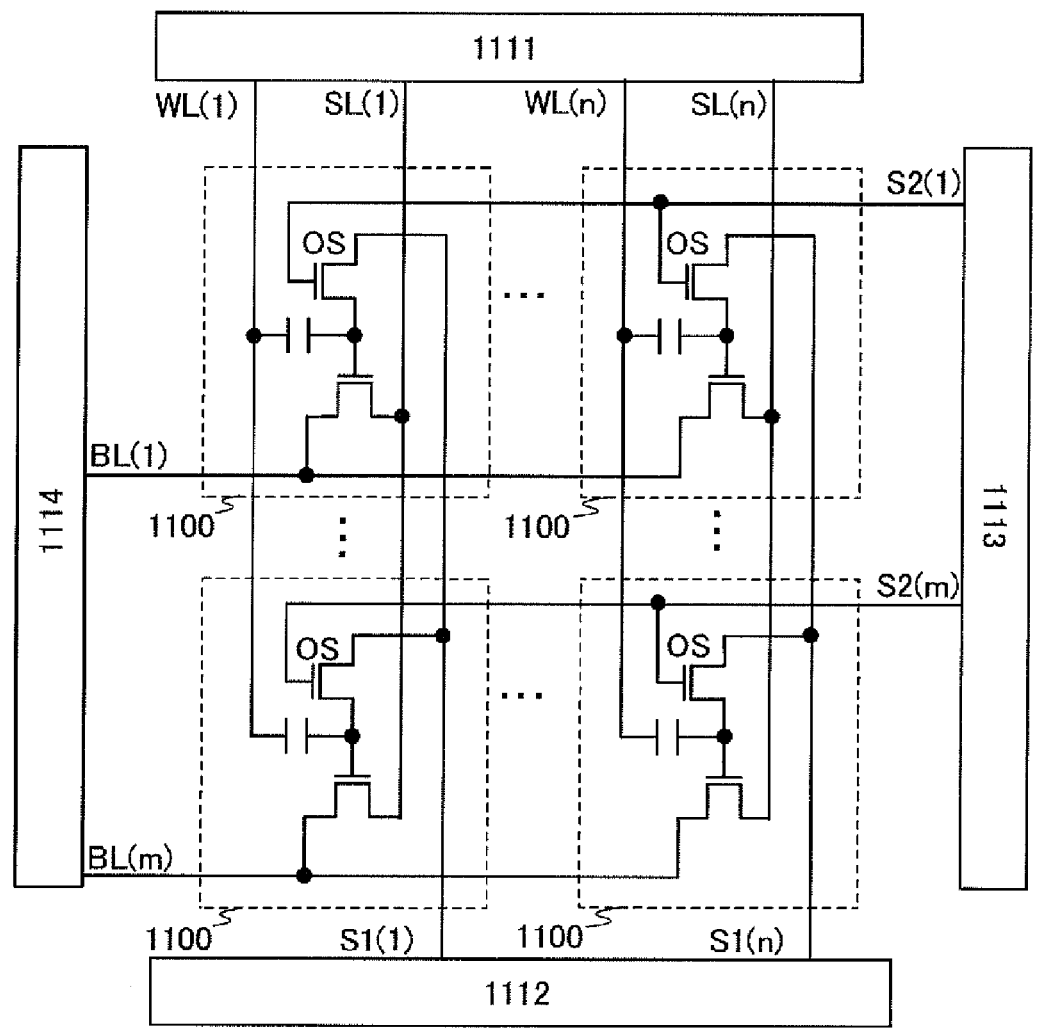
FIG. 12 is a circuit diagram of a semiconductor device.

Next, FIG. 12 illustrates an example of a circuit diagram of a semiconductor device having a storage capacity of m×n bits; the structure of the semiconductor device is partly different from the structures in FIG. 2, FIG. 5, FIG. 6, and FIGS. 9 to 11.

The semiconductor device in FIG. 12 includes a memory cell array in which m bit lines BL, m second signal lines S2, is word lines WL, n source lines SL, is first signal lines S1, and a plurality of memory cells 1100 are arranged in matrix of m (rows) (in the vertical direction)×n (columns) (in the horizontal direction) (m and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 12, the memory cell 1100(i,j) of the ith row and the jth column (i is an integer of 1 to in, and j is an integer of 1 to n) is connected to the source line SL(j), the bit line BL(i), the word line WL(j), the first signal line S1(j), and the second signal line S2(i).

In FIG. 12, the n source lines SL and the n word lines WL are connected to the first driver circuit 1111. The n first signal lines S1 are connected to the second driver circuit 1112. The m second signal lines S2 are connected to the third driver circuit 1113. The m bit lines BL are connected to the fourth driver circuit 1114.

Figure 13:
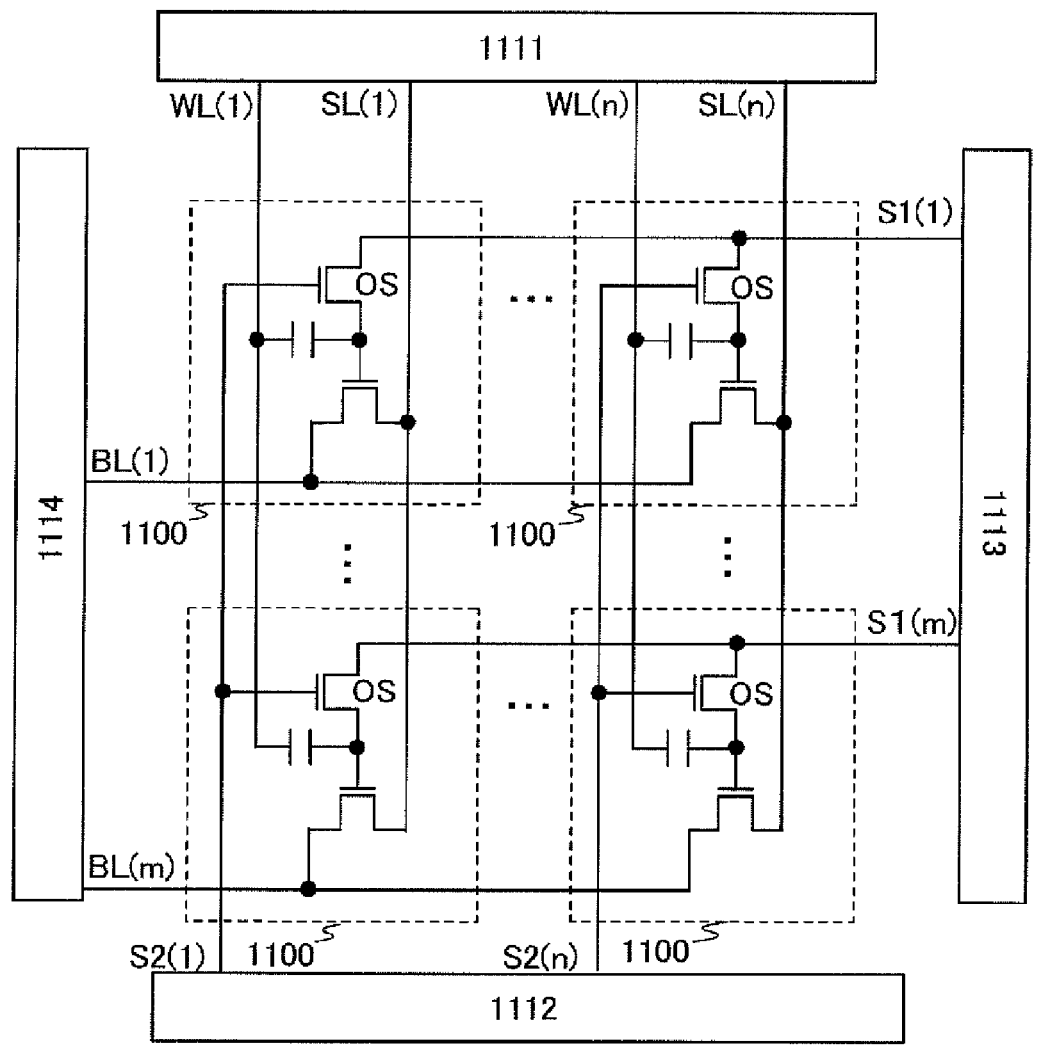
FIG. 13 is a circuit diagram of a semiconductor device.

Next, FIG. 13 illustrates an example of a circuit diagram of a semiconductor device having a storage capacity of m×n bits; the structure of the semiconductor device is partly different from the structures in FIG. 2, FIG. 5, FIG. 6, and FIGS. 9 to 12.

The semiconductor device in FIG. 13 includes a memory cell array in which M bit lines BL, m first signal lines S1, n word lines WL, n source lines SL, n second signal lines S2, and a plurality of memory cells 1100 are arranged in matrix of m (rows) (in the vertical direction)×n (columns) (in the horizontal direction) On and n are natural numbers); and peripheral circuits such as a first driver circuit 1111, a second driver circuit 1112, a third driver circuit 1113, and a fourth driver circuit 1114. Here, the configuration described in Embodiment 1 (the configuration in FIG. 1A1) is applied to the memory cell 1100.

In FIG. 13, the memory cell 1100(i,j) of the ith row and the jth column (i is an integer of 1 to m, and j is an integer of 1 to n) is connected to the source line SL(j), the bit line BL(i), the word line WL(j), the first signal line S1(i), and the second signal line S2(j).

In FIG. 13, the n source lines SL and the n word lines WL are connected to the first driver circuit 1111. The n second signal lines S2 are connected to the second driver circuit 1112. The m first signal lines S1 are connected to the third driver circuit 1113. The m bit lines BL are connected to the fourth driver circuit 1114.

The operation of the semiconductor devices in FIG. 5, FIG. 12, and FIG. 13 is similar to that of the semiconductor device in FIG. 2 (see FIG. 3). Embodiment 2 can be referred to for the details of the operation. In addition, the operation of the semiconductor devices in FIGS. 9 to 11 is similar to that of the semiconductor device in FIG. 6 (see FIG. 7). FIG. 7 can be referred to for the details of the operation.

Since an oxide semiconductor device with extremely small off-state current is used in the semiconductor devices in FIG. 5, FIG. 6, and FIGS. 9 to 13, stored data can be retained for an extremely long time. That is, power consumption can be adequately reduced because refresh operation becomes unnecessary or the frequency of refresh operation can be extremely low. Moreover, stored data can be retained for a long time even when power is not supplied.

The semiconductor devices in FIG. 5, FIG. 6, and FIGS. 9 to 13 do not need high voltage for writing data and have no problem of deterioration of elements. Thus, the semiconductor devices in FIG. 5, FIG. 6, and FIGS. 9 to 13 has no limitation on the number of write cycles, which is a problem in a conventional non-volatile memory, and thus has a significantly increased reliability. Furthermore, since data is written depending on the on/off state of the transistor, high-speed operation can be easily realized. In addition, there is no need of operation for erasing data.

Since a transistor including a material other than an oxide semiconductor can operate at sufficiently high speed, the semiconductor device can perform operation (e.g., data reading operation) at sufficiently high speed by using a combination of the transistor including a material other than an oxide semiconductor and the transistor including an oxide semiconductor. Moreover, favorable circuits for which high-speed operation is required (e.g., a logic circuit and a driver circuit) can be realized with the transistor including a material other than an oxide semiconductor.

A semiconductor device with a novel feature can be realized by including both the transistor including a material other than an oxide semiconductor and the transistor including an oxide semiconductor.

The structures, methods, and the like described in this embodiment can be combined as appropriate with any of the structures, methods, and the like described in the other embodiments.

(Embodiment 4)

In this embodiment, a structure and a manufacturing method of a semiconductor device according to one embodiment of the invention disclosed herein will be described with reference to FIGS. 14A and 14B, FIGS. 15A to 15H, and FIGS. 16A to 16E.

<Cross-sectional Structure and Planar Structure of Semiconductor Device>

Figure 14A:
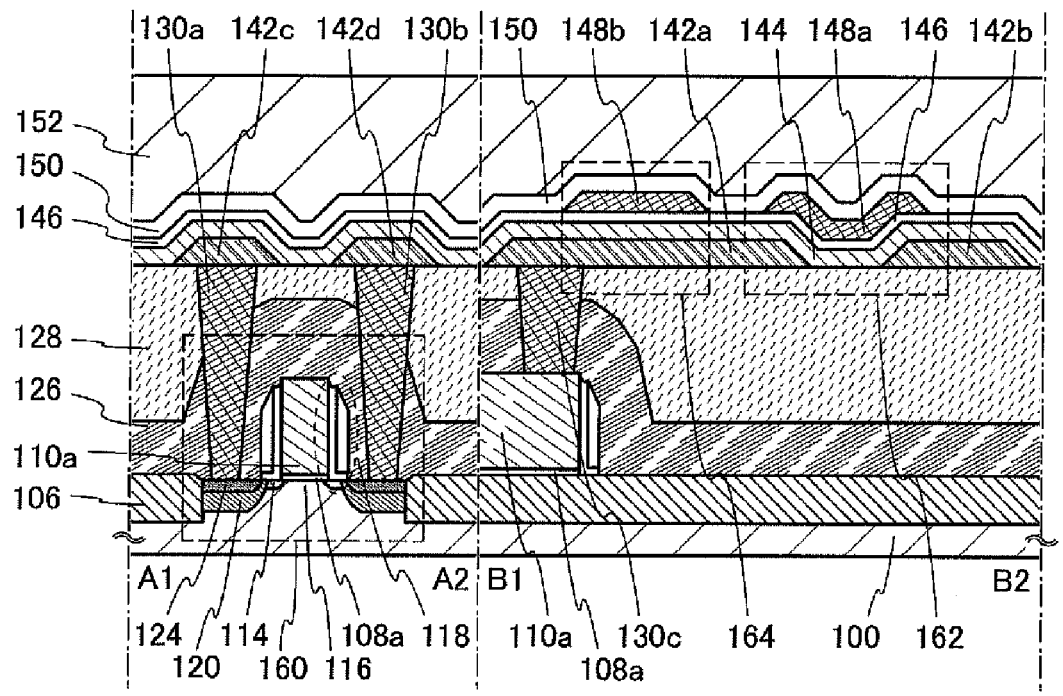
FIG. 14A is a cross-sectional view and FIG. 14B is a plan view of a semiconductor device.
Figure 14B:
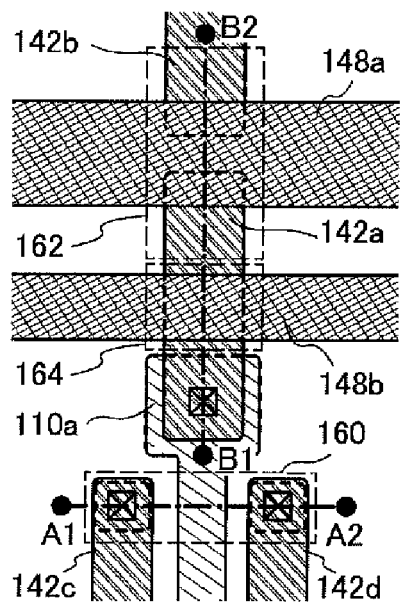

FIGS. 14A and 14B illustrate an example of a structure of a semiconductor device. FIG. 14A illustrates a cross section of the semiconductor device, and FIG. 14B illustrates a plan view of the semiconductor device. Here, FIG. 14A corresponds to the cross section along line A1-A2 and line B1-B2 in FIG. 14B. The semiconductor device illustrated in FIGS. 14A and 14B includes a transistor 160 including a material other than an oxide semiconductor in a lower portion, and a transistor 162 including an oxide semiconductor in an upper portion. A transistor including a material other than an oxide semiconductor can easily operate at high speed. On the other hand, a transistor including an oxide semiconductor can hold electric charge for a long rime owing to its characteristics.

Although the above-described transistors are n-channel transistors here, it is needless to say that p-channel transistors can be used. The technical nature of the invention disclosed herein is to use an oxide semiconductor in the transistor 162 for data retention; therefore, a specific structure of the semiconductor device is not necessary limited to the structure described here.

The transistor 160 in FIGS. 14A and 14B includes a channel formation region 116 provided in a substrate 100 containing a semiconductor material (e.g., silicon), impurity regions 114 and heavily doped regions 120 (these regions can be collectively referred to simply as impurity regions) between which the channel formation region 116 is sandwiched, a gate insulating layer 108a provided over the channel formation region 116, a gate electrode 110a provided over the gate insulating layer 108a, and a source/drain electrode 130a and a source/drain electrode 130b electrically connected to the impurity regions.

Here, sidewall insulating layers 118 are provided on the side surfaces of the gate electrode 110a. The heavily doped regions 120 are placed in regions of the substrate 100 which do not overlap with the sidewall insulating layer 118 when seen from the direction perpendicular to a surface of the substrate 100. Metal compound regions 124 are provided in contact with the heavily doped regions 120. An element isolation insulating layer 106 is provided on the substrate 100 so as to surround the transistor 160. An interlayer insulating layer 126 and an interlayer insulating layer 128 are provided so as to cover the transistor 160. The source/drain electrode 130a and the source/drain electrode 130b are electrically connected to the metal compound regions 124 through openings formed in the interlayer insulating layers 126 and 128. That is, each of the source/drain electrodes 130a and 130b is electrically connected to the heavily doped region 120 and the impurity region 114 through the metal compound region 124. A wiring 142c and a wiring 142d are provided over the source/drain electrode 130a and the source/drain electrode 130b, respectively. An electrode 130c is electrically connected to the gate electrode 110a at an opening formed in the interlayer insulating layers 126 and 128. Note that the sidewall insulating layers 118 are not formed in some cases in order to realize high integration of the transistors 160 or the like.

The transistor 162 in FIGS. 14A and 14B includes a source/drain electrode 142a and a source/drain electrode 142b provided over the interlayer insulating layer 128, an oxide semiconductor layer 144 electrically connected to the source/drain electrodes 142a and 142b, a gate insulating layer 146 covering the source/drain electrodes 142a and 142b and the oxide semiconductor layer 144, and a gate electrode 148a provided over the gate insulating layer 146 so as to overlap with the oxide semiconductor layer 144. The source/drain electrode 142a of the transistor 162 is connected to the gate electrode of the transistor 160 through the electrode 130c.

Here, the oxide semiconductor layer 144 is preferably an oxide semiconductor layer that is purified by sufficiently removing an impurity such as hydrogen therefrom or sufficiently supplying sufficient oxygen thereto. Specifically, for example, the hydrogen concentration in the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less. Note that the concentration of hydrogen in the oxide semiconductor layer 144 is measured by secondary ion mass spectrometry (SIMS). The oxide semiconductor layer 144 which is purified by a sufficient reduction in hydrogen concentration and is reduced in defect level in energy gap due to oxygen deficiency with sufficient supply of oxygen has a carrier concentration of less than $1\times10^{12}$/cm$^3$, preferably less than $1\times10^{11}$/cm$^3$, more preferably less than $1.45\times10^{10}$/cm$^3$. For example, the off-state current (here, per unit channel width (1 μm)) of the transistor 162 at room temperature is 100 zA/μm (1 zA (zeptoampere) is $1\times10^{-21}$ A) or less, preferably 10 zA/μm or less. In this manner, by using an oxide semiconductor which is made to be an intrinsic (i-type) oxide semiconductor or a substantially intrinsic oxide semiconductor, the transistor 162 which has extremely favorable off-state current characteristics can be obtained.

Note that in the transistor 162 in FIGS. 14A and 14B, the oxide semiconductor layer 144 is not processed into an island shape, so that contamination of the oxide semiconductor layer 144 due to etching for processing can be prevented.

A capacitor 164 includes the source/drain electrode 142a, the oxide semiconductor layer 144, the gate insulating layer 146, and an electrode 148b. That is, the source/drain electrode 142a functions as one of electrodes of the capacitor 164, and the electrode 148b functions as the other of the electrodes of the capacitor 164.

When the oxide semiconductor layer 144 and the gate insulating layer 146 are stacked in the capacitor 164 in FIGS. 14A and 14B, it is possible to obtain sufficient insulation properties between the source/drain electrode 142a and the electrode 148b.

Note that in the transistor 162 and the capacitor 164, edges of the source/drain electrodes 142a and 142b are preferably tapered. Here, the taper angle is 30° to 60°, for example. Note that the taper angle is an angle of inclination between a side surface and a bottom surface of the tapered layer (e.g., the source/drain electrode 142a) when the layer is observed in the direction perpendicular to its cross section (a surface perpendicular to the surface of the substrate). When the edges of the source/drain electrodes 142a and 142b are tapered, coverage of the source/drain electrodes 142a and 142b with the oxide semiconductor layer 144 can be improved and disconnection can be prevented.

An interlayer insulating layer 150 is provided over the transistor 162 and the capacitor 164, and an interlayer insulating layer 152 is provided over the interlayer insulating layer 150.

<Example of Method for Manufacturing Semiconductor Device>

Next, an example of a method for manufacturing the semiconductor device will be described. First, a method for manufacturing the transistor 160 in the lower portion will be described below with reference to FIGS. 15A to 15H, and then a method for manufacturing the transistor 162 in the upper portion will be described with reference to FIGS. 16A to 16E.

<Method for Manufacturing Transistor in Lower Portion>

Figure 15A:
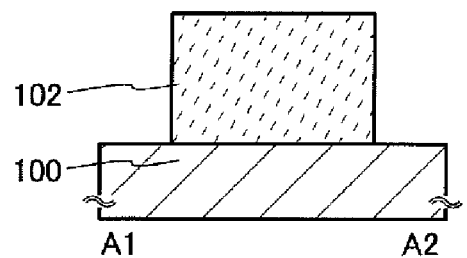
FIGS. 15A to 15H are cross-sectional views illustrating steps for manufacturing a semiconductor device.

First, a substrate 100 containing a semiconductor material is prepared (see FIG. 15A). As the substrate 100 containing a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 containing a semiconductor material is described. Note that the term "SOI substrate" generally means a substrate where a silicon semiconductor layer is provided on an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon layer. Moreover, the SOI substrate can be a substrate in which a semiconductor layer is provided over an insulating substrate such as a glass substrate, with an insulating layer therebetween.

A protective layer 102 serving as a mask for forming an element isolation insulating layer is formed over the substrate 100 (see FIG. 15A). As the protective layer 102, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching using the protective layer 102 as a mask. By this etching, a semiconductor region 104 that is separated from other semiconductor regions is formed (see FIG. 15B). As the etching, dry etching is preferably performed, but wet etching may be performed. An etching gas and an etchant can be selected as appropriate depending on a material of the layer to be etched.

Figure 15B:
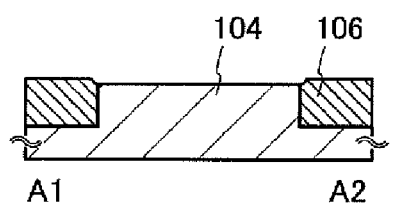

Then, an insulating layer is formed so as to cover the semiconductor region 104 and is selectively removed in a region overlapping with the semiconductor region 104, so that element isolation insulating layers 106 are formed (see FIG. 15B). The insulating layer is formed using silicon oxide, silicon nitride, silicon oxynitride, or the like. As a method for removing the insulating layer, any of etching treatment and polishing treatment such as CMP can be employed. Note that the protective layer 102 is removed after the formation of the semiconductor region 104 or after the formation of the element isolation insulating layers 106.

Next, an insulating layer is formed over the semiconductor region 104, and a layer containing a conductive material is formed over the insulating layer.

The insulating layer serves as a gate insulating layer later. The insulating layer preferably has a single-layer structure or a layered structure including a film containing silicon oxide, silicon oxynitride, silicon nitride, hafnium oxide, aluminum oxide, tantalum oxide, yttrium oxide, hafnium silicate (HfSi$_x$O$_y$ (x>0 and y>0)), hafnium silicate (HfSi$_x$O$_y$ (x>0 and y>0)) to which nitrogen is added, hafnium aluminate (HfAl$_x$O$_y$ (x>0 and y>0)) to which nitrogen is added, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. The thickness of the insulating layer can be 1 nm to 100 nm, for example, and is preferably 10 nm to 50 nm.

The layer containing a conductive material can be formed using a metal material such as aluminum, copper, titanium, tantalum, or tungsten. Alternatively, the layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 15C:
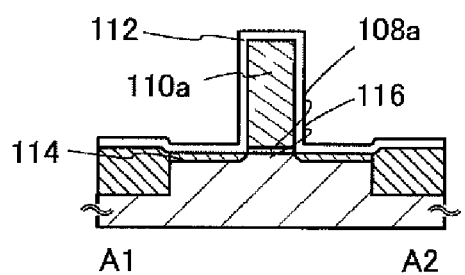

After that, the insulating layer and the layer containing a conductive material are selectively etched, so that a gate insulating layer 108a and a gate electrode 110a are formed (see FIG. 15C).

Next, an insulating layer 112 that covers the gate electrode 110a is formed (see FIG. 15C). Then, phosphorus (P), arsenic (As), or the like is added to the semiconductor region 104, so that impurity regions 114 with a shallow junction depth are formed (see FIG. 15C). Note that phosphorus or arsenic is added here in order to form an n-channel transistor; an impurity element such as boron (B) or aluminum (Al) may be added in the case of forming a p-channel transistor. By the formation of the impurity regions 114, a channel formation region 116 is formed in the semiconductor region 104 below the gate insulating layer 108a (see FIG. 15C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 15D:
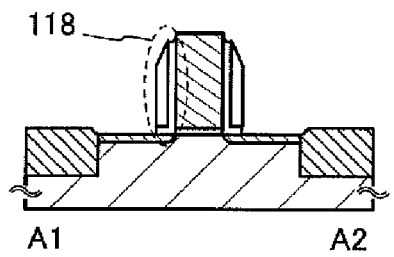
Figure 15E:
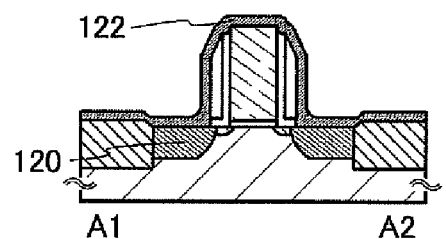
Figure 15F:
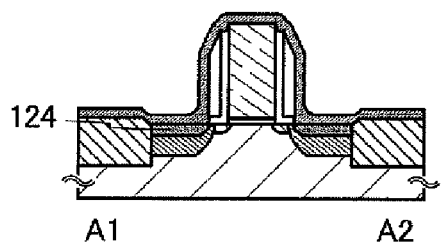

Next, sidewall insulating layers 118 are formed (see FIG. 15D). The sidewall insulating layers 118 can be formed in a self-aligned manner by forming an insulating layer so as to cover the insulating layer 112 and then performing highly anisotropic etching on the insulating layer. At this time, it is preferable to partly etch the insulating layer 112 so that a top surface of the gate electrode 110a and top surfaces of the impurity regions 114 are exposed. Note that the sidewall insulating layers 118 are not formed in some cases in order to realize higher integration of the transistors or the like.

Then, an insulating layer is formed so as to cover the gate electrode 110a, the impurity regions 114, the sidewall insulating layers 118, and the like. Phosphorus (P), arsenic (As), or the like is then added to regions where the insulating layer is in contact with the impurity regions 114, so that heavily doped regions 120 are formed (see FIG. 15E). After that, the insulating layer is removed, and a metal layer 122 is formed so as to cover the gate electrode 110a, the sidewall insulating layers 118, the heavily doped regions 120, and the like (see FIG. 15E). The metal layer 122 can be formed by a variety of film formation methods such as a vacuum evaporation method, a sputtering method, or a spin coating method. The metal layer 122 is preferably formed using a metal material that becomes a low-resistance metal compound by reaction with a semiconductor material included in the semiconductor region 104. Examples of such metal materials are titanium, tantalum, tungsten, nickel, cobalt, and platinum.

Next, heat treatment is performed so that the metal layer 122 reacts with the semiconductor material. Thus, metal compound regions 124 that are in contact with the heavily doped regions 120 are formed (see FIG. 15F). Note that when the gate electrode 110a is formed using polycrystalline silicon or the like, a metal compound region is also formed in a region where the gate electrode 110a is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 15G:
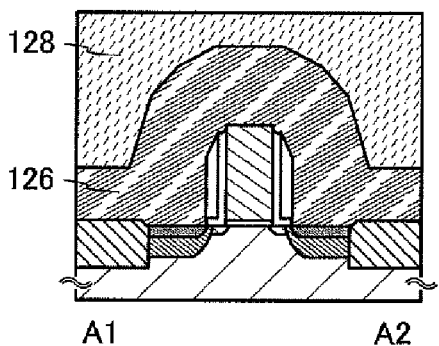

Next, an interlayer insulating layer 126 and an interlayer insulating layer 128 are formed so as to cover the components formed in the above steps (see FIG. 15G). The interlayer insulating layers 126 and 128 can be formed using an inorganic insulating material such as silicon oxide, silicon oxynitride, silicon nitride, hafnium oxide, aluminum oxide, or tantalum oxide. Moreover, the interlayer insulating layers 126 and 128 can be formed using an organic insulating material such as polyimide or acrylic. Note that a layered structure of the interlayer insulating layers 126 and 128 is used in this embodiment; however, one embodiment of the invention disclosed herein is not limited to this example. A single-layer structure or a layered structure including three or more layers may be employed. After the formation of the interlayer insulating layer 128, a surface of the interlayer insulating layer 128 is preferably planarized with CMP, etching, or the like.

Figure 15H:
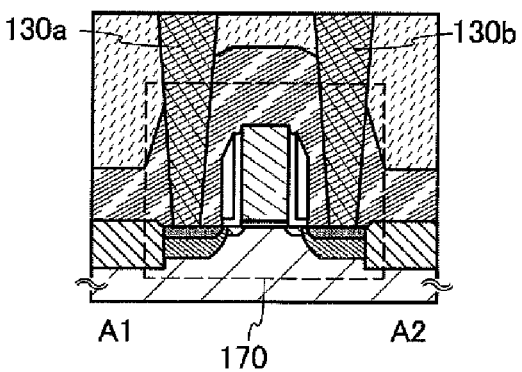

After that, openings that reach the metal compound regions 124 are formed in the interlayer insulating layers, and a source/drain electrode 130a and a source/drain electrode 130b are formed in the openings (see FIG. 15H). The source/drain electrodes 130a and 130b can be formed in the following manner, for example: a conductive layer is formed in a region including the openings by a PVD method, a CVD method, or the like and then part of the conductive layer is removed by etching, CMP, or the like.

Specifically, it is possible to employ a method, for example, in which a thin titanium film is formed in a region including the openings by a PVD method and a thin titanium nitride film is formed by a CVD method, and then a tungsten film is formed so as to be embedded in the openings. Here, the titanium film formed by a PVD method has a function of reducing an oxide film (e.g., a natural oxide film) formed on a surface where the titanium film is formed, to decrease the contact resistance with the lower electrodes (here, the metal compound regions 124). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source/drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. The surface including the source/drain electrodes 130a and 130b is planarized in such a manner, so that an electrode, a wiring, an insulating layer, a semiconductor layer, and the like can be favorably formed in later steps.

Note that only the source/drain electrodes 130a and 130b which are in contact with the metal compound regions 124 are shown here; however, an electrode that is in contact with the gate electrode 110a and the like can be formed in this step. There is no particular limitation on a material used for the source/drain electrodes 130a and 130b, and a variety of conductive materials can be used. For example, a conductive material such as molybdenum, titanium, chromium, tantalum, tungsten, aluminum, copper, neodymium, or scandium can be used. Moreover, in consideration of heat treatment to be performed later, the source/drain electrodes 130a and 130b are preferably formed using a material with heat resistance high enough to withstand the heat treatment.

Through the above process, the transistor 160 that uses the substrate 100 containing a semiconductor material is formed (see FIG. 15H). The transistor 160 including a material other than an oxide semiconductor can easily operate at high speed.

Note that an electrode, a wiring, an insulating layer, or the like may be further formed after the above process. When the wirings have a multi-layer structure of a layered structure including an interlayer insulating layer and a conductive layer, a highly integrated semiconductor device can be provided.

<Method for Manufacturing Transistor in Upper Portion>

Next, a process for manufacturing the transistor 162 over the interlayer insulating layer 128 will be described with reference to FIGS. 16A to 16E. Note that FIGS. 16A to 16E illustrate steps for manufacturing electrodes, the transistor 162, and the like over the interlayer insulating layer 128; therefore, the transistor 160 and the like placed below the transistor 162 are omitted.

Figure 16A:
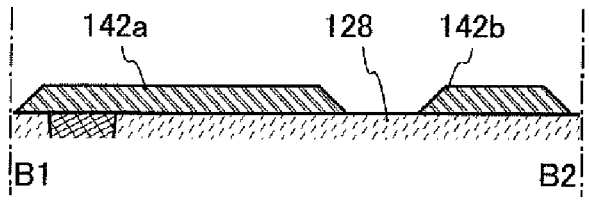
FIGS. 16A to 16E are cross-sectional views illustrating steps for manufacturing a semiconductor device.

First, a conductive layer is formed over the interlayer insulating layer 128 and selectively etched, so that a source/drain electrode 142a and a source/drain electrode 142b are formed (see FIG. 16A).

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. One or a combination of manganese, magnesium, zirconium, and/or beryllium may be used. Alternatively, aluminum combined with one or more of elements selected from titanium, tantalum, tungsten, molybdenum, chromium, neodymium, and scandium may be used.

The conductive layer can have a single-layer structure or a layered structure including two or more layers. For example, the conductive layer can have a single-layer structure of a titanium film or a titanium nitride film; a single-layer structure of an aluminum film containing silicon; a two-layer structure in which a titanium film is stacked over an aluminum film; a two-layer structure in which a titanium film is stacked over a titanium nitride film; or a three-layer structure in which a titanium film, an aluminum film, and a titanium film are stacked in this order. When the conductive layer has a single-layer structure of a titanium film or a titanium nitride film, there is an advantage in that the conductive layer is easily processed into the tapered source/drain electrodes 142a and 142b.

Alternatively, the conductive layer may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, sometimes referred to as ITO), an alloy of indium oxide and zinc oxide ($In_2O_3$—ZnO), or any of these metal oxide materials containing silicon or silicon oxide can be used.

The conductive layer is preferably etched so that edges of the source/drain electrodes 142a and 142b to be formed are tapered. Here, the taper angle is preferably 30° to 60°, for example. When etching is performed so that the edges of the source/drain electrodes 142a and 142b are tapered, coverage of the source/drain electrodes 142a and 142b with a gate insulating layer 146 formed later can be improved and disconnection can be prevented.

The channel length (L) of a transistor is determined by a distance between a lower edge portion of the source/drain electrode 142a and a lower edge portion of the source/drain electrode 142b. When light exposure is performed to form a mask used for forming a transistor with a channel length (L) of less than 25 nm, it is preferable to use extreme ultraviolet light with a short wavelength of several nanometers to several tens of nanometers. The resolution of light exposure with extreme ultraviolet light is high and the depth of focus is large. Therefore, the channel length (L) of the transistor to be formed later can range from 10 nm to 1000 nm (1 µm), and the operating speed of a circuit can be increased. Furthermore, power consumption of the semiconductor device can be decreased by reduction in size of transistors.

An insulating layer functioning as a base may be provided over the interlayer insulating layer 128. The insulating layer can be formed by a PVD method, a CVD method, or the like.

An insulating layer may be formed over the source/drain electrodes 142a and 142b. By providing the insulating layer, parasitic capacitance between a gate electrode to be formed later and the source/drain electrodes 142a and 142b can be reduced.

Figure 16B:
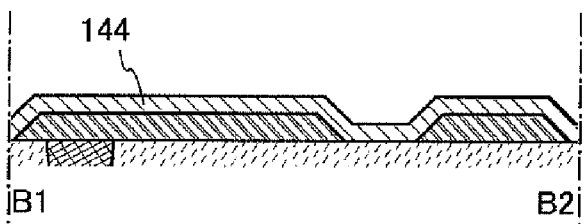

Next, an oxide semiconductor layer 144 is formed so as to cover the source/drain electrodes 142a and 142b (see FIG. 16B).

The oxide semiconductor layer 144 can be formed using an oxide semiconductor such as an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, a Zn—O-based oxide semiconductor, or the like.

In particular, an In—Ga—Zn—O-based oxide semiconductor material has sufficiently high resistance when no electric field is applied and can realize a sufficiently small off-state current, and has high field-effect mobility; therefore, the In—Ga—Zn—O-based oxide semiconductor material is suitable for a semiconductor material used in a semiconductor device.

A typical example of the In—Ga—Zn—O-based oxide semiconductor material is a material represented by $InGaO_3(ZnO)_m$ (m>0). Moreover, there is an oxide semiconductor material expressed by $InMO_3(ZnO)_m$ (m>0), using M instead of Ga. Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, or Ga and Co. Note that the above-described compositions are derived from the crystal structures that the oxide semiconductor material can have and are only examples.

As a target for forming the oxide semiconductor layer 144 by a sputtering method, it is preferable to use a target that can be represented by a composition ratio of In:Ga:Zn=1:x:y (x is 0 or larger and y is 0.5 to 5). That is, a target with a composition ratio of $In_2O_3$:$Ga_2O_3$:ZnO=1:1:2 [molar ratio]) can be used, for example. Moreover, it is possible to use a target with a composition ratio of $In_2O_3$:$Ga_2O_3$:ZnO=1:1:1 [molar ratio]), a target with a composition ratio of $In_2O_3$:$Ga_2O_3$:ZnO=1:1:4 [molar ratio]), or a target with a composition ratio of $In_2O_3$:$Ga_2O_3$:ZnO=1:0:2 [molar ratio]).

In this embodiment, the oxide semiconductor layer 144 with an amorphous structure can be formed by a sputtering method with the use of an In—Ga—Zn—O-based metal oxide target.

The relative density of the metal oxide in the metal oxide target is 80% or higher, preferably 95% or higher, further preferably 99.9% or higher. The use of a metal oxide target with high relative density makes it possible to form the oxide semiconductor layer 144 with a dense structure.

An atmosphere for forming the oxide semiconductor layer 144 is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or hydride is removed so that the impurity concentration is reduced to 1 ppm or lower (preferably 10 ppb or lower).

When the oxide semiconductor layer 144 is formed, an object to be treated is held in a treatment chamber that is maintained at reduced pressure, for example, and the object is heated so that the temperature of the object is 100° C. or higher and lower than 550° C., preferably 200° C. to 400° C. Alternatively, the temperature of the object at the time of forming the oxide semiconductor layer 144 may be room temperature. Then, while moisture in the chamber is removed, a sputtering gas from which hydrogen, water, and the like are removed is introduced, and the oxide semiconductor layer 144 is formed using the above-described target. When the oxide semiconductor layer 144 is formed while the object is heated, impurities contained in the oxide semiconductor layer 144 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Since hydrogen, water, or the like can be removed from the treatment chamber evacuated with a cryopump, the concentration of impurities in the oxide semiconductor layer 144 can be reduced.

The conditions for forming the oxide semiconductor layer 144 can be set as follows, for example: the distance between the object and the target is 170 mm, the pressure is 0.4 Pa, the direct current (DC) power is 0.5 kW, and the atmosphere is an oxygen atmosphere (the proportion of oxygen is 100%), an argon atmosphere (the proportion of argon is 100%), or a mixed atmosphere of oxygen and argon. Note that a pulse direct-current (DC) power supply is preferably used because dust (e.g., powdery substances produced at the time of deposition) can be reduced and the film thickness can be uniform. The thickness of the oxide semiconductor layer 144 is 1 nm to 50 nm, preferably 1 nm to 30 nm, more preferably 1 nm to 10 nm. The use of the oxide semiconductor layer 144 with such a thickness can suppress short-channel effects due to reduction in size of the transistor. Note that the appropriate thickness of the oxide semiconductor layer 144 differs depending on the oxide semiconductor material to be used, the intended use of the semiconductor device, or the like; therefore, the thickness can be determined as appropriate in accordance with the material, the intended use, or the like.

Note that before the oxide semiconductor layer 144 is formed by a sputtering method, reverse sputtering in which plasma is generated with an argon gas introduced is preferably performed to remove a material attached to the surface where the oxide semiconductor layer 144 is to be formed (e.g., a surface of the interlayer insulating layer 128). Here, the reverse sputtering is a method by which ions collide with a surface to be processed so that the surface is modified, in contrast to normal sputtering by which ions collide with a sputtering target. An example of a method for making ions strike a surface is a method in which high-frequency voltage is applied on a surface to be processed under an argon atmosphere and plasma is generated in the vicinity of the object to be treated. Note that an atmosphere of nitrogen, helium, oxygen, or the like may be used instead of an argon atmosphere.

After that, heat treatment (first heat treatment) is preferably performed on the oxide semiconductor layer 144. Excessive hydrogen (including water and a hydroxyl group) in the oxide semiconductor layer 144 can be removed by this first heat treatment, so that the structure of the oxide semiconductor layer can be ordered and defect levels in the energy gap can be reduced. The temperature of the first heat treatment is, for example, 300° C. or higher and lower than 550° C., or 400° C. to 500° C.

The heat treatment can be performed, for example, at 450° C. for one hour in a nitrogen atmosphere after the object to be treated is introduced into an electric furnace including a resistance heating element or the like. During the heat treatment, the oxide semiconductor layer 144 is not exposed to the atmosphere to prevent the entry of water and hydrogen.

The heat treatment apparatus is not limited to an electric furnace; the heat treatment apparatus can be an apparatus that heats an object using thermal conduction or thermal radiation given by a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be treated by heat treatment, for example, nitrogen or a rare gas such as argon is used.

For example, as the first heat treatment, GRTA treatment may be performed as follows: the object to be treated is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or more, preferably 7N (99.99999%) or more (i.e., the impurity concentration is 1 ppm or less, preferably 0.1 ppm or less).

In any case, when impurities are reduced by the first heat treatment to form the oxide semiconductor layer 144 that is an i-type (intrinsic) semiconductor or is extremely close to an i-type semiconductor, a transistor with extremely excellent characteristics can be realized.

Note that the above heat treatment (the first heat treatment) has an effect of removing hydrogen, water, and the like and thus can be referred to as dehydration treatment, dehydrogenation treatment, or the like. The dehydration treatment or the dehydrogenation treatment can be performed, for example, after the formation of the oxide semiconductor layer, after the formation of the gate insulating layer, or after the formation of the gate electrode. Such dehydration treatment or dehydrogenation treatment may be conducted once or plural times.

Figure 16C:
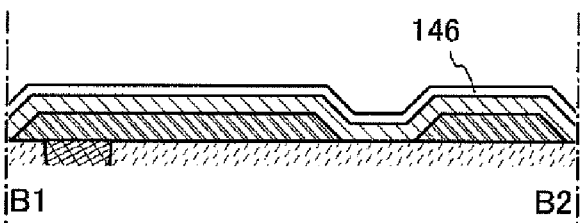

Next, a gate insulating layer 146 that is in contact with the oxide semiconductor layer 144 is formed (see FIG. 16C). The gate insulating layer 146 can be formed by a CVD method, a sputtering method, or the like. The gate insulating layer 146 is preferably formed to contain silicon oxide, silicon nitride, silicon oxynitride, aluminum oxide, tantalum oxide, hafnium oxide, yttrium oxide, hafnium silicate (HfSi$_x$O$_y$, (x>0 and y>0)), hafnium silicate (HfSi$_x$O$_y$, (x>0 and y>0)) to which nitrogen is added, hafnium aluminate (HfAl$_x$O$_y$, (x>0 and y>0)) to which nitrogen is added, or the like. The gate insulating layer 146 can have a single-layer structure or a layered structure. There is no particular limitation on the thickness of the gate insulating layer 146; in the case where the size of the semiconductor device is reduced, the gate insulating layer 146 is preferably thin so that the transistor operates normally. For example, in the case of using silicon oxide, the thickness of the gate insulating layer 146 can be 1 nm to 100 nm, preferably 10 nm to 50 nm.

When the gate insulating layer is thin as described above, gate leakage due to tunneling effect or the like becomes a problem. In order to solve the problem of gate leakage, the gate insulating layer 146 is preferably formed using a high dielectric constant (high-k) material such as hafnium oxide, tantalum oxide, yttrium oxide, hafnium silicate (HfSi$_x$O$_y$ (x>0 and y>0)), hafnium silicate (HfSi$_3$O$_y$ (x>0 and y>0)) to which nitrogen is added, or hafnium aluminate (HfAl$_x$O$_y$ (x>0 and y>0)) to which nitrogen is added. When a high-k material is used for the gate insulating layer 146, the thickness of the gate insulating layer 146 can be increased in order to suppress gate leakage and ensure electrical characteristics. Furthermore, the gate insulating layer 146 may have a layered structure of a film containing a high-k material and a film containing any of silicon oxide, silicon nitride, silicon oxynitride, silicon nitride oxide, and aluminum oxide.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. The second heat treatment can reduce variations in electric characteristics of transistors. In the case where the gate insulating layer 146 contains oxygen, oxygen is supplied to the oxide semiconductor layer 144 to compensate oxygen deficiency of the oxide semiconductor layer 144, so that the oxide semiconductor layer can be an i-type (intrinsic) oxide semiconductor layer or extremely closed to an intrinsic oxide semiconductor layer.

Note that in this embodiment, the second heat treatment is performed after the gate insulating layer 146 is formed; there is no particular limitation on the timing of the second heat treatment. For example, the second heat treatment may be performed after the gate electrode is formed. Moreover, the second heat treatment may be performed subsequent to the first heat treatment, the first treatment may also serve as the second heat treatment, or the second treatment may also serve as the first heat treatment.

Figure 16D:
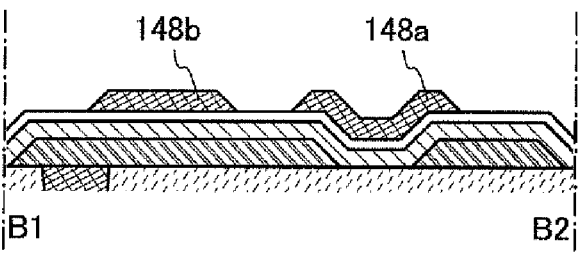

Next, over the gate insulating layer 146, a gate electrode 148a is formed in a region overlapping with the oxide semiconductor layer 144 and an electrode 148b is formed in a region overlapping with the source/drain electrode 142a (see FIG. 16D). The gate electrode 148a and the electrode 148b can be formed in such a manner that a conductive layer is formed over the gate insulating layer 146 and then selectively etched. The conductive layer to be the gate electrode 148a and the electrode 148b can be formed by a PVD method such as a sputtering method or a CVD method such as a plasma CVD method. The details are similar to those of the source/drain electrode 142a and the like and thus can refer to the description of the source/drain electrode 142a and the like.

Figure 16E:
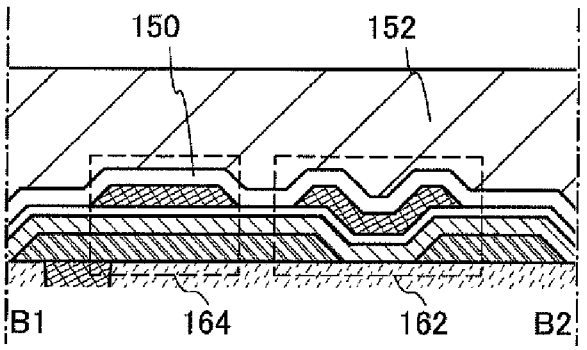

Then, an interlayer insulating layer 150 and an interlayer insulating layer 152 are formed over the gate insulating layer 146, the gate electrode 148a, and the electrode 148b (see FIG. 16E). The interlayer insulating layers 150 and 152 can be formed by a PVD method, a CVD method, or the like. The interlayer insulating layers 150 and 152 can be formed using an inorganic insulating material such as silicon oxide, silicon oxynitride, silicon nitride, hafnium oxide, aluminum oxide, or tantalum oxide. Note that although a layered structure of the interlayer insulating layers 150 and 152 is used in this embodiment, one embodiment of the invention disclosed herein is not limited to this example. A single-layer structure or a layered structure including three or more layers may be employed. Moreover, it is possible to employ a structure where the interlayer insulating layers 150 and 152 are not provided.

Note that the interlayer insulating layer 152 is preferably formed so as to have a planar surface because an electrode, a wiring, or the like can be favorably formed over the interlayer insulating layer 152 even in the case where the semiconductor device is reduced in size, for example. The interlayer insulating layer 152 can be planarized using a method such as CMP (chemical mechanical polishing).

Through the above process, the transistor 162 including the purified oxide semiconductor layer 144 is completed (see FIG. 16E). Moreover, the capacitor 164 is completed.

The transistor 162 illustrated in FIG. 16E includes the oxide semiconductor layer 144, the source/drain electrodes 142a and 142b electrically connected to the oxide semiconductor layer 144, the gate insulating layer 146 covering the oxide semiconductor layer 144 and the source/drain electrodes 142a and 142b, and the gate electrode 148a over the gate insulating layer 146. The capacitor 164 includes the source/drain electrode 142a, the oxide semiconductor layer 144, the gate insulating layer 146 covering the source/drain electrode 142a, and the electrode 148b over the gate insulating layer 146.

Since the oxide semiconductor layer 144 is purified, the hydrogen concentration of the transistor 162 in this embodiment is $5\times10^{19}$ atoms/cm$^3$ or less, preferably $5\times10^{18}$ atoms/cm$^3$ or less, more preferably $5\times10^{17}$ atoms/cm$^3$ or less. The carrier density of the oxide semiconductor layer 144 (e.g., less than $1\times10^{12}$/cm$^3$, preferably less than $1.45\times10^{10}$/cm$^3$) is sufficiently lower than that of a general silicon wafer (approximately $1\times10^{14}$/cm$^3$). For that reason, the off-state current is sufficiently small. For example, the off-state current (per unit channel width (1 μm), here) of the transistor 162 at room temperature is 100 zA/μm (1 zA (zeptoampere) is $1\times10^{-21}$ A) or less, preferably 10 zA/μm or less.

By using the purified and intrinsic oxide semiconductor layer 144, the off-state current of the transistor can be sufficiently reduced. With the use of such a transistor, a semiconductor device in which stored data can be retained for an extremely long time can be provided.

The structures, methods, and the like described in this embodiment can be combined as appropriate with any of the structures, methods, and the like described in the other embodiments.

(Embodiment 5)

In this embodiment, a structure and a manufacturing method of a semiconductor device according to one embodiment of the invention disclosed herein, which are different from those of Embodiment 4, will be described with reference to FIGS. 17A and 17B and FIGS. 18A to 18D.

<Cross-sectional Structure and Planar Structure of Semiconductor Device>

Figure 17A:
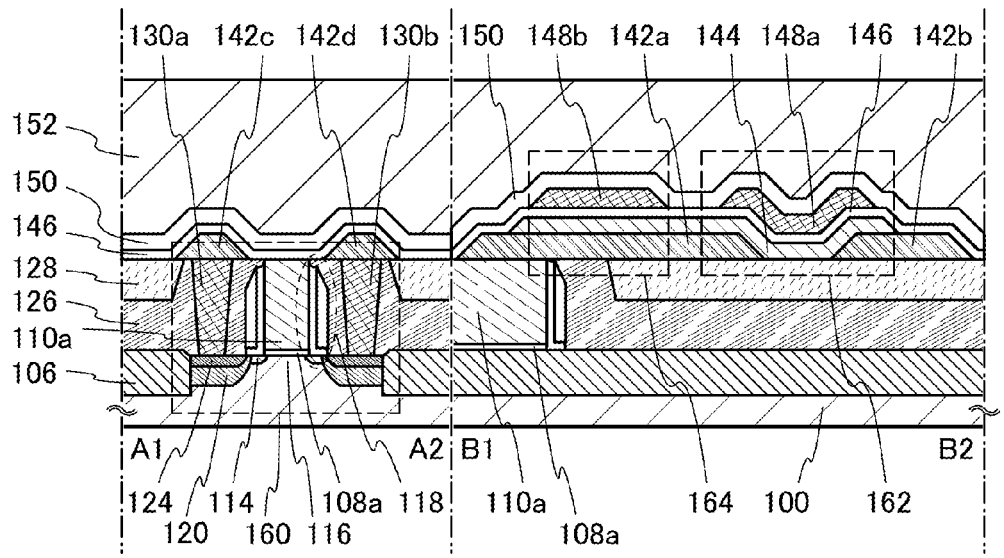
FIG. 17A is a cross-sectional view and FIG. 17B is a plan view of a semiconductor device.
Figure 17B:
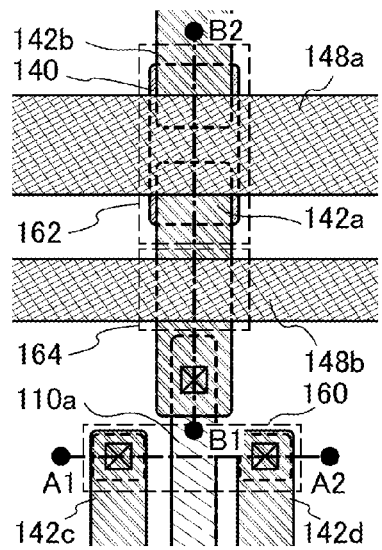

FIGS. 17A and 17B illustrate an example of a structure of a semiconductor device. FIG. 17A illustrates a cross section of the semiconductor device, and FIG. 17B illustrates a plan view of the semiconductor device. Here, FIG. 17A corresponds to the cross section along line A1-A2 and line B1-B2 in FIG. 17B. The semiconductor device illustrated in FIGS. 17A and 17B includes a transistor 160 including a material other than an oxide semiconductor in a lower portion, and a transistor 162 including an oxide semiconductor in an upper portion. A transistor including a material other than an oxide semiconductor can easily operate at high speed. A transistor including an oxide semiconductor can hold electric charge for a long time owing to its characteristics.

Although the above-described transistors are n-channel transistors here, it is needless to say that p-channel transistors can be used. The technical nature of the invention disclosed herein is to use an oxide semiconductor in the transistor 162 for data retention; therefore, a specific structure of the semiconductor device is not necessary limited to the structure described here.

The transistor 160 in FIGS. 17A and 17B includes a channel formation region 116 provided in a substrate 100 containing a semiconductor material (e.g., silicon), impurity regions 114 and heavily doped regions 120 (these regions can be collectively referred to simply as impurity regions) between which the channel formation region 116 is sandwiched, a gate insulating layer 108a provided over the channel formation region 116, a gate electrode 110a provided over the gate insulating layer 108a, and a source/drain electrode 130a and a source/drain electrode 130b electrically connected to the impurity regions. A wiring 142c and a wiring 142d are provided over the source/drain electrode 130a and the source/drain electrode 130b, respectively. For the semiconductor material, silicon, germanium, silicon germanium, silicon carbide, or gallium arsenide can be used, for example, and a single crystal semiconductor is preferably used.

Here, sidewall insulating layers 118 are provided on the side surfaces of the gate electrode 110a. The heavily doped regions 120 are placed in regions of the substrate 100 which do not overlap with the sidewall insulating layer 118 when seen from the direction perpendicular to a surface of the substrate 100. Metal compound regions 124 are provided in contact with the heavily doped regions 120. An element isolation insulating layer 106 is provided on the substrate 100 so as to surround the transistor 160. An interlayer insulating layer 126 and an interlayer insulating layer 128 are provided so as to cover the transistor 160. The source/drain electrode 130a and the source/drain electrode 130b are electrically connected to the metal compound regions 124 through openings formed in the interlayer insulating layer 126. That is, each of the source/drain electrodes 130a and 130b is electrically connected to the heavily doped region 120 and the impurity region 114 through the metal compound region 124. Note that the sidewall insulating layers 118 are not formed in some cases in order to realize high integration of the transistors 160 or the like.

The transistor 162 in FIGS. 17A and 17B includes a source/drain electrode 142a and a source/drain electrode 142b provided over the interlayer insulating layer 128, an island-shaped oxide semiconductor layer 144 electrically connected to the source/drain electrodes 142a and 142b, a gate insulating layer 146 covering the source/drain electrodes 142a and 142b and the island-shaped oxide semiconductor layer 144, and a gate electrode 148a provided over the gate insulating layer 146 so as to overlap with the island-shaped oxide semiconductor layer 144.

Here, the transistor 160 in the lower portion and the transistor 162 in the upper portion are electrically connected to each other because the source/drain electrode 142a is formed directly on the gate electrode 110a. In other words, the semiconductor device in this embodiment has a structure in which components above the top surface of the gate electrode 110a are removed from the semiconductor device in Embodiment 4 and the upper transistor 162 is formed over the lower transistor 160.

Here, the oxide semiconductor layer 144 is preferably an oxide semiconductor layer that is purified by sufficiently removing an impurity such as hydrogen therefrom or sufficiently supplying sufficient oxygen thereto. Specifically, for example, the hydrogen concentration in the oxide semiconductor layer 144 is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Note that the concentration of hydrogen in the oxide semiconductor layer 144 is measured by secondary ion mass spectrometry (SIMS). The oxide semiconductor layer 144 which is purified by a sufficient reduction in hydrogen concentration and is reduced in defect level in energy gap due to oxygen deficiency with sufficient supply of oxygen has a carrier concentration of less than $1 \times 10^{12}$/cm$^3$, preferably less than $1 \times 10^{11}$/cm$^3$, more preferably less than $1.45 \times 10^{10}$/cm$^3$. For example, the off-state current (here, per unit channel width (1 μm)) of the transistor 162 at room temperature is 100 zA/μm (1 zA (zeptoampere) is $1 \times 10^{-21}$ A) or less, preferably 10 zA/μm or less. In this manner, by using an oxide semiconductor which is made to be an intrinsic (i-type) oxide semiconductor or a substantially intrinsic oxide semiconductor, the transistor 162 which has extremely favorable off-state current characteristics can be obtained.

A capacitor 164 includes the source/drain electrode 142a, the oxide semiconductor layer 144, the gate insulating layer 146, and an electrode 148b. That is, the source/drain electrode 142a functions as one of electrodes of the capacitor 164, and the electrode 148b functions as the other of the electrodes of the capacitor 164.

When the oxide semiconductor layer 144 and the gate insulating layer 146 are stacked in the capacitor 164 in FIGS. 17A and 17B, it is possible to obtain sufficient insulation properties between the source/drain electrode 142a and the electrode 148b.

Note that in the transistor 162 and the capacitor 164, edges of the source/drain electrodes 142a and 142b are preferably tapered. Here, the taper angle is 30° to 60°, for example. Note that the taper angle is an angle of inclination between a side surface and a bottom surface of the tapered layer (e.g., the source/drain electrode 142a) when the layer is observed in the direction perpendicular to its cross section (a surface perpendicular to the surface of the substrate). When the edges of the source/drain electrodes 142a and 142b are tapered, coverage of the source/drain electrodes 142a and 142b with the oxide semiconductor layer 144 can be improved and disconnection can be prevented.

An interlayer insulating layer 150 is provided over the transistor 162 and the capacitor 164, and an interlayer insulating layer 152 is provided over the interlayer insulating layer 150.

<Example of Method for Manufacturing Semiconductor Device>

Next, an example of a method for manufacturing the semiconductor device will be described. Steps performed after the formation of the lower transistor 160 and a method for manufacturing the upper transistor 162 will be described below with reference to FIGS. 18A to 18D. The transistor 160 in the lower portion can be formed by a method similar to the method described in Embodiment 4, and the description of Embodiment 4 can be referred to for the details.

Figure 18A:
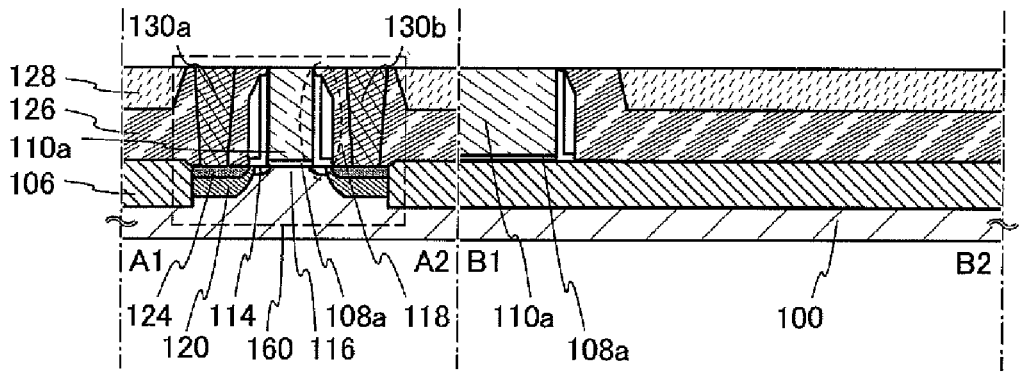
FIGS. 18A to 18D are cross-sectional views illustrating steps for manufacturing a semiconductor device.

First, the transistor 160 in the lower portion is formed by the method described in Embodiment 4, and then, components above the top surface of the gate electrode 110a of the transistor 160 are removed (see FIG. 18A). The aforementioned components of the transistor 160 are removed by performing polishing treatment (CMP) on the lower transistor 160 until the top surface of the gate electrode 110a is exposed. Thus, parts of the interlayer insulating layers 126 and 128 and the source/drain electrodes 130a and 130b which are placed above the gate electrode 110a are removed. At this time, when the surface including the interlayer insulating layers 126 and 128 and the source/drain electrodes 130a and 130b is planarized, an electrode, a wiring, an insulating layer, a semiconductor layer, and the like can be favorably formed in later steps. The electrode 130c described in Embodiment 4 does not need to be formed because it is removed completely by this CMP.

By performing CMP so that the top surface of the gate electrode 110a is exposed in such a manner, the gate electrode 110a and the source/drain electrode 142a can be directly connected to each other; thus, the transistor 160 and the transistor 162 can be electrically connected to each other easily.

Figure 18B:
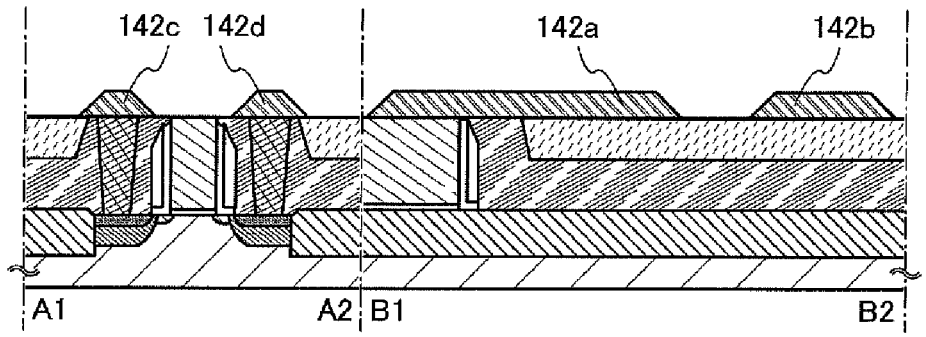

Next, a conductive layer is formed over the interlayer insulating layers 126 and 128 and selectively etched, so that a source/drain electrode 142a, a source/drain electrode 142b, a wiring 142c, and a wiring 142d are formed (see FIG. 18B). Here, the source/drain electrode 142a is directly connected to the gate electrode 110a; the wiring 142c, the source/drain electrode 130a; and the wiring 142d, the source/drain electrode 130b.

For the conductive layer for forming the source/drain electrodes 142a and 142b and the wirings 142c and 142d, a material similar to that described in Embodiment 4 can be used, and the description of Embodiment 4 can be referred to for the details. Moreover, the conductive layer can be etched in a manner similar to the method described in Embodiment 4, and the description of Embodiment 4 can be referred to for the details.

As described in Embodiment 4, an insulating layer may be formed over the source/drain electrodes 142a and 142b. By providing the insulating layer, parasitic capacitance between a gate electrode to be formed later and the source/drain electrodes 142a and 142b can be reduced.

Figure 18C:
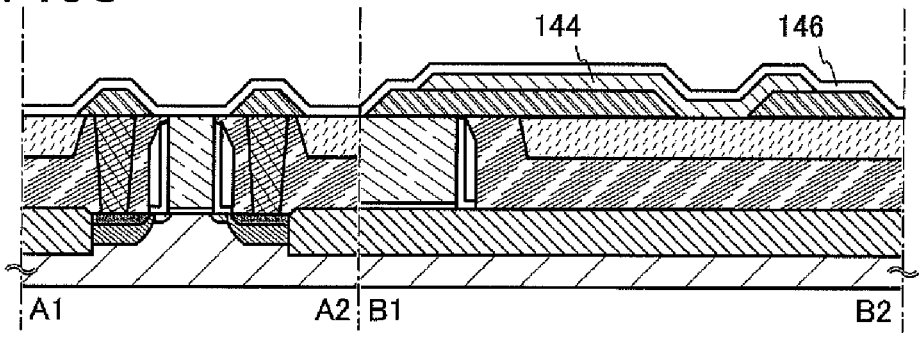

Next, an oxide semiconductor layer is formed so as to cover the source/drain electrodes 142a and 142b and the wirings 142c and 142d and is selectively etched, so that an oxide semiconductor layer 144 is formed in contact with the source/drain electrodes 142a and 142b (see FIG. 18C).

The oxide semiconductor layer can be formed using a material and a method similar to those in Embodiment 4. Therefore, Embodiment 4 can be referred to for the material and the film formation method of the oxide semiconductor layer.

The oxide semiconductor layer thus formed is processed into an island shape by etching using a mask or the like, so that the island-shaped oxide semiconductor layer 144 is formed.

As a method for etching the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

As described in Embodiment 4, the oxide semiconductor layer 144 is preferably subjected to heat treatment (first heat treatment). The first heat treatment can be performed in a manner described in Embodiment 4, and Embodiment 4 can be referred to for the details. Impurities are reduced by the first heat treatment to form the oxide semiconductor layer 144 that is an i-type (intrinsic) semiconductor or is extremely close to an i-type semiconductor; thus, a transistor with extremely excellent characteristics can be realized. The first heat treatment may be performed before the oxide semiconductor layer is etched or after etching is performed so that the oxide semiconductor layer is processed into an island shape.

Next, a gate insulating layer 146 that is in contact with the oxide semiconductor layer 144 is formed (see FIG. 18C).

The gate insulating layer 146 can be formed using a material and a method similar to those in Embodiment 4. Therefore, Embodiment 4 can be referred to for the material and the film formation method of the gate insulating layer 146.

After the gate insulating layer 146 is formed, second heat treatment is preferably performed in an inert gas atmosphere or an oxygen atmosphere as in Embodiment 4. The second heat treatment can be performed in a manner described in Embodiment 4, and Embodiment 4 can be referred to for the details. The second heat treatment can reduce variations in electric characteristics of transistors. In the case where the gate insulating layer 146 contains oxygen, oxygen is supplied to the oxide semiconductor layer 144 to compensate oxygen deficiency of the oxide semiconductor layer 144, so that the oxide semiconductor layer can be an i-type (intrinsic) oxide semiconductor layer or extremely closed to an i-type (intrinsic) oxide semiconductor layer.

Note that in this embodiment, the second heat treatment is performed after the gate insulating layer 146 is formed; there is no particular limitation on the timing of the second heat treatment. For example, the second heat treatment may be performed after the gate electrode is formed. Moreover, the second heat treatment may be performed subsequent to the first heat treatment, the first treatment may also serve as the second heat treatment, or the second treatment may also serve as the first heat treatment.

Figure 18D:
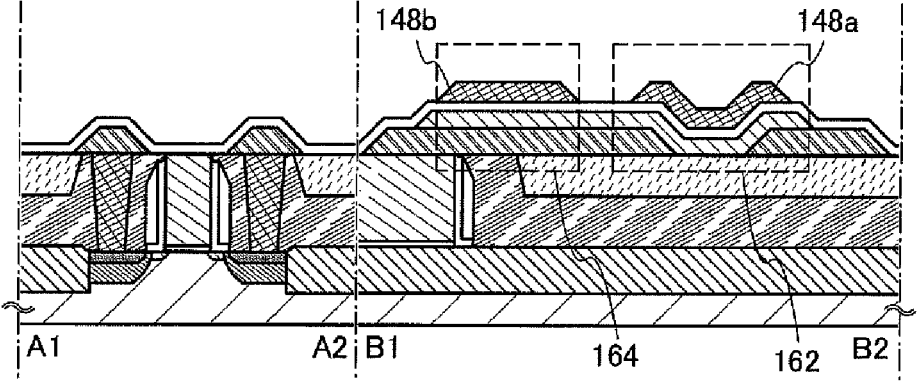

Next, over the gate insulating layer 146, a gate electrode 148a is formed in a region overlapping with the oxide semiconductor layer 144 and an electrode 148b is formed in a region overlapping with the source/drain electrode 142a (see FIG. 18D). The gate electrode 148a and the electrode 148b can be formed in such a manner that a conductive layer is formed over the gate insulating layer 146 and then selectively etched. The conductive layer to be the gate electrode 148a and the electrode 148b can be formed by a PVD method such as a sputtering method or a CVD method such as a plasma CVD method. The details are similar to those of the source/drain electrode 142a and the like and thus can refer to the description of the source/drain electrode 142a and the like.

Then, as described in Embodiment 4, an interlayer insulating layer 150 and an interlayer insulating layer 152 are formed over the gate insulating layer 146, the gate electrode 148a, and the electrode 148b. The interlayer insulating layers 150 and 152 can be formed using a material and a method similar to those in Embodiment 4. Therefore, Embodiment 4 can be referred to for the material and the film formation method of the interlayer insulating layers 150 and 152.

Note that the interlayer insulating layer 152 is preferably formed so as to have a planar surface because an electrode, a wiring, or the like can be favorably formed over the interlayer insulating layer 152 even in the case where the semiconductor device is reduced in size, for example. The interlayer insulating layer 152 can be planarized using a method such as CMP (chemical mechanical polishing).

Through the above process, the transistor 162 including the purified oxide semiconductor layer 144 is completed (see FIG. 18D). Moreover, the capacitor 164 is completed.

The transistor 162 illustrated in FIG. 18D includes the oxide semiconductor layer 144, the source/drain electrodes 142a and 142b electrically connected to the oxide semiconductor layer 144, the gate insulating layer 146 covering the oxide semiconductor layer 144 and the source/drain electrodes 142a and 142b, and the gate electrode 148a over the gate insulating layer 146. The capacitor 164 includes the source/drain electrode 142a, the oxide semiconductor layer 144, the gate insulating layer 146 covering the source/drain electrode 142a, and the electrode 148b over the gate insulating layer 146.

Since the oxide semiconductor layer 144 is purified, the hydrogen concentration of the transistor 162 in this embodiment is $5 \times 10^{19}$ atoms/cm$^3$ or less, preferably $5 \times 10^{18}$ atoms/cm$^3$ or less, more preferably $5 \times 10^{17}$ atoms/cm$^3$ or less. The carrier density of the oxide semiconductor layer 144 (e.g., less than $1 \times 10^{12}$/cm$^3$, preferably less than $1.45 \times 10^{10}$/cm$^3$) is sufficiently lower than that of a general silicon wafer (approximately $1 \times 10^{14}$/cm$^3$). For that reason, the off-state current is sufficiently small. For example, the off-state current (per unit channel width (1 μm), here) of the transistor 162 at room temperature is 100 zA/μm (1 zA (zeptoampere) is $1 \times 10^{-21}$A) or less, preferably 10 zA/μm or less.

By using the purified and intrinsic oxide semiconductor layer 144, the off-state current of the transistor can be sufficiently reduced. With the use of such a transistor, a semiconductor device in which stored data can be retained for an extremely long time can be provided.

The structures, methods, and the like described in this embodiment can be combined as appropriate with any of the structures, methods, and the like described in the other embodiments.

(Embodiment 6)

In this embodiment, a structure and a manufacturing method of a semiconductor device according to one embodiment of the invention disclosed herein, which are different from those of Embodiments 4 and 5, will be described with reference to FIGS. 19A and 19B, FIGS. 20A to 20D, and FIGS. 21A to 21C.

<Cross-Sectional Structure and Planar Structure of Semiconductor Device>

Figure 19A:
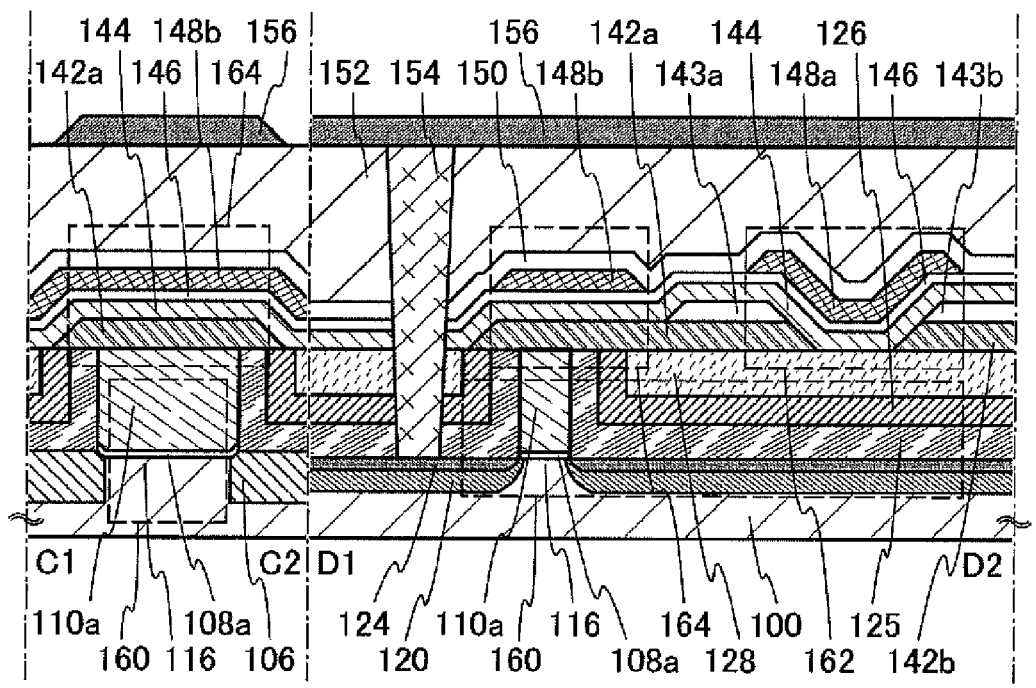
FIG. 19A is a cross-sectional view and FIG. 19B is a plan view of a semiconductor device.
Figure 19B:
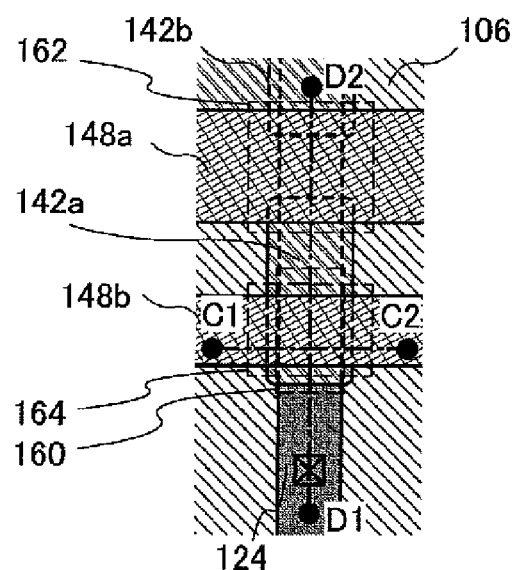

FIGS. 19A and 19B illustrate an example of a structure of a semiconductor device. FIG. 19A illustrates a cross section of the semiconductor device, and FIG. 19B illustrates a plan view of the semiconductor device. Here, FIG. 19A corresponds to the cross section along line C1-C2 and line D1-D2 in FIG. 19B. In the plan view of FIG. 19B, some of components such as a source/drain electrode 154 and a wiring 156 are omitted to avoid complexity. The semiconductor device illustrated in FIGS. 19A and 19B includes a transistor 160 including a semiconductor material other than an oxide semiconductor in a lower portion, and a transistor 162 including an oxide semiconductor in an upper portion. A transistor including a semiconductor material other than an oxide semiconductor can easily operate at high speed. On the other hand, a transistor including an oxide semiconductor can hold electric charge for a long time owing to its characteristics.

Although the above-described transistors are n-channel transistors here, it is needless to say that p-channel transistors can be used. The technical nature of the invention disclosed herein is to use an oxide semiconductor in the transistor 162 for data retention; therefore, a specific structure of the semiconductor device is not necessary limited to the structure described here.

One of differences between the semiconductor device illustrated in FIGS. 19A and 19B and the semiconductor devices in Embodiments 4 and 5 is a planar layout of the semiconductor device. In this embodiment, the transistor 162 and the capacitor 164 overlap with the transistor 160. By employing such a planar layout, higher integration can be realized. For example, given that the minimum feature size is F, the area occupied by a memory cell can be 15F$^2$ to 25F$^2$.

Another difference between the semiconductor device illustrated in FIGS. 19A and 19B and the semiconductor devices in Embodiments 4 and 5 is the presence or absence of a sidewall insulating layer 118 in the transistor 160. That is, the semiconductor device in FIGS. 19A and 19B does not include a sidewall insulating layer. Moreover, an impurity region 114 is not formed because a sidewall insulating layer is not formed. In the case where a sidewall insulating layer is not provided as above, high integration is easily realized as compared to the case where the sidewall insulating layer 118 is provided. In addition, the manufacturing process can be simplified as compared to the case where the sidewall insulating layer 118 is provided.

Another difference between the semiconductor device illustrated in FIGS. 19A and 19B and the semiconductor devices in Embodiments 4 and 5 is the presence or absence of an interlayer insulating layer 125 in the transistor 160. That is, the semiconductor device in FIGS. 19A and 19B includes the interlayer insulating layer 125. When an insulating layer containing hydrogen is used as the interlayer insulating layer 125, hydrogen can be supplied to the transistor 160 to improve characteristics of the transistor 160. An example of the interlayer insulating layer 125 is a silicon nitride layer containing hydrogen, formed by a plasma CVD method. Further, when an insulating layer from which hydrogen is sufficiently reduced is used as an interlayer insulating layer 126, hydrogen which might cause deterioration of characteristics of the transistor 162 can be prevented from entering the transistor 162. An example of the interlayer insulating layer 126 is a silicon nitride layer formed by a sputtering method. When such a structure is employed, the characteristics of the transistors 160 and 162 can be sufficiently improved.

Another difference between the semiconductor device illustrated in FIGS. 19A and 19B and the semiconductor devices in Embodiments 4 and 5 is the presence or absence of an insulating layer 143a and an insulating layer 143b in the transistor 162. That is, the semiconductor device in FIGS. 19A and 19B includes the insulating layer 143a and 143b. By thus providing the insulating layers 143a and 143b, so-called gate capacitance between a gate electrode 148a and a source/drain electrode 142a (or the gate electrode 148a and a source/drain electrode 142b) can be reduced, and the operating speed of the transistor 162 can be increased.

Note that as in Embodiment 5, the transistor 160 in the lower portion and the transistor 162 in the upper portion are electrically connected to each other because the source/drain electrode 142a is formed directly on a gate electrode 110a. With such a structure, the integration degree can be increased as compared to the case where an electrode and a wiring are separately provided. In addition, the manufacturing process can be simplified.

Although the structure including all the differences is described in this embodiment, a structure including any one of the differences may be employed.

<Example of Method for Manufacturing Semiconductor Device>

Next, an example of a method for manufacturing the semiconductor device will be described. Steps performed after the formation of the lower transistor 160 and a method for manufacturing the upper transistor 162 will be described below with reference to FIGS. 20A to 20D and FIG. 21A to 21C. The transistor 160 in the lower portion can be formed by a method similar to the method described in Embodiment 4. The description of Embodiment 4 can be referred to for the details.

Figure 20A:
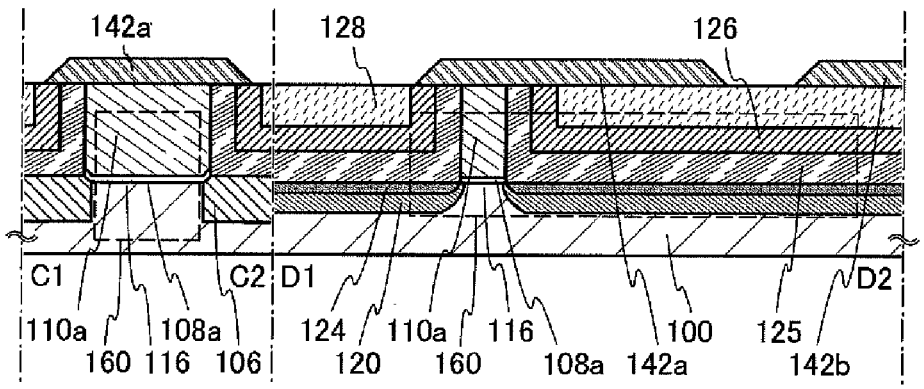
FIGS. 20A to 20D are cross-sectional views illustrating steps for manufacturing a semiconductor device.

Note that in this embodiment, three interlayer insulating layers 125, 126, and 128 are formed so as to cover the transistor 160 (see FIG. 20A). Furthermore, the source/drain electrodes 130a and 130b shown in FIG. 15H or the like are not formed in the manufacturing process of the transistor 160 in this embodiment; even the structure in which the source/drain electrodes 130a and 130b are not formed is called the transistor 160 for convenience.

First, the transistor 160 in the lower portion is formed by the method described in Embodiment 4, and then, components above the top surface of the gate electrode 110a of the transistor 160 are removed. For the removing step, polishing treatment such as CMP (chemical mechanical polishing) may be used. Thus, parts of the interlayer insulating layers 125, 126, and 128 which are placed above the top surface of the gate electrode 110a are removed. Note that when the surface subjected to such polishing treatment is planarized sufficiently, an electrode, a wiring, an insulating layer, a semiconductor layer, and the like can be formed favorably in later steps.

Next, a conductive layer is formed over the gate electrode 110a and the interlayer insulating layers 125, 126, and 128 and the conductive layer is selectively etched, so that a source/drain electrode 142a and a source/drain electrode 142b are formed (see FIG. 20A). Here, the source/drain electrode 142a is formed to be directly connected to the gate electrode 110a.

For the conductive layer for forming the source/drain electrodes 142a and 142b, a material similar to that described in Embodiment 4 can be used. Moreover, the conductive layer can be etched in a manner similar to the method described in Embodiment 4. The description of Embodiment 4 can be referred to for the details.

Figure 20B:
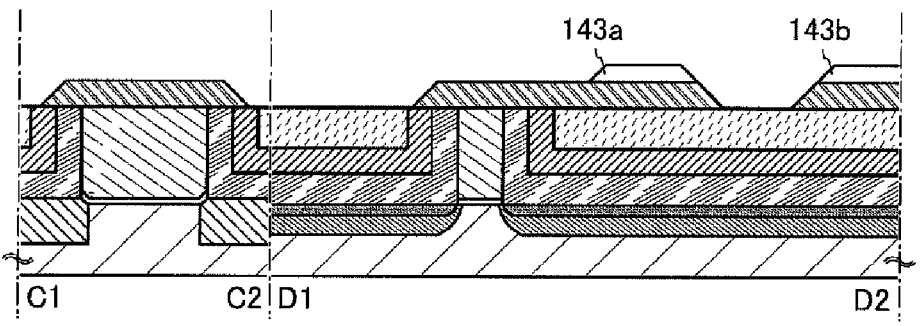

Then, an insulating layer is formed so as to cover the source/drain electrodes 142a and 142b and selectively etched, so that an insulating layer 143a and an insulating layer 143b are formed over the source/drain electrode 142a and the source/drain electrode 142b, respectively (see FIG. 20B).

By providing the insulating layers 143a and 143b, parasitic capacitance between a gate electrode to be formed later and the source/drain electrodes 142a and 142b can be reduced.

Figure 20C:
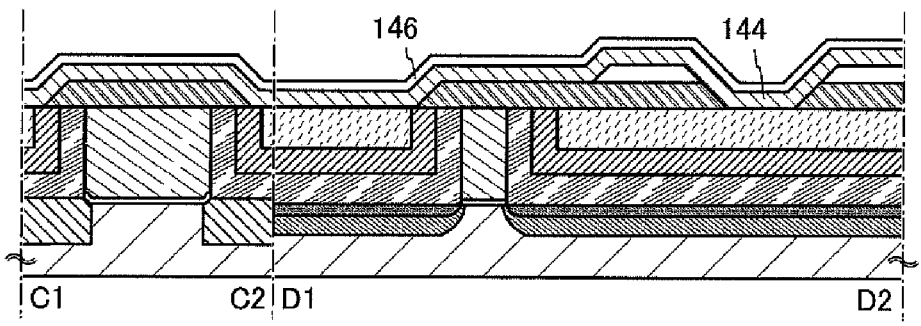

Next, an oxide semiconductor layer 144 is formed so as to cover the source/drain electrodes 142a and 142b, and a gate insulating layer 146 is formed over the oxide semiconductor layer 144 (see FIG. 20C).

The oxide semiconductor layer 144 can be formed using any of the materials and the methods described in Embodiment 4. Further, the oxide semiconductor layer 144 is preferably subjected to heat treatment (first heat treatment). Embodiment 4 can be referred to for the details.

The gate insulating layer 146 can be formed using any of the materials and the methods described in Embodiment 4. After the gate insulating layer 146 is formed, heat treatment (second heat treatment) is preferably performed in an inert gas atmosphere or an oxygen atmosphere. Embodiment 4 can be referred to for the details.

Figure 20D:
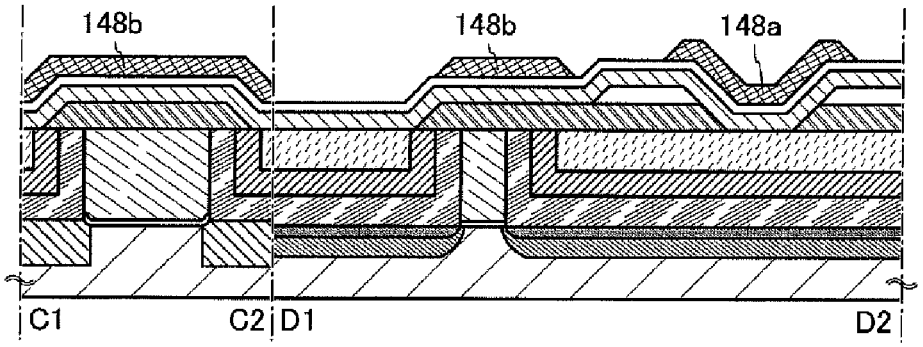

Next, over the gate insulating layer 146, a gate electrode 148a is formed in a region overlapping with a region serving as a channel formation region of the transistor 162 and an electrode 148b is formed in a region overlapping with the source/drain electrode 142a (see FIG. 20D).

The gate electrode 148a and the electrode 148b can be formed in such a manner that a conductive layer is formed over the gate insulating layer 146 and then selectively etched. The conductive layer to be the gate electrode 148a and the electrode 148b can be formed by a PVD method such as a sputtering method or a CVD method such as a plasma CVD method. The details are similar to those of the source/drain electrode 142a and the like and thus can refer to the description of the source/drain electrode 142a and the like.

Figure 21A:
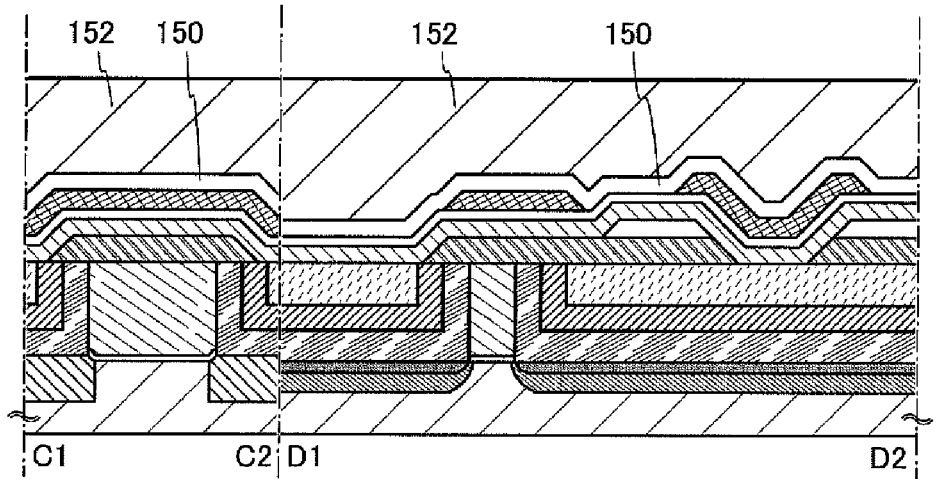
FIGS. 21A to 21C are cross-sectional views illustrating steps for manufacturing a semiconductor device.

Then, an interlayer insulating layer 150 and an interlayer insulating layer 152 are formed over the gate insulating layer 146, the gate electrode 148a, and the electrode 148b (see FIG. 21A). The interlayer insulating layers 150 and 152 can be formed using a material and a method similar to those in Embodiment 4. Embodiment 4 can be referred to for the details.

Note that the interlayer insulating layer 152 is preferably formed so as to have a planar surface because an electrode, a wiring, or the like can be favorably formed over the interlayer insulating layer 152 even in the case where the semiconductor device is reduced in size, for example. The interlayer insulating layer 152 can be planarized by a method such as CMP (chemical mechanical polishing).

Figure 21B:
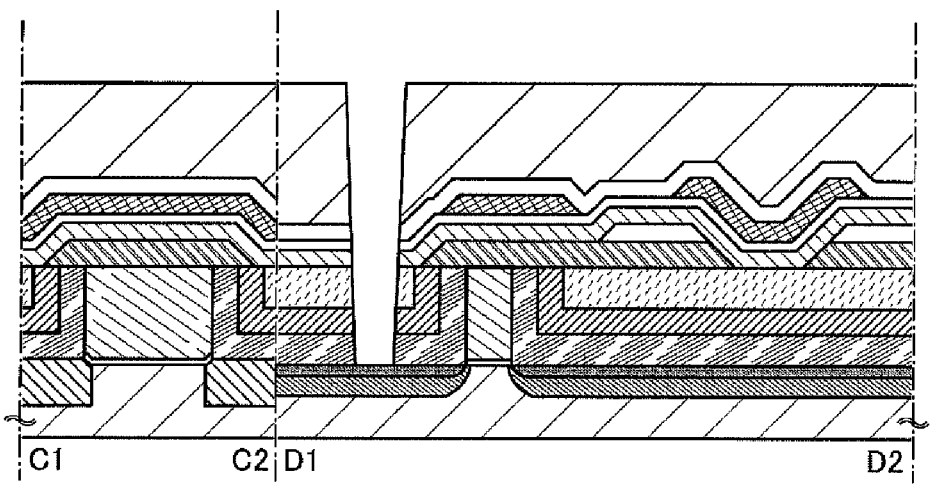
Figure 21C:
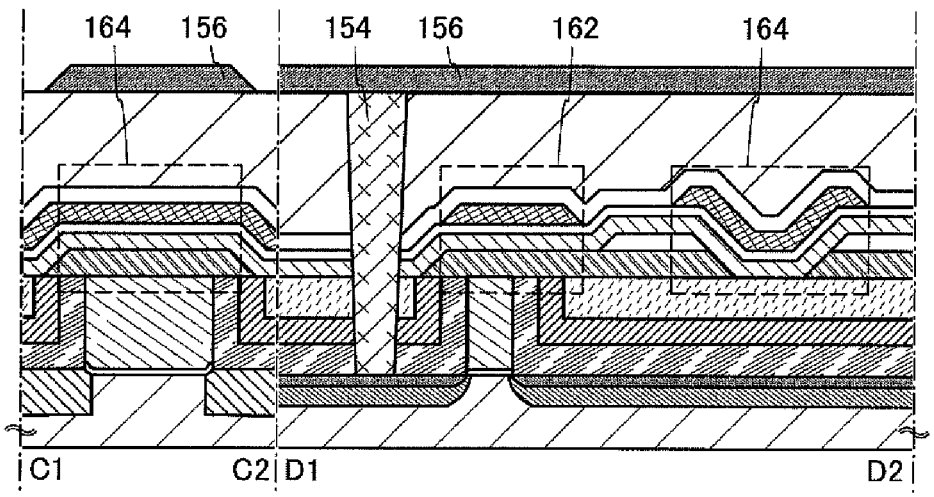

Next, the interlayer insulating layers 125, 126, and 128, the oxide semiconductor layer 144, the gate insulating layer 146, and the interlayer insulating layers 150 and 152 are selectively etched so that an opening that reaches the metal compound region 124 of the transistor 160 is formed (see FIG. 21B). As the etching, either dry etching or wet etching may be used; dry etching is preferably employed in terms of microfabrication.

Then, a source/drain electrode 154 is formed so as to be embedded in the opening. After that, a wiring 156 that is connected to the source/drain electrode 154 is formed (see FIG. 21C).

The source/drain electrode 154 can be formed in the following manner, for example: a conductive layer is formed in a region including the opening by a PVD method, a CVD method, or the like and then part of the conductive layer is removed by etching, CMP, or the like. Specifically, it is possible to employ a method, for example, in which a thin titanium film is formed in a region including the opening by a PVD method and a thin titanium nitride film is formed by a CVD method, and then a tungsten film is formed so as to be embedded in the opening. Here, the titanium film formed by a PVD method has a function of reducing an oxide film (e.g., a natural oxide film) formed on a surface where the titanium film is formed, to decrease the contact resistance with the lower electrodes (here, the metal compound regions 124). The titanium nitride film formed after the formation of the titanium film has a barrier function of preventing diffusion of the conductive material. A copper film may be formed by a plating method after the formation of the barrier film of titanium, titanium nitride, or the like.

The wiring 156 can be formed in such a manner that a conductive layer is formed in contact with the source/drain electrode 154 and then etched selectively. The conductive layer can be formed by a PVD method such as a sputtering method, or a CVD method such as a plasma CVD method. The details are similar to those of the source electrode 142a and the like.

Through the above process, the semiconductor device including the transistor 160, the transistor 162, and the capacitor 164 is completed.

High integration of the semiconductor devices in this embodiment is possible because of the following reasons, for example: the transistor 162 and the capacitor 164 overlap with the transistor 160, the transistor 160 does not include a sidewall insulating layer, and the source/drain electrode 142a is formed directly on the gate electrode 110a. In addition, the manufacturing process is simplified.

Further, in the semiconductor device described in this embodiment, an insulating layer containing hydrogen is used as the interlayer insulating layer 125 and an insulating layer from which hydrogen is sufficiently reduced is used as the interlayer insulating layer 126; thus, the characteristics of the transistors 160 and 162 are improved. Since the semiconductor device in this embodiment includes the insulating layers 143a and 143b, so-called gate capacitance is reduced and the operating speed of the transistor 162 is increased.

The above-described features described in this embodiment make it possible to provide a semiconductor device having significantly excellent characteristics.

The structures, methods, and the like described in this embodiment can be combined as appropriate with any of the structures, methods, and the like described in the other embodiments.

(Embodiment 7)

In this embodiment, the case where the semiconductor device described in any of the above embodiments is applied to an electronic device will be described with reference to FIGS. 22A to 22F. In this embodiment, the case where the above-described semiconductor device is applied to an electronic device such as a computer, a mobile phone set (also referred to as a mobile phone or a mobile phone device), a personal digital assistant (including a portable game machine, an audio reproducing device, and the like), a digital camera, a digital video camera, electronic paper, or a television set (also referred to as a television or a television receiver) will be described.

Figure 22A:
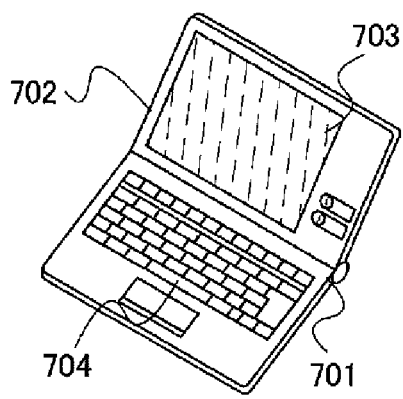
FIGS. 22A to 22F each illustrate an electronic device including a semiconductor device.

FIG. 22A illustrates a notebook personal computer including a housing 701, a housing 702, a display portion 703, a keyboard 704, and the like. The semiconductor device described in the foregoing embodiment is provided in the housing 701 and the housing 702. Thus, it is possible to realize a notebook personal computer in which writing and reading of data is performed at high speed, data can be stored for a long time, and power consumption is sufficiently low.

Figure 22B:
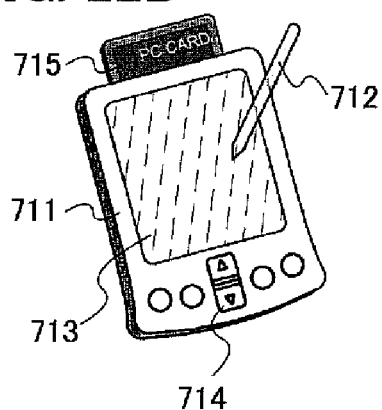

FIG. 22B illustrates a personal digital assistant (PDA). A main body 711 is provided with a display portion 713, an external interface 715, operation buttons 714, and the like. A stylus 712 for operating the personal digital assistant is also provided, for example. The semiconductor device described in the foregoing embodiment is provided in the main body 711. Thus, it is possible to realize a personal digital assistant in which writing and reading of data is performed at high speed, data can be stored for a long time, and power consumption is sufficiently low.

Figure 22C:
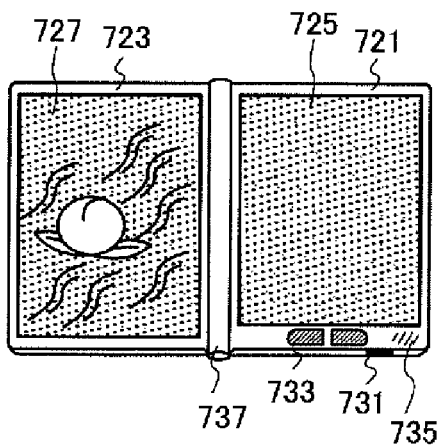

FIG. 22C illustrates an e-book reader including electronic paper. The e-book reader includes two housings 721 and 723. The housing 721 and the housing 723 are provided with a display portion 725 and a display portion 727, respectively. The housings 721 and 723 are connected by a hinge portion 737 and can be opened or closed with the hinge portion 737. Moreover, the housing 721 is provided with a power switch 731, operation keys 733, a speaker 735, and the like. The semiconductor device described in the foregoing embodiment is provided in at least one of the housings 721 and 723. Thus, it is possible to realize an e-book reader in which writing and reading of data is performed at high speed, data can be stored for a long time, and power consumption is sufficiently low.

Figure 22D:
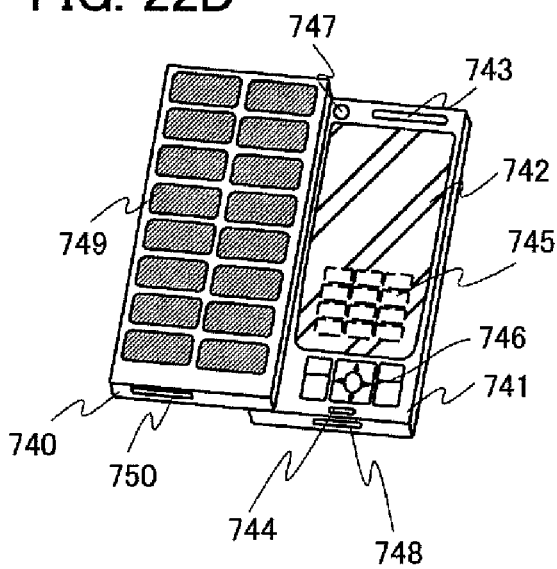

FIG. 22D illustrates a mobile phone including two housings 740 and 741. The housings 740 and 741 which are unfolded in FIG. 22D can slide so that one overlaps the other. Thus, the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. An antenna is incorporated in the housing 741. The semiconductor device described in the foregoing embodiment is provided in at least one of the housings 740 and 741. Thus, it is possible to realize a mobile phone in which writing and reading of data is performed at high speed, data can be stored for a long time, and power consumption is sufficiently low.

Figure 22E:
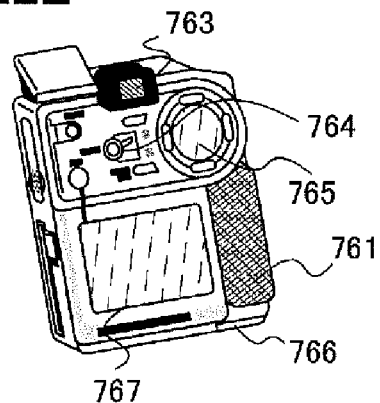

FIG. 22E is a digital camera including a main body 761, a display portion 767, an eyepiece portion 763, an operation switch 764, a display portion 765, a battery 766, and the like. The semiconductor device described in the foregoing embodiment is provided in the main body 761. Thus, it is possible to realize a digital camera in which writing and reading of data is performed at high speed, data can be stored for a long time, and power consumption is sufficiently low.

Figure 22F:
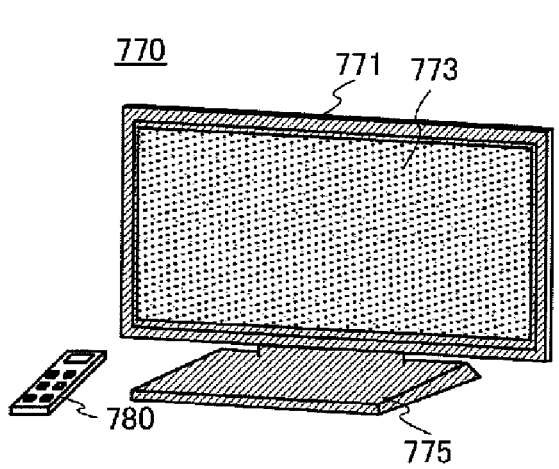

FIG. 22F is a television set including a housing 771, a display portion 773, a stand 775, and the like. A television set 770 can be operated by an operation switch of the housing 771 or a remote controller 780. The semiconductor device described in the foregoing embodiment is mounted on the housing 771 and the remote controller 780. Thus, it is possible to realize a television set in which writing and reading of data is performed at high speed, data can be stored for a long time, and power consumption is sufficiently low.

As described above, the semiconductor device described in the foregoing embodiment is mounted on the electronic device in this embodiment. Thus, the electronic device with lower power consumption is realized.

EXAMPLE 1

The number of write cycles of a semiconductor device according to one embodiment of the invention disclosed herein was examined. In this example, the examination results will be described with reference to FIG. 23.

A semiconductor device used for the examination is the semiconductor device having the circuit configuration in FIG. 1A1. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width obtained after storing and writing of data were repeated predetermined times. Data was stored and written by applying 0 V or 5 V to a wiring corresponding to the third wiring in FIG. 1A1 and applying 0 V or 5 V to a wiring corresponding to the fourth wiring in FIG. 1A1. When the potential of the wiring corresponding to the fourth wiring is 0 V, the transistor (the writing transistor) corresponding to the transistor 162 is off; thus, a potential supplied to a floating gate portion FG is held. When the potential of the wiring corresponding to the fourth wiring is 5 V, the transistor corresponding to the transistor 162 is on; thus, the potential of the wiring corresponding to the third wiring is supplied to the floating gate portion FG.

The memory window width is one of indicators of characteristics of a storage device. Here, the memory window width represents the shift amount $\Delta V_{cg}$ in different memory states in curves (Vcg-Id curves) showing the relation between the potential Vcg of the wiring corresponding to the fifth wiring and a drain current Id of a transistor (a reading transistor) corresponding to the transistor 160. The different memory states mean a state where 0 V is applied to the floating gate portion FG (hereinafter referred to as a low state) and a state where 5 V is applied to the floating gate portion FG (hereinafter referred to as a high state). That is, the memory window width can be checked by sweeping the potential Vcg in the low state and in the high state.

Figure 23:
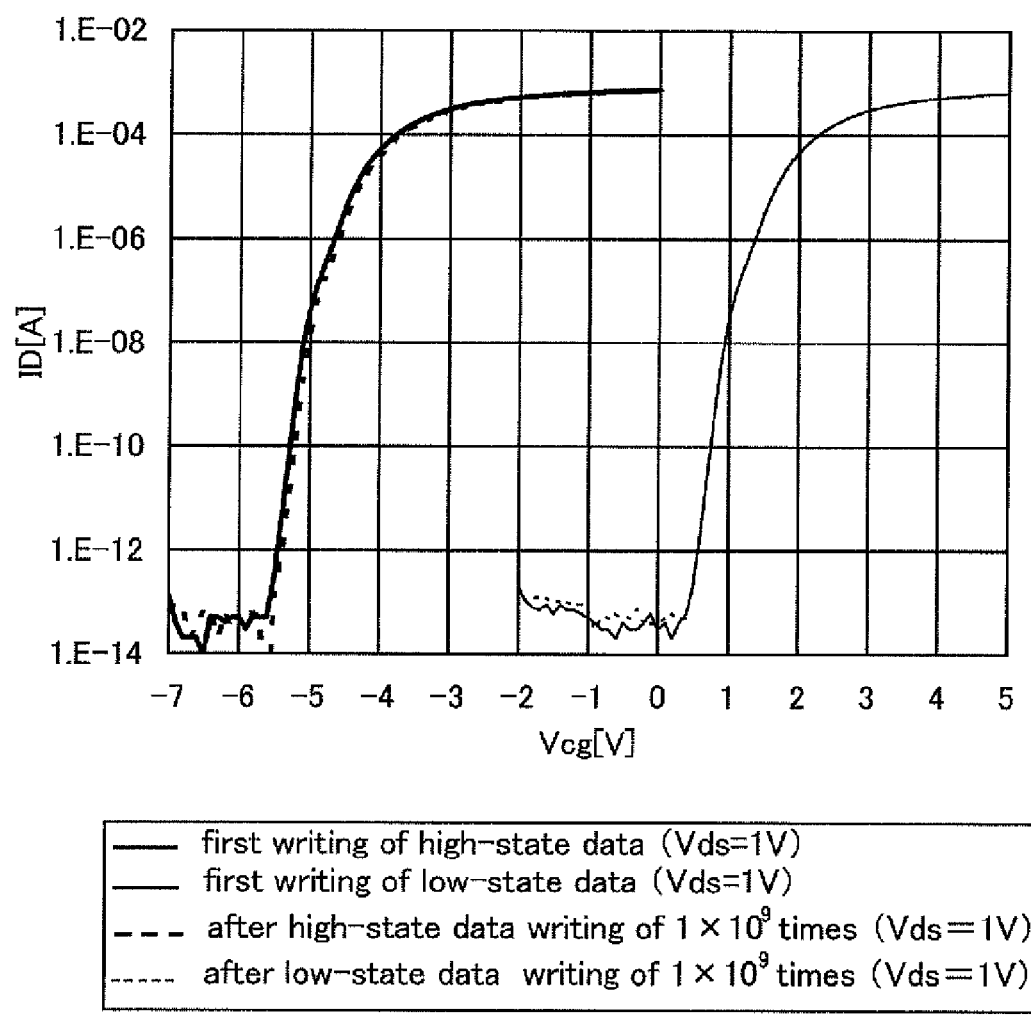
FIG. 23 is a graph showing examination results of a memory window width.

FIG. 23 shows the examination results of the memory window width in an initial state and the memory window width obtained after data writing was performed $1\times10^9$ times. In FIG. 23, the horizontal axis represents Vcg (V) and the vertical axis represents Id (A). A thick solid line is a curve of Vcg-Id characteristics at the time of first writing of high-state data. A thin solid line is a curve of Vcg-Id characteristics at the time of first writing of low-state data. A thick chain line is a curve of Vcg-Id characteristics after high-state data writing of $1\times10^9$ times. A thin chain line is a curve of Vcg-Id characteristics after low-state data writing of $1\times10^9$ times. It can be seen from FIG. 23 that the memory window width is not changed before and after data is written $1\times10^9$ times, which means that the semiconductor device does not deteriorate at least until data writing is performed $1\times10^9$ times.

As described above, characteristics of the semiconductor device according to one embodiment of the invention disclosed herein are not changed after storing and writing of data were repeated as many as $1\times10^9$ times, and the semiconductor device has extremely high write endurance. That is, according to one embodiment of the invention disclosed herein, a semiconductor device with extremely high reliability is realized.

EXAMPLE 2

In this example, results obtained by measuring the off-state current of a transistor including a purified oxide semiconductor will be described.

Figure 24:
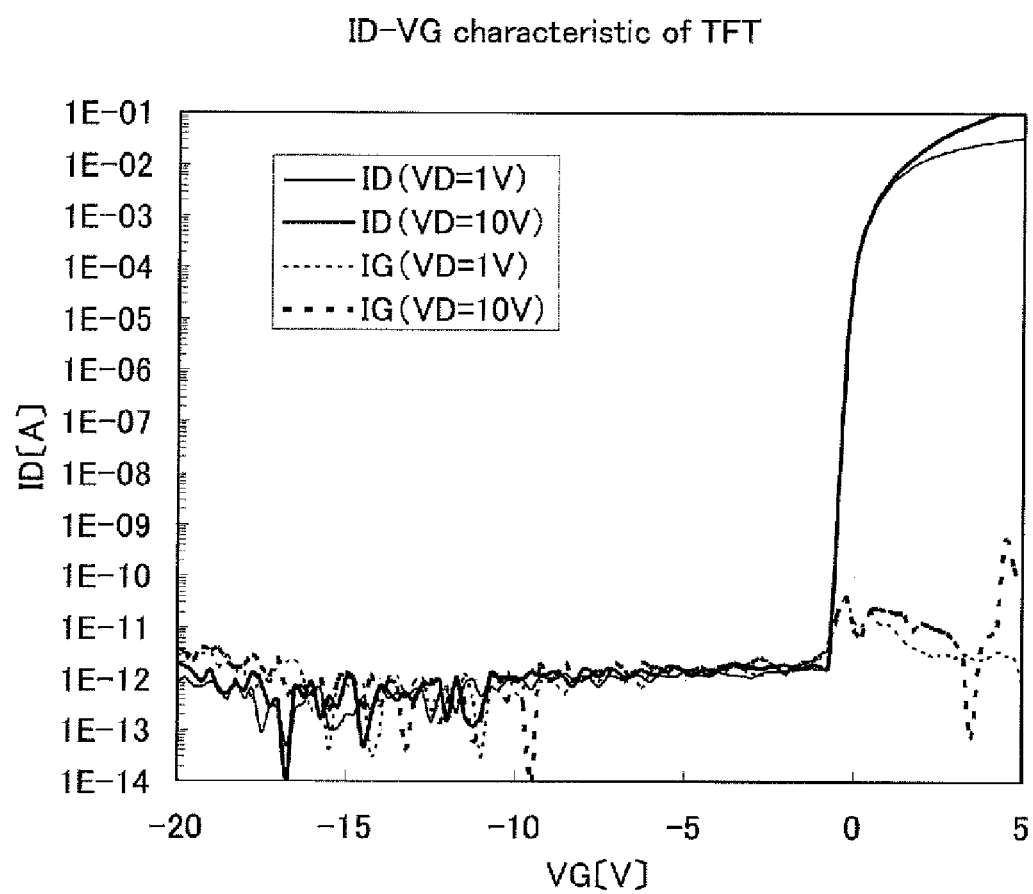
FIG. 24 is a graph showing characteristics of a transistor including an oxide semiconductor.

In this example, a transistor was manufactured using a purified oxide semiconductor in accordance with Embodiment 4. First, a transistor with a sufficiently large channel width W of 1 m was prepared in consideration of the fact that the transistor including a purified oxide semiconductor has an adequately small off-state current, and the off-state current was measured. FIG. 24 shows the results obtained by measurement of the off-state current of a transistor with a channel width W of 1 m. In FIG. 24, the horizontal axis represents a gate voltage VG, and the vertical axis represents a drain current ID. In the case where the drain voltage VD is +1 V or +10 V and the gate voltage VG is within the range of −20 V to −5 V, the off-state current of the transistor was found to be smaller than or equal to $1\times10^{-12}$ A. Moreover, it was found that the off-state current of the transistor was 1 aA/μm ($1\times10^{-18}$ A/μm) or less.

Next, the results obtained by more accurately measuring the off-state current of the transistor including a purified oxide semiconductor will be described. As described above, the off-state current of the transistor including a purified oxide semiconductor was found to be smaller than or equal to $1\times10^{-12}$ A. Here, the results obtained by measuring more accurate off-state current with the use of an element for characteristic evaluation will be described.

First, the element for characteristic evaluation which was used for measuring current will be described with reference to FIG. 25.

Figure 25:
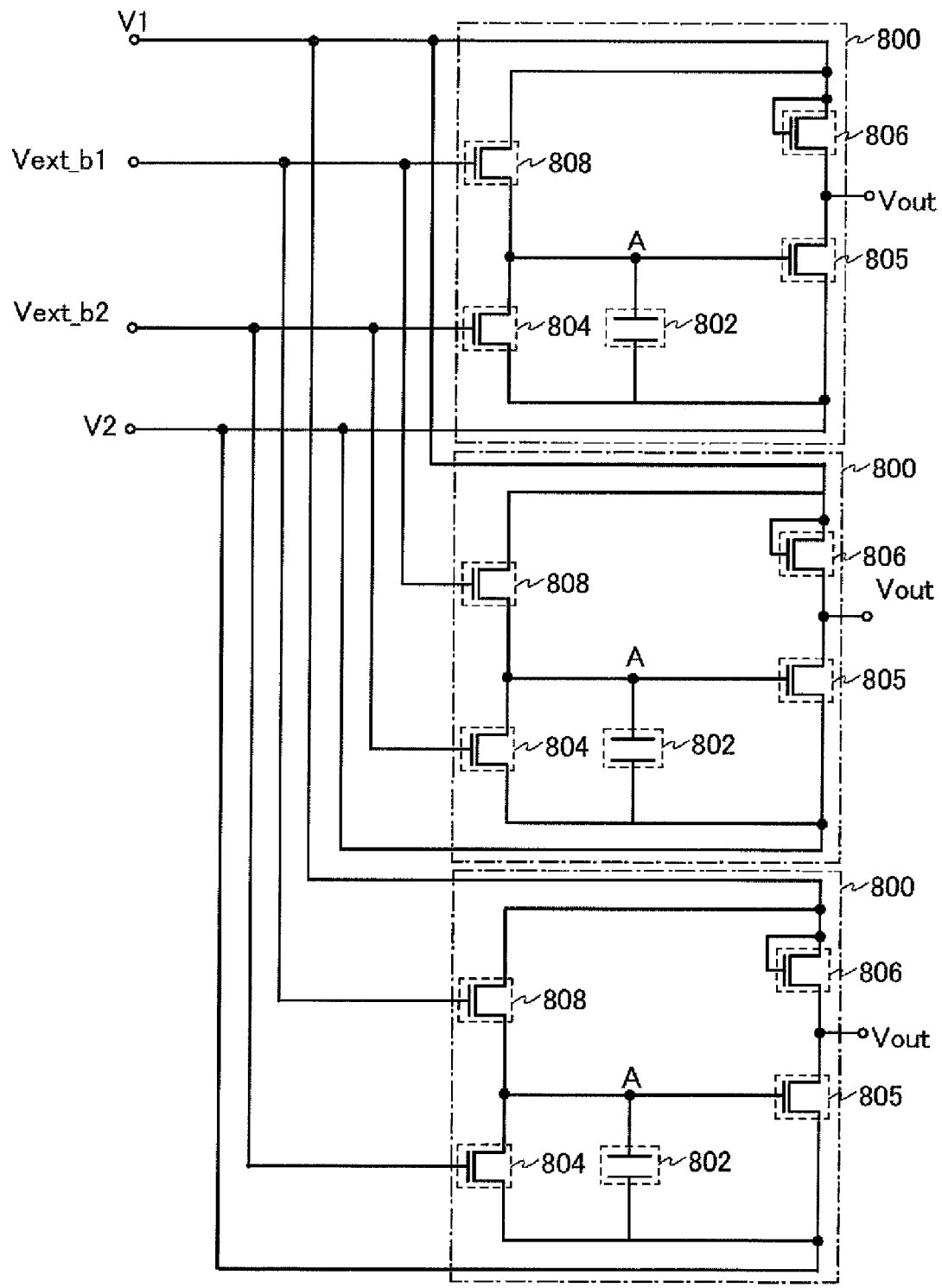
FIG. 25 is a circuit diagram of an element for evaluating characteristics of a transistor including an oxide semiconductor.

In the element for characteristic evaluation in FIG. 25, three measurement systems 800 are connected in parallel. The measurement system 800 includes a capacitor 802, a transistor 804, a transistor 805, a transistor 806, and a transistor 808. A transistor manufactured in accordance with Embodiment 4 was used as the transistors 804 and 808.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other terminal of the capacitor 802, and a gate terminal of the transistor 805 are connected to each other. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other, and serve as an output terminal Vout.

A potential Vext_b2 for controlling the on/off state of the transistor 804 is supplied to the gate terminal of the transistor 804. A potential Vext_b1 for controlling the on/off state of the transistor 808 is supplied to the gate terminal of the transistor 808. A potential Vout is output from the output terminal.

Next, a method for measuring current with the use of the above-described measurement system will be described.

First, an initialization period in which a potential difference is applied to measure the off-state current is briefly described. In the initialization period, the potential Vext_b1 for turning on the transistor 808 is input to the gate terminal of the transistor 808, and a potential V1 is supplied to a node A that is a node connected to the other of the source terminal and the drain terminal of the transistor 804 (i.e., the node connected to one of the source terminal and the drain terminal of the transistor 808, the other terminal of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808 so that the transistor 808 is turned off. After the transistor 808 is turned off, the potential V1 is set low. The transistor 804 remains off. The potential V2 is the same potential as the potential V1. Thus, the initialization period is completed. When the initialization period is finished, a potential difference is generated between the node A and one of the source electrode and the drain electrode of the transistor 804, and a potential difference is generated between the node A and the other of the source electrode and the drain electrode of the transistor 808. Accordingly, a small amount of electric charge flows through the transistor 804 and the transistor 808. That is, the off-state current is caused.

Next, a measurement period of the off-state current is briefly described. In the measurement period, the potential of one of the source terminal and the drain terminal of the transistor 804 (i.e., V2) and the potential of the other of the source terminal and the drain terminal of the transistor 808 (i.e., V1) are fixed at low potentials. On the other hand, the potential of the node A is not fixed (the node A is in a floating state) in the measurement period. Accordingly, electric charge flows through the transistor 804, and the amount of electric charge stored in the node A is changed as time passes. The potential of the node A is changed depending on the change in the amount of electric charge stored in the node A. That is, the output potential Vout of the output terminal also varies.

Figure 26:
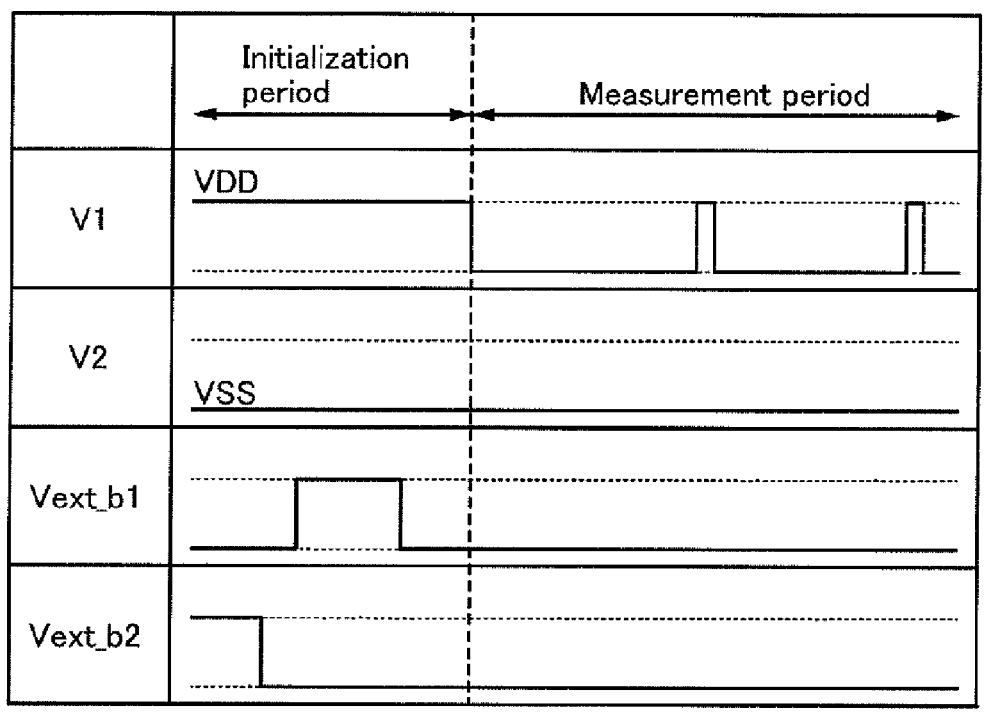
FIG. 26 is a timing chart of an element for evaluating characteristics of a transistor including an oxide semiconductor.

FIG. 26 illustrates details (a timing chart) of the relation between potentials in the initialization period in which the potential difference is applied and in the following measurement period.

In the initialization period, first, the potential Vext_b2 is set to a potential with which the transistor 804 is turned on (a high potential). Thus, the potential of the node A becomes V2, that is, a low potential (VSS). After that, the potential Vext_b2 is set to a potential with which the transistor 804 is turned off (a low potential), so that the transistor 804 is turned off. Next, the potential Vext_b1 is set to a potential with which the transistor 808 is turned on (a high potential). Thus, the potential of the node A becomes V1, that is, a high potential (VDD). After that, the potential Vext_b1 is set to a potential with which the transistor 808 is turned off. Accordingly, the node A enters a floating state, and the initialization period is completed.

In the following measurement period, the potential V1 and the potential V2 are set to a potential with which electric charge flows to the node A or a potential with which electric charge flows from the node A. Here, each of the potential V1 and the potential V2 is a low potential (VSS). Note that at the time of measuring the output potential Vout, V1 is temporarily set to a high potential (VDD) in some cases because an output circuit needs to be operated. The period during which V1 is a high potential (VDD) is made short so that the measurement is not influenced.

When the potential difference is applied and the measurement period is started as described above, the amount of electric charge stored in the node A is changed as time passes, and the potential of the node A is changed accordingly. This means that the potential of the gate terminal of the transistor 805 varies; thus, the output potential Vout of the output terminal also varies as time passes.

A method for calculating the off-state current from the obtained output potential Vout will be described below.

The relation between a potential $V_A$ of the node A and the output potential Vout is obtained in advance before calculation of the off-state current. With this relation, the potential $V_A$ of the node A can be obtained from the output potential Vout. In accordance with the above-described relation, the potential $V_A$ of the node A can be expressed as a function of the output potential Vout by the following equation.

$$V_A = F(Vout) \quad \text{[Formula 1]}$$

Electric charge $Q_A$ of the node A is expressed by the following equation, using the potential $V_A$ of the node A, a capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[Formula 2]}$$

Since a current $I_A$ of the node A is obtained by differentiating electric charge flowing to the node A (or electric charge flowing from the node A) with respect to time, the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Formula 3]}$$

In this manner, the current $I_A$ of the node A can be obtained from the capacitance $C_A$ connected to the node A and the output potential Vout of the output terminal.

By the above method, a leakage current which flows between a source and a drain of a transistor in an off state (an off-state current) can be measured.

In this example, the transistor 804 and the transistor 808 were manufactured with the use of a purified oxide semiconductor. The ratio of the channel length (L) to the channel width (W) of the transistor was L/W=1:5. In the measurement systems 800 arranged in parallel, capacitance values of the capacitors 802 were 100 fF, 1 pF, and 3 pF.

Note that in the measurement of this example, VDD was 5 V and VSS was 0 V. In the measurement period, Vout was measured while the potential V1 was basically VSS and set to VDD only in a period of 100 milliseconds every 10 to 300 seconds. Moreover, Δt used in calculation of a current I flowing through the element was about 30000 seconds.

Figure 27:
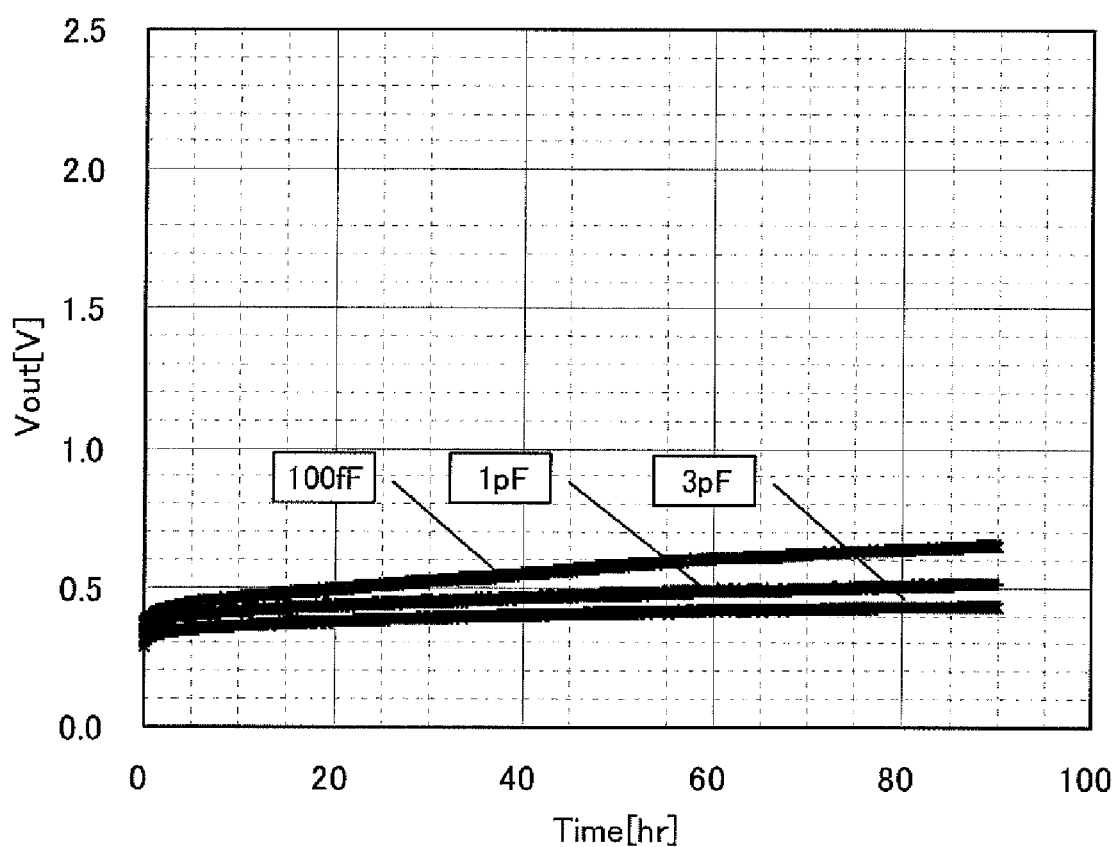
FIG. 27 is a graph showing characteristics of a transistor including an oxide semiconductor.

FIG. 27 shows the relation between elapsed time Time in the current measurement and the output potential Vout. It can be seen from FIG. 27 that the potential is changed as time passes.

Figure 28:
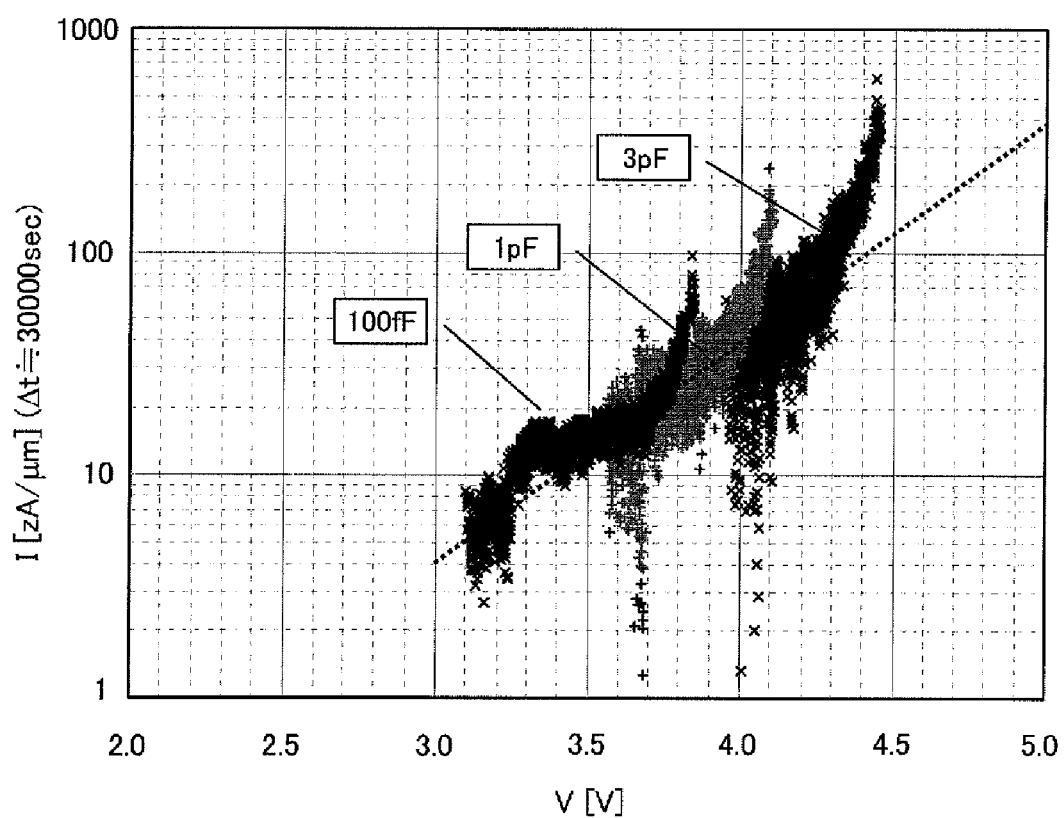
FIG. 28 is a graph showing characteristics of a transistor including an oxide semiconductor.

FIG. 28 shows the off-state current calculated in the above-described current measurement. FIG. 28 shows the relation between a source-drain voltage V and an off-state current I. According to FIG. 28, the off-state current was about 40 zA/μm under the condition that the source-drain voltage was 4 V. In addition, the off-state current was 10 zA/μm or less under the condition that the source-drain voltage was 3.1 V. Note that 1 zA is $10^{-21}$ A.

As described above, it was confirmed from this example that the off-state current was sufficiently small in a transistor including a purified oxide semiconductor.

This application is based on Japanese Patent Application serial no. 2010-007482 filed with Japan Patent Office on Jan. 15, 2010, the entire contents of which are hereby incorporated by reference.

The invention claimed is:

1. A semiconductor device comprising:
a source line;
a bit line extending across the source line;
a first signal line;
a second signal line;
a word line;
a memory cell;
a first driver circuit electrically connected to the bit line; and
a second driver circuit electrically connected to the source line,
wherein the memory cell includes a first transistor having a first gate electrode, a first source electrode, and a first drain electrode; a second transistor having a second gate electrode, a second source electrode, and a second drain electrode; and a capacitor,
wherein the second transistor includes an oxide semiconductor,
wherein the first gate electrode, one of the second source electrode and the second drain electrode, and one of electrodes of the capacitor are electrically connected to each other,
wherein the source line is electrically connected to the first source electrode,
wherein the bit line is electrically connected to the first drain electrode,
wherein the first signal line is electrically connected to the other of the second source electrode and the second drain electrode,
wherein the second signal line is electrically connected to the second gate electrode and,
wherein the word line is electrically connected to the other of the electrodes of the capacitor.

2. The semiconductor device according to claim 1, wherein the first transistor includes a semiconductor other than an oxide semiconductor material.

3. The semiconductor device according to claim 1, further comprising a reading circuit electrically connected to the bit line.

4. The semiconductor device according to claim 1,
wherein the first transistor includes:
a first channel formation region including the semiconductor other than the oxide semiconductor;

an impurity region;
a first gate insulating layer over the first channel formation region;
the first gate electrode over the first gate insulating layer; and
the first source electrode and the first drain electrode electrically connected to the impurity region.

5. The semiconductor device according to claim 1,
wherein the second transistor includes:
the second source electrode and the second drain electrode above the first transistor;
a second channel formation region including the oxide semiconductor and electrically connected to the second source electrode and the second drain electrode;
a second gate insulating layer over the second channel formation region; and
the second gate electrode over the second gate insulating layer.

6. The semiconductor device according to claim 5,
wherein the capacitor includes:
one of the second source electrode and the second drain electrode;
the second gate insulating layer; and
a capacitor electrode over the second gate insulating layer.

7. The semiconductor device according to claim 1, wherein the oxide semiconductor comprises at least one of indium, gallium, tin, and zinc.

8. An electronic device comprising the semiconductor device according to claim 1, wherein the electronic device is one selected from the group consisting of a computer, a mobile phone, a portable information terminal, a digital camera, a digital video camera, an electronic paper, and a television device.

9. A semiconductor device comprising:
a source line;
a bit line extending across the source line;
a first signal line;
a second signal line;
a word line;
a memory cell;
a first driver circuit electrically connected to the bit line;
a second driver circuit electrically connected to the source line and the word line;
a third driver circuit electrically connected to the first signal line; and
a fourth driver circuit electrically connected to the second signal line,
wherein the memory cell includes a first transistor having a first gate electrode, a first source electrode, and a first drain electrode; a second transistor having a second gate electrode, a second source electrode, and a second drain electrode; and a capacitor,
wherein the second transistor includes an oxide semiconductor,
wherein the first gate electrode, one of the second source electrode and the second drain electrode, and one of electrodes of the capacitor are electrically connected to each other,
wherein the source line is electrically connected to the first source electrode,
wherein the bit line is electrically connected to the first drain electrode,
wherein the first signal line is electrically connected to the other of the second source electrode and the second drain electrode,
wherein the second signal line is electrically connected to the second gate electrode, and
wherein the word line is electrically connected to the other of the electrodes of the capacitor.

10. The semiconductor device according to claim 9, wherein the first transistor includes a semiconductor other than an oxide semiconductor material.

11. The semiconductor device according to claim 9, further comprising a reading circuit electrically connected to the bit line.

12. The semiconductor device according to claim 9,
wherein the first transistor includes:
a first channel formation region including the semiconductor other than the oxide semiconductor;
an impurity region;
a first gate insulating layer over the first channel formation region;
the first gate electrode over the first gate insulating layer; and
the first source electrode and the first drain electrode electrically connected to the impurity region.

13. The semiconductor device according to claim 9,
wherein the second transistor includes:
the second source electrode and the second drain electrode above the first transistor;
a second channel formation region including the oxide semiconductor and electrically connected to the second source electrode and the second drain electrode;
a second gate insulating layer over the second channel formation region; and
the second gate electrode over the second gate insulating layer.

14. The semiconductor device according to claim 13,
wherein the capacitor includes:
one of the second source electrode and the second drain electrode;
the second gate insulating layer; and
a capacitor electrode over the second gate insulating layer.

15. The semiconductor device according to claim 9, wherein the oxide semiconductor comprises at least one of indium, gallium, tin, and zinc.

16. An electronic device comprising the semiconductor device according to claim 9, wherein the electronic device is one selected from the group consisting of a computer, a mobile phone, a portable information terminal, a digital camera, a digital video camera, an electronic paper, and a television device.

17. A semiconductor device comprising:
a source line;
a bit line extending across the source line;
a first signal line;
a second signal line;
a word line;
a memory cell;
a first driver circuit electrically connected to the bit line and the word line;
a second driver circuit electrically connected to the source line;
a third driver circuit electrically connected to the first signal line; and
a fourth driver circuit electrically connected to the second signal line,
wherein the memory cell includes a first transistor having a first gate electrode, a first source electrode, and a first drain electrode; a second transistor having a second gate electrode, a second source electrode, and a second drain electrode; and a capacitor,
wherein the second transistor includes an oxide semiconductor, wherein the first gate electrode, one of the second source electrode and the second drain electrode, and one of electrodes of the capacitor are electrically connected to each other, wherein the source line is electrically connected to the first source electrode, wherein the bit line is electrically connected to the first drain electrode, wherein the first signal line is electrically connected to the other of the second source electrode and the second drain electrode, wherein the second signal line is electrically connected to the second gate electrode, and wherein the word line is electrically connected to the other of the electrodes of the capacitor.

18. The semiconductor device according to claim 17, wherein the first transistor includes a semiconductor other than an oxide semiconductor material.

19. The semiconductor device according to claim 17, further comprising a reading circuit electrically connected to the bit line.

20. The semiconductor device according to claim 17, wherein the first transistor includes:
a first channel formation region including the semiconductor other than the oxide semiconductor;
an impurity region;
a first gate insulating layer over the first channel formation region;
the first gate electrode over the first gate insulating layer; and
the first source electrode and the first drain electrode electrically connected to the impurity region.

21. The semiconductor device according to claim 17, wherein the second transistor includes:
the second source electrode and the second drain electrode above the first transistor;
a second channel formation region including the oxide semiconductor and electrically connected to the second source electrode and the second drain electrode;
a second gate insulating layer over the second channel formation region; and
the second gate electrode over the second gate insulating layer.

22. The semiconductor device according to claim 21, wherein the capacitor includes:
one of the second source electrode and the second drain electrode;
the second gate insulating layer; and
a capacitor electrode over the second gate insulating layer.

23. The semiconductor device according to claim 17, wherein the oxide semiconductor comprises at least one of indium, gallium, tin, and zinc.

24. An electronic device comprising the semiconductor device according to claim 17, wherein the electronic device is one selected from the group consisting of a computer, a mobile phone, a portable information terminal, a digital camera, a digital video camera, an electronic paper, and a television device.

* * * * *

UNITED STATES PATENT AND TRADEMARK OFFICE
CERTIFICATE OF CORRECTION

PATENT NO. : 8,395,938 B2
APPLICATION NO. : 12/987279
DATED : March 12, 2013
INVENTOR(S) : Shunpei Yamazaki et al.

Page 1 of 1

It is certified that error appears in the above-identified patent and that said Letters Patent is hereby corrected as shown below:

In the Specifications:

Column 11, line 42, after "1 to" replace "in" with --m--;

Column 11, line 47, replace "51" with --S1--;

Column 14, line 9, before "(rows)" replace "in" with --m--;

Column 14, line 58, after "matrix of" replace "in" with --m--;

Column 17, line 47, before "bit lines" replace "in" with --m--;

Column 17, line 47, before "first" replace "in" with --m--;

Column 17, line 59, replace "is)" with --$n$)--;

Column 17, line 63, before "second" replace "is" with --n--;

Column 18, line 8, before "word" replace "is" with --n--;

Column 18, line 8, before "first signal" replace "is" with --n--;

Column 18, line 18, after "1 to" replace "in" with --m--;

Column 18, line 34, after "which" replace "M" with --m--; and

Column 19, line 52, replace "rime" with --time--.

Signed and Sealed this
Fourteenth Day of May, 2013

Teresa Stanek Rea
*Acting Director of the United States Patent and Trademark Office*